United States Patent
Ando et al.

(10) Patent No.: US 10,475,818 B2
(45) Date of Patent: Nov. 12, 2019

(54) TRANSISTOR WITH RECEDED CONDUCTOR, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Yoshinori Ando, Atsugi (JP); Shinpei Matsuda, Atsugi (JP); Yuki Hata, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/494,850

(22) Filed: Apr. 24, 2017

(65) Prior Publication Data
US 2017/0317111 A1    Nov. 2, 2017

(30) Foreign Application Priority Data

Apr. 28, 2016   (JP) .................................. 2016-091109
Oct. 6, 2016    (JP) .................................. 2016-197828

(51) Int. Cl.
*H01L 27/12*     (2006.01)
*H01L 29/786*    (2006.01)
(Continued)

(52) U.S. Cl.
CPC ...... *H01L 27/1225* (2013.01); *H01L 27/1052* (2013.01); *H01L 27/124* (2013.01);
(Continued)

(58) Field of Classification Search
CPC ........... H01L 29/7869; H01L 29/66969; H01L 29/78696; H01L 27/1225; H01L 29/78648; H01L 29/24; H01L 29/45; H01L 29/4908; H01L 21/02565; H01L 29/41733; H01L 29/786; H01L 29/42384; H01L 21/82345; H01L 2924/13085; H01L 2924/13092
(Continued)

(56) References Cited

U.S. PATENT DOCUMENTS 8,384,080 B2    2/2013   Taniguchi et al.
8,547,771 B2   10/2013   Koyama
(Continued)

FOREIGN PATENT DOCUMENTS

CN    101859798 A    10/2010
CN    102656690 A    9/2012
(Continued)

OTHER PUBLICATIONS

International Search Report (Application No. PCT/IB2017/052266) dated Jul. 18, 2017.
(Continued)

*Primary Examiner* — Jose R Diaz
(74) *Attorney, Agent, or Firm* — Robinson Intellectual Property Law Office; Eric J. Robinson

(57) ABSTRACT

A semiconductor device capable of retaining data for a long time is provided. A first transistor and a second transistor having different electrical characteristics from those of the first transistor are provided over the same layer without an increase in the number of manufacturing steps.

23 Claims, 35 Drawing Sheets

(51) Int. Cl.
*H01L 27/105* (2006.01)
*H01L 29/423* (2006.01)

(52) U.S. Cl.
CPC ........ *H01L 27/1207* (2013.01); *H01L 27/127* (2013.01); *H01L 27/1233* (2013.01); *H01L 27/1288* (2013.01); *H01L 29/7869* (2013.01); *H01L 29/78648* (2013.01); *H01L 29/78696* (2013.01); *H01L 29/42384* (2013.01)

(58) Field of Classification Search
USPC ........ 257/43, 57, 59, 72, E29.273, E29.296; 438/158, 159
See application file for complete search history.

(56) References Cited

U.S. PATENT DOCUMENTS

| | | | |
|---|---|---|---|
| 8,692,252 B2 | 4/2014 | Takata et al. | |
| 8,995,174 B2 | 3/2015 | Koyama | |
| 9,666,722 B2 * | 5/2017 | Matsubayashi | H01L 29/7869 |
| 2010/0117079 A1 * | 5/2010 | Miyairi | H01L 27/1225 257/43 |
| 2010/0244031 A1 | 9/2010 | Akimoto et al. | |
| 2011/0062992 A1 | 3/2011 | Okazaki et al. | |
| 2011/0156117 A1 | 6/2011 | Yamazaki et al. | |
| 2011/0180796 A1 | 7/2011 | Yamazaki et al. | |
| 2012/0032163 A1 * | 2/2012 | Yamazaki | H01L 21/02554 257/43 |
| 2015/0280691 A1 | 10/2015 | Koyama | |
| 2015/0348961 A1 | 12/2015 | Isobe | |
| 2016/0247830 A1 * | 8/2016 | Zhang | H01L 27/1225 |
| 2017/0229486 A1 | 8/2017 | Matsuda et al. | |
| 2017/0236842 A1 | 8/2017 | Matsuda et al. | |

FOREIGN PATENT DOCUMENTS

| | | |
|---|---|---|
| CN | 102742014 A | 10/2012 |
| JP | 2010-258423 A | 11/2010 |
| JP | 2011-086929 A | 4/2011 |
| JP | 2011-124360 A | 6/2011 |
| JP | 2011-138934 A | 7/2011 |
| JP | 2011-151384 A | 8/2011 |
| JP | 2011-171721 A | 9/2011 |
| JP | 2012-257187 A | 12/2012 |
| JP | 2016-006862 A | 1/2016 |
| KR | 2010-0109395 A | 10/2010 |
| KR | 2012-0116448 A | 10/2012 |
| KR | 2012-0118016 A | 10/2012 |
| TW | 201104864 | 2/2011 |
| TW | 201126696 | 8/2011 |
| TW | 201140809 | 11/2011 |
| TW | 201140832 | 11/2011 |
| WO | WO-2011/034012 | 3/2011 |
| WO | WO-2011/077946 | 6/2011 |
| WO | WO-2011/089846 | 7/2011 |

OTHER PUBLICATIONS

Written Opinion (Application No. PCT/IB2017/052266) dated Jul. 18, 2017.

* cited by examiner

1000

FIG. 8A
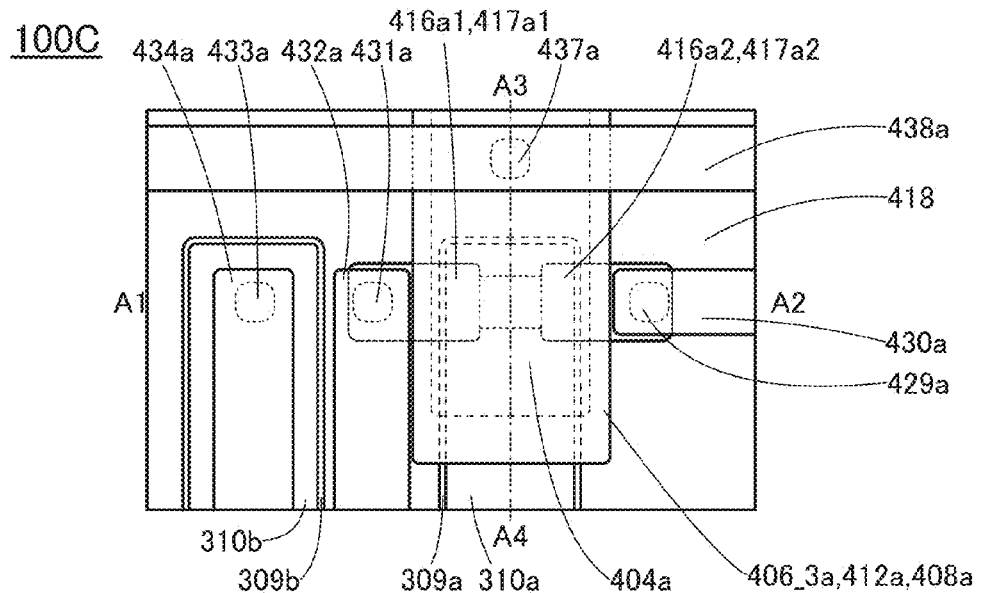
FIG. 8B
FIG. 8C
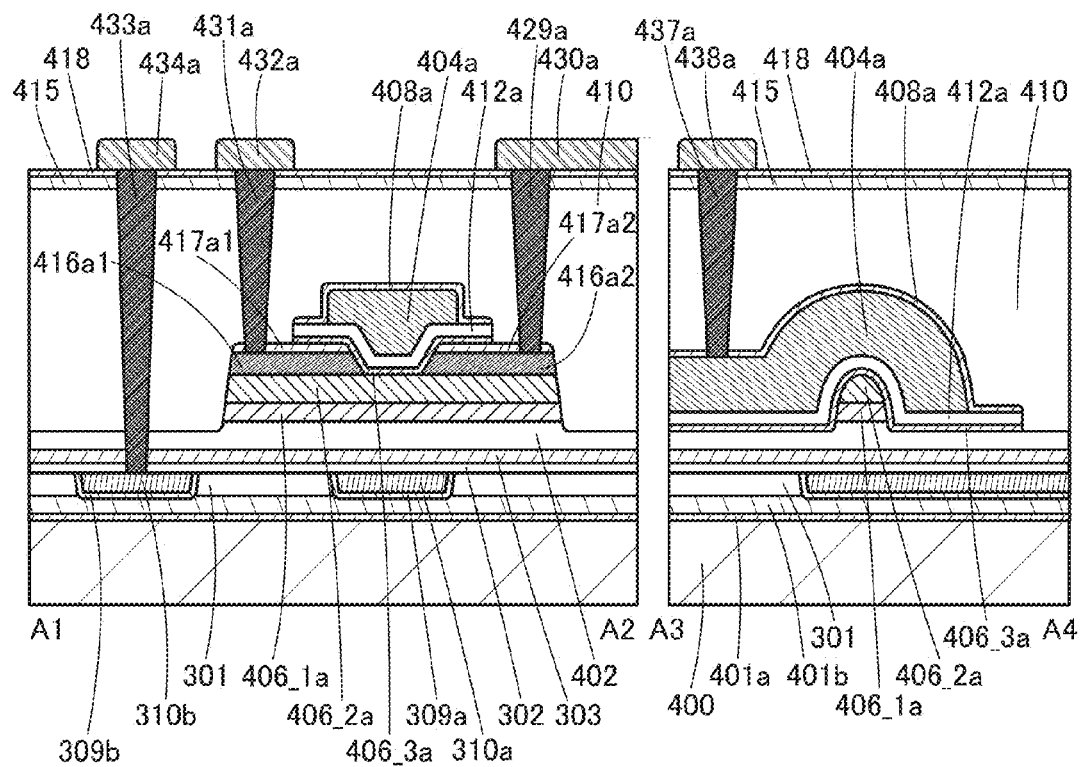

FIG. 10A
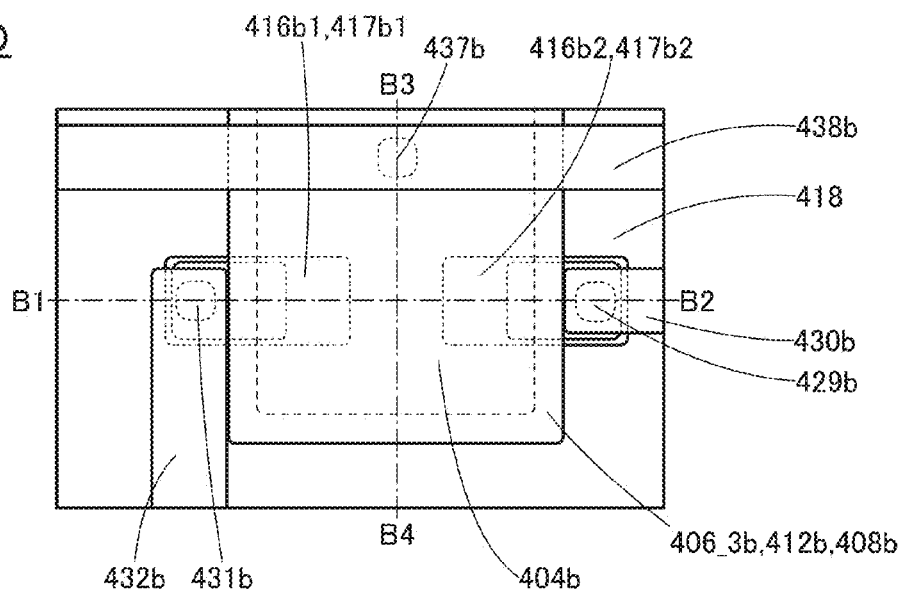
FIG. 10B
FIG. 10C
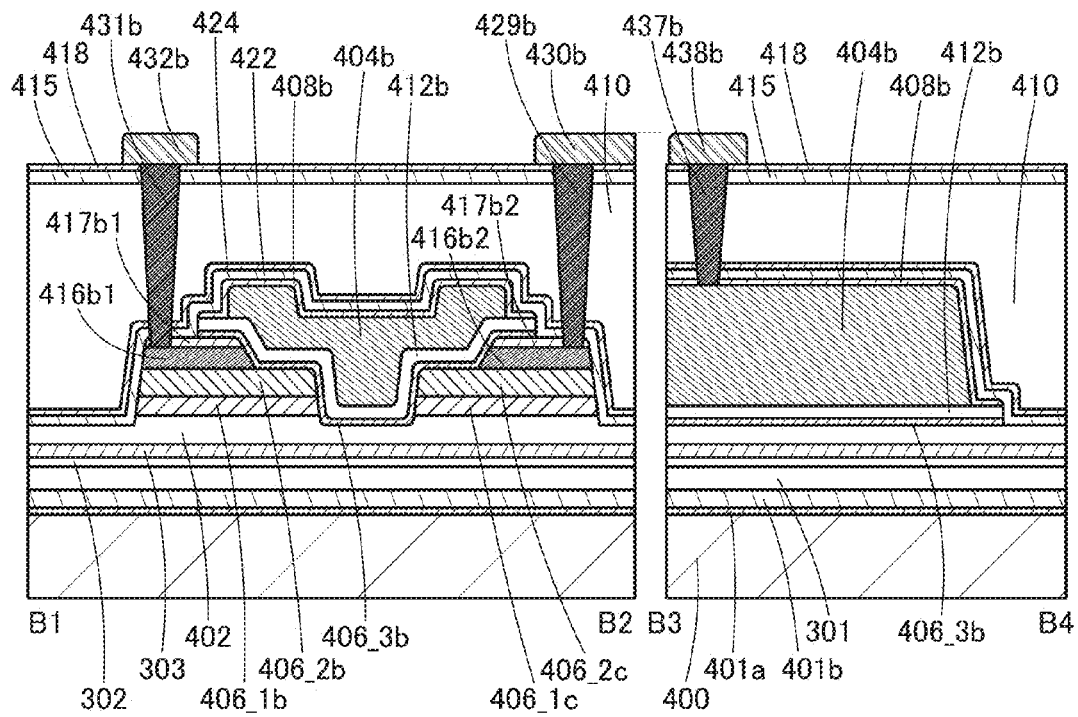

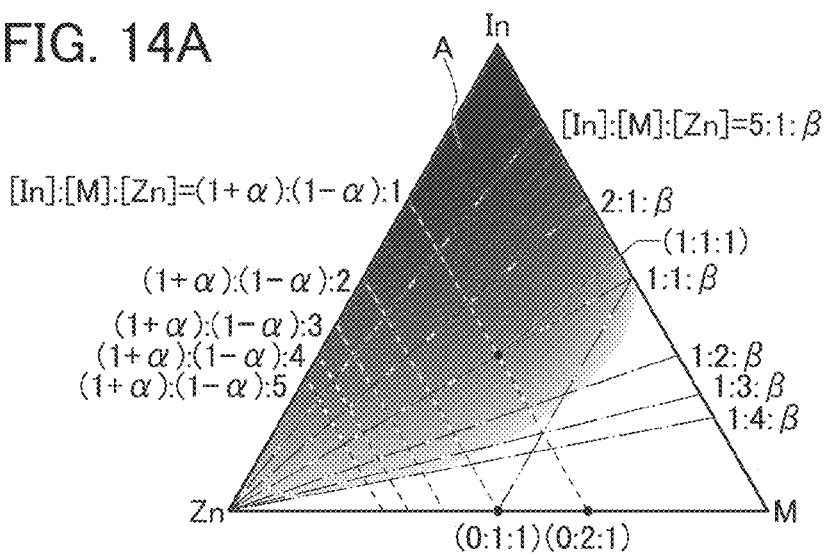
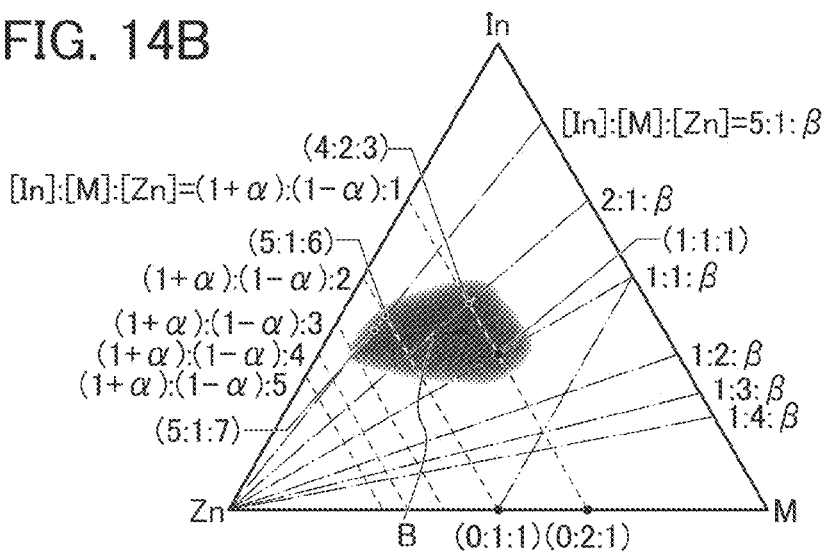
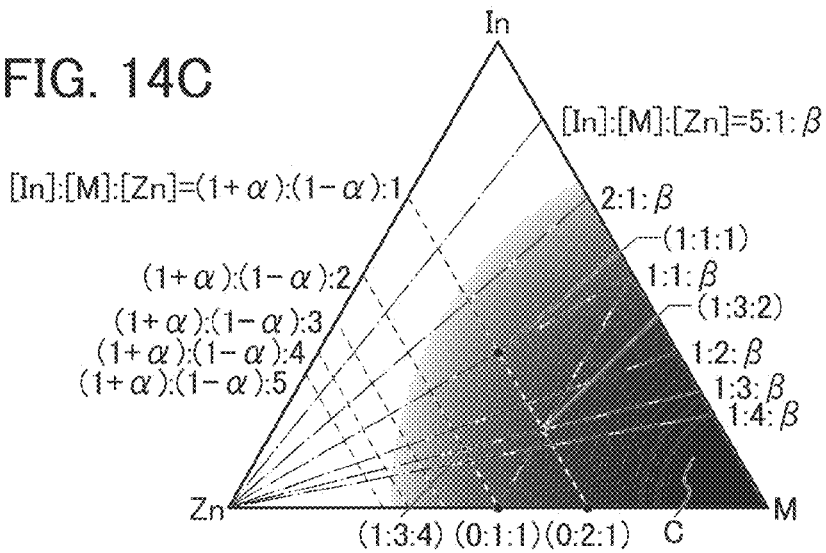

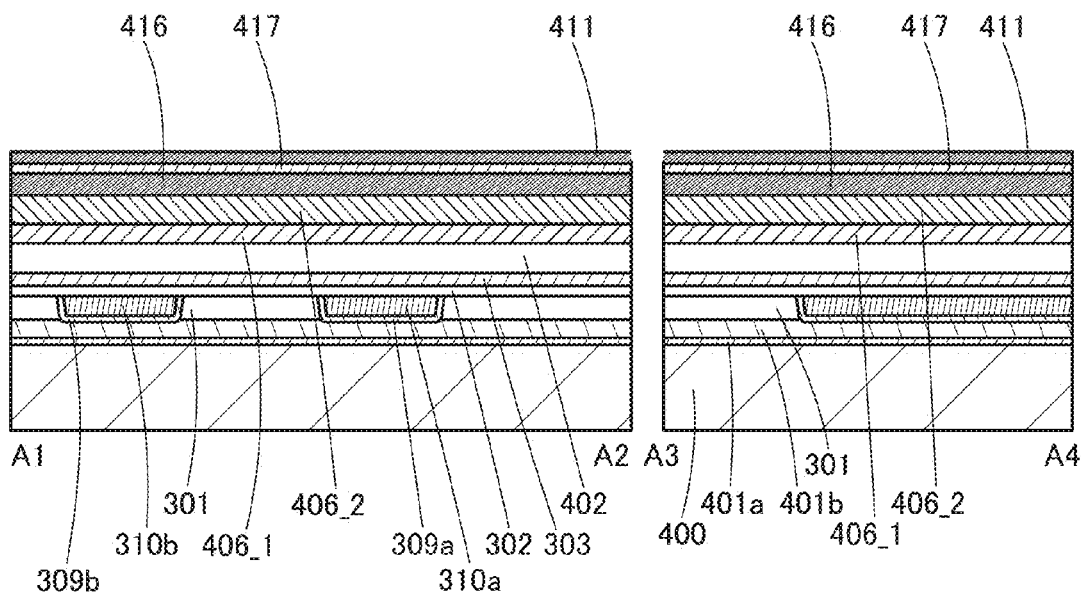
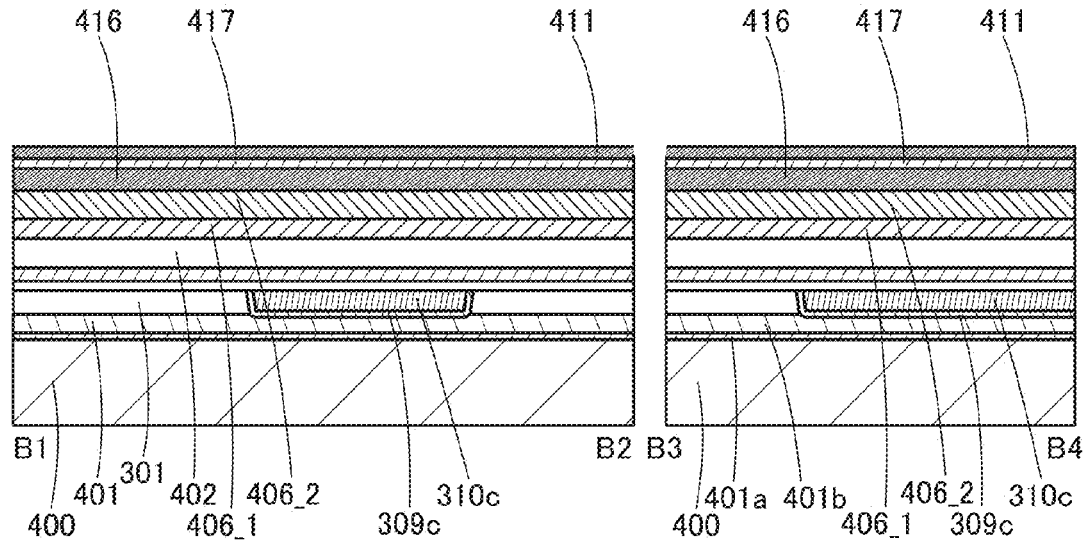

FIG. 17A
FIG. 17B
FIG. 17C
FIG. 17D
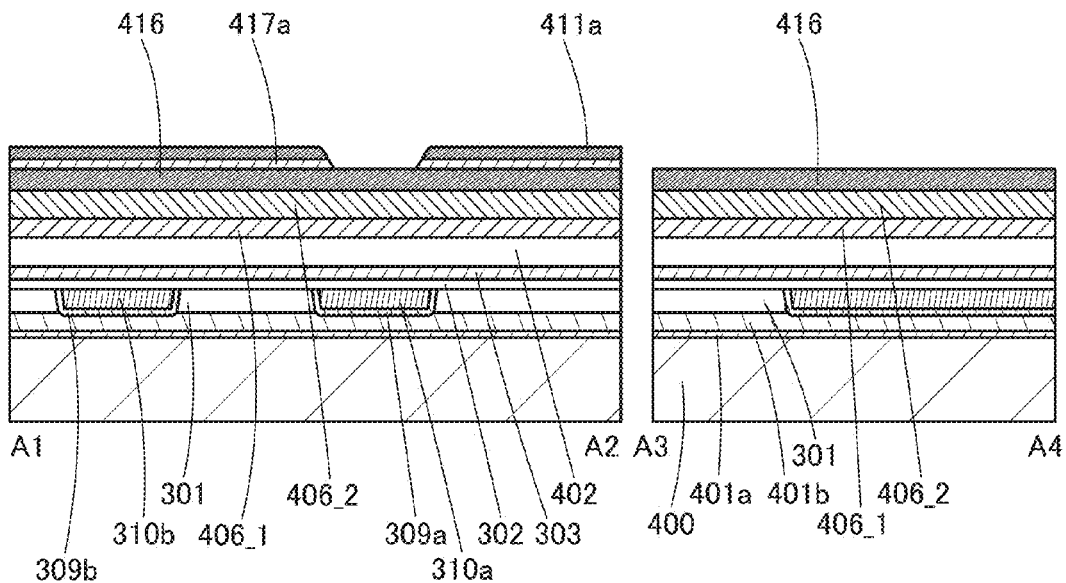
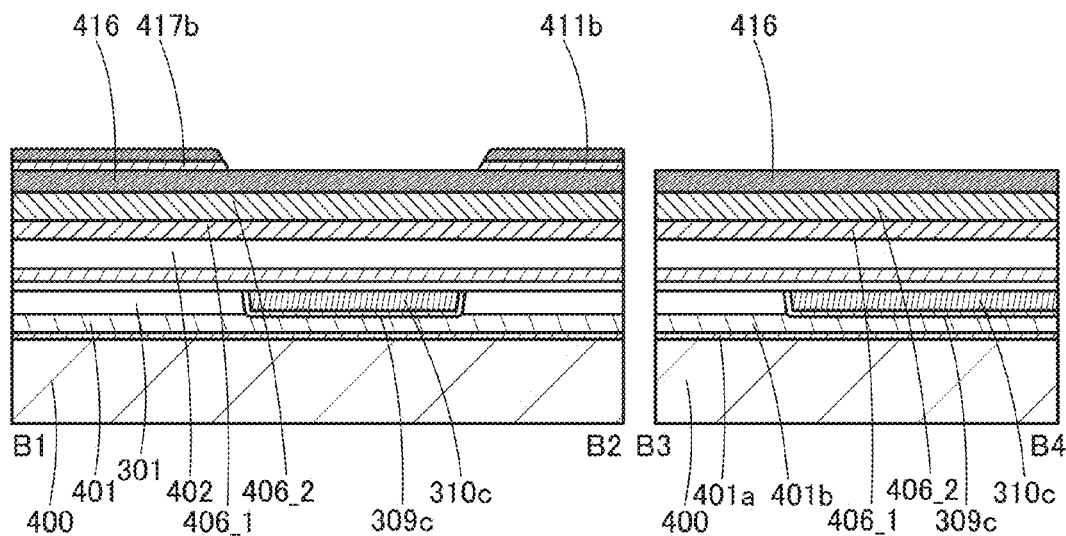

200E

FIG. 20A
FIG. 20B
FIG. 20C
FIG. 20D
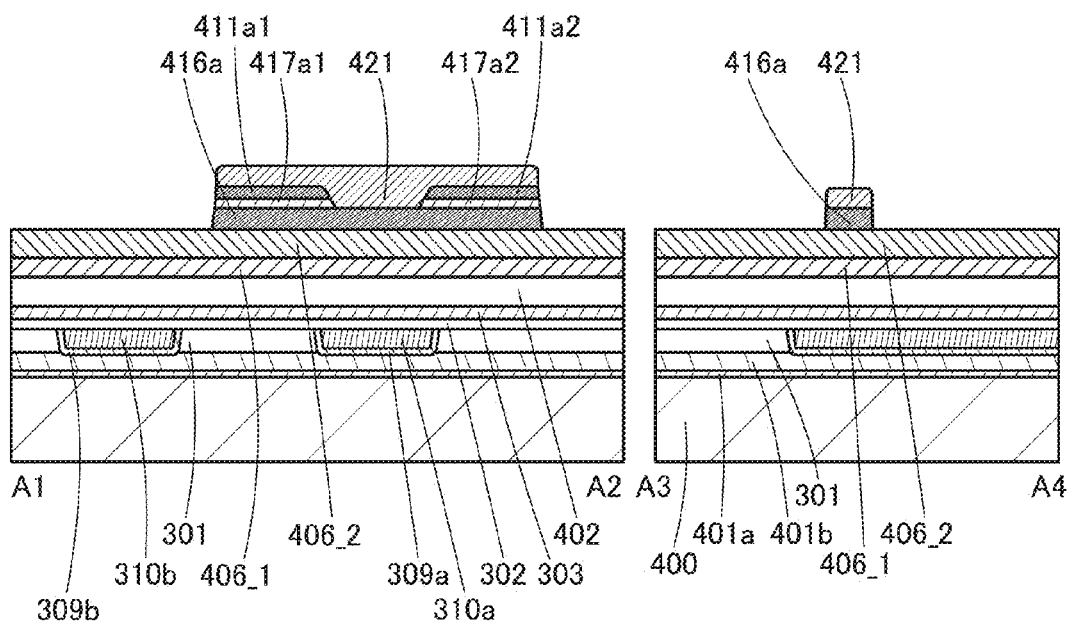
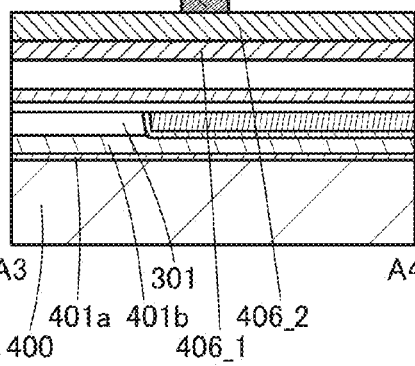
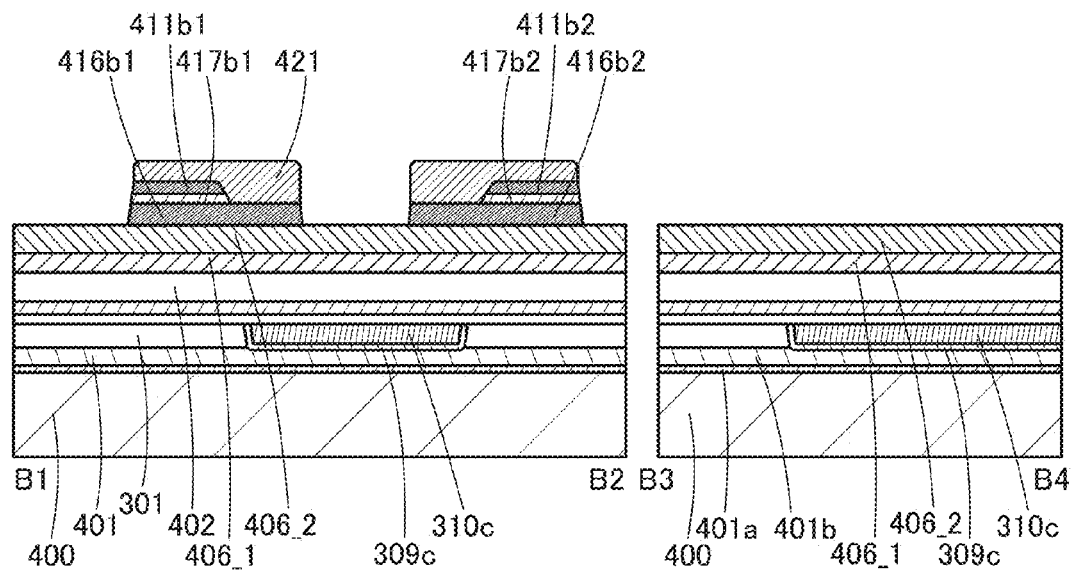

FIG. 21A
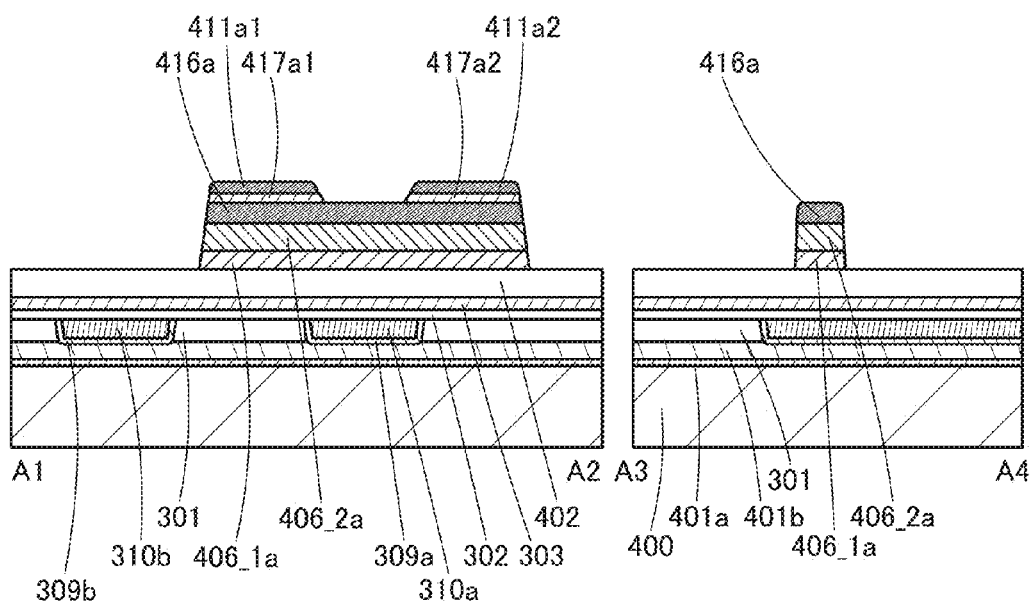
FIG. 21B
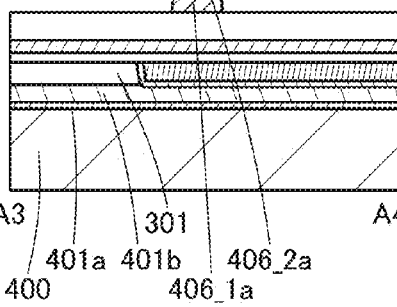
FIG. 21C
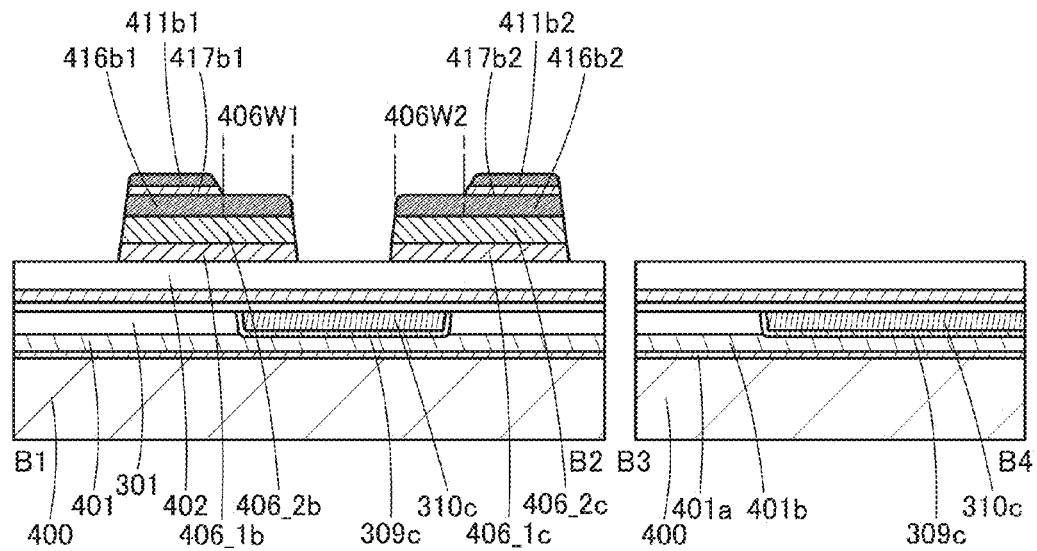
FIG. 21D

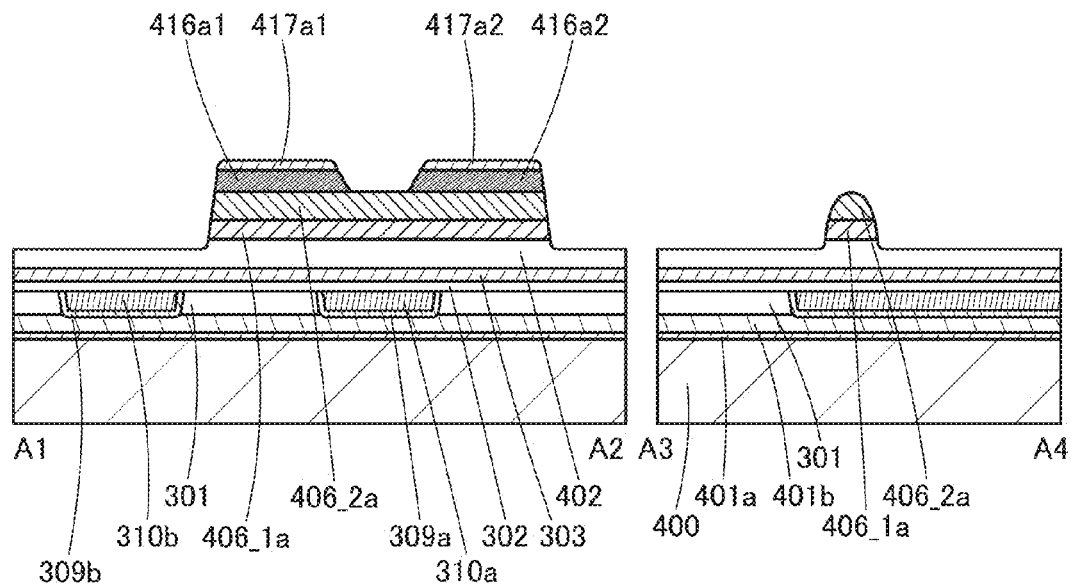

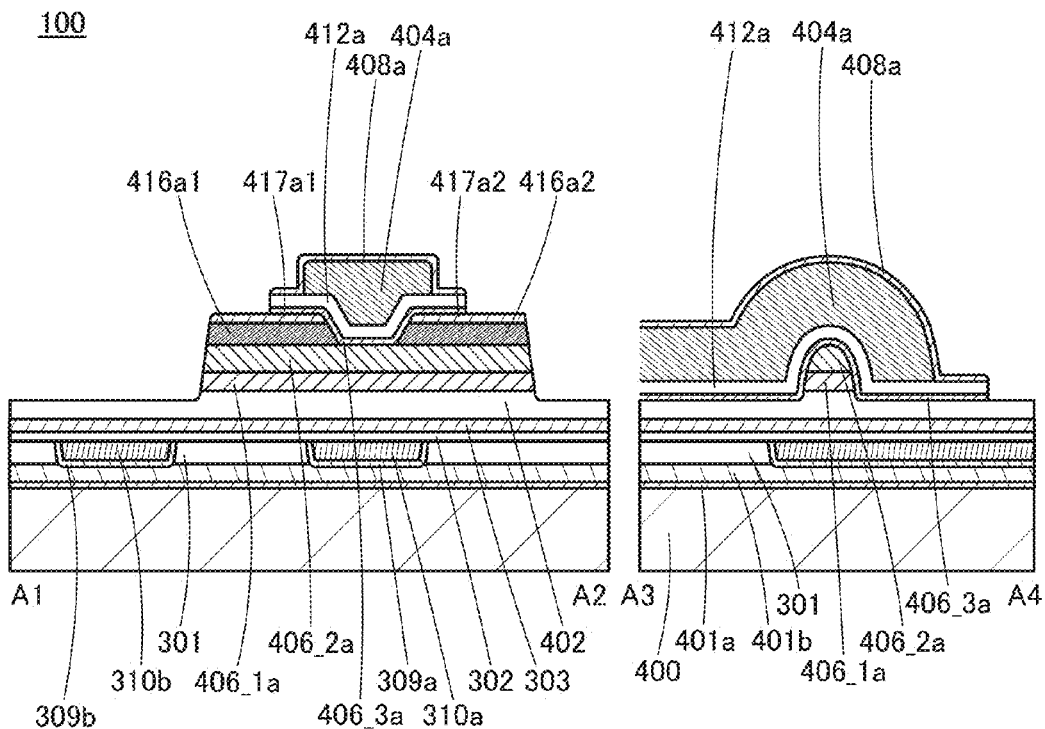
FIG. 23A
FIG. 23B
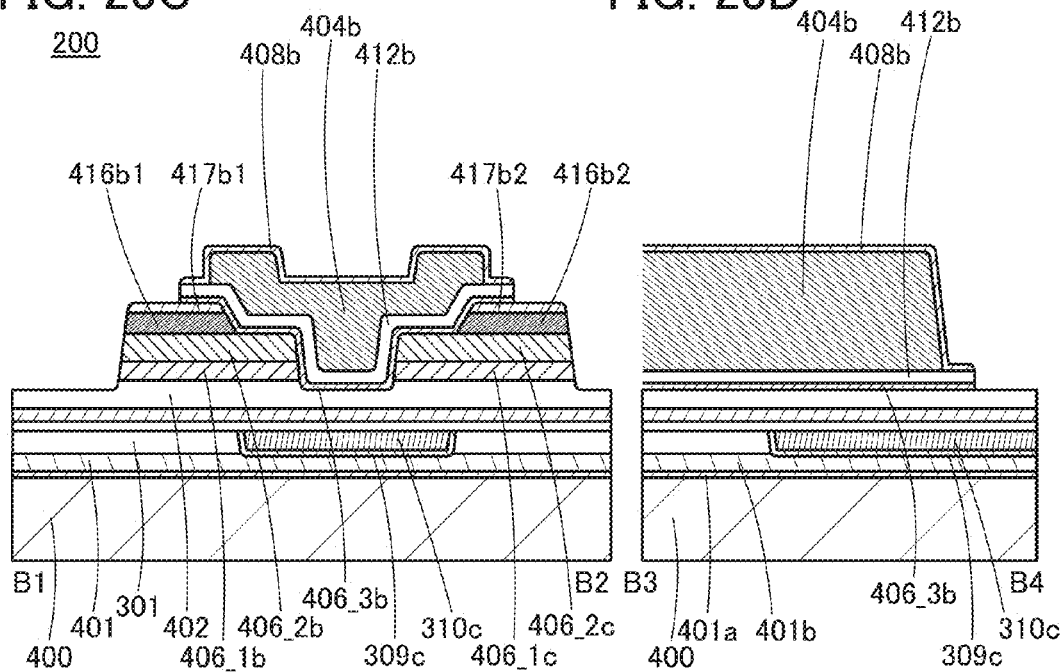
FIG. 23C
FIG. 23D

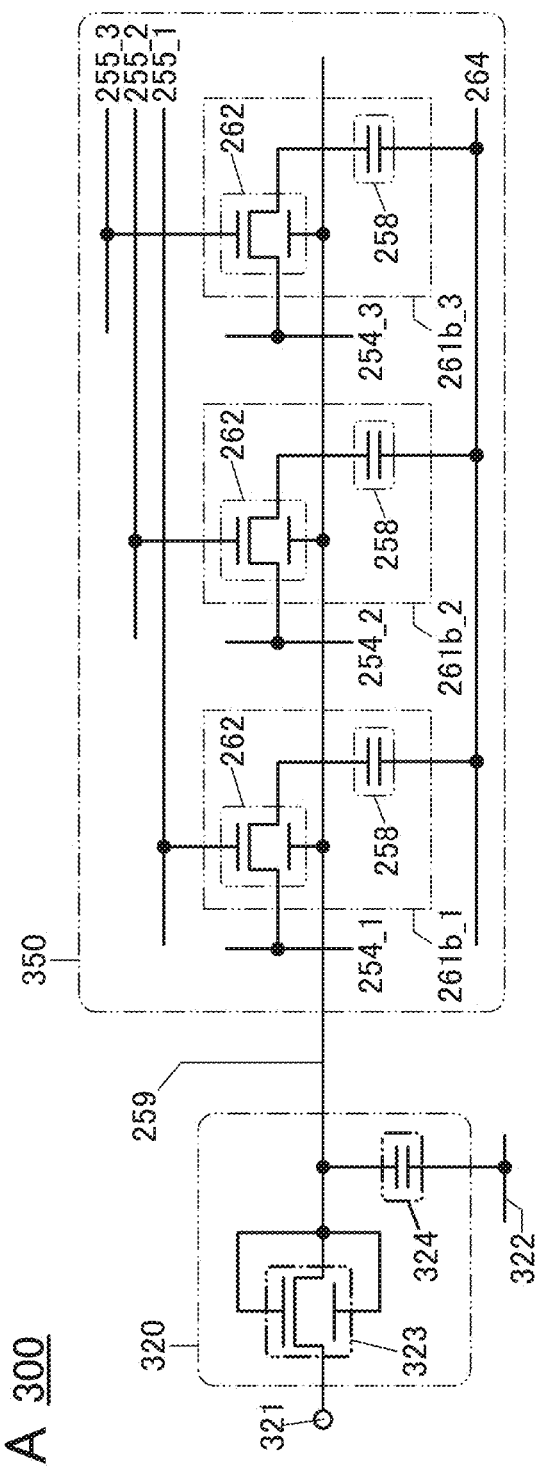
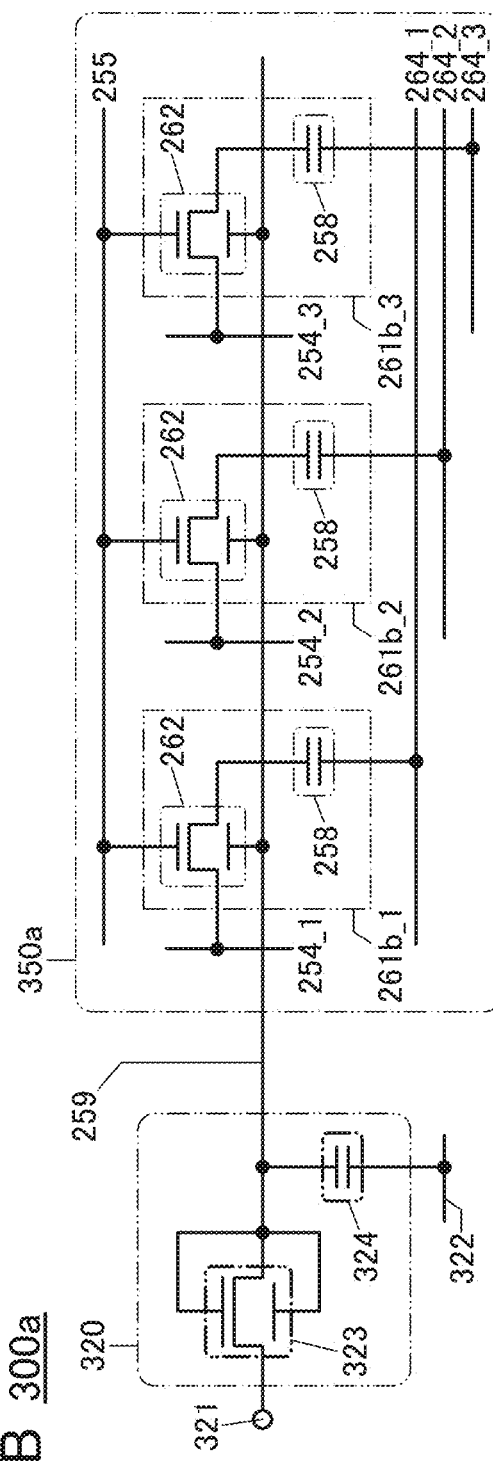

TRANSISTOR WITH RECEDED CONDUCTOR, SEMICONDUCTOR DEVICE, AND ELECTRONIC DEVICE

TECHNICAL FIELD

The present invention relates to an object, a method, or a manufacturing method. The present invention relates to a process, a machine, manufacture, or a composition of matter. One embodiment of the present invention relates to a semiconductor device, a light-emitting device, a display device, an electronic device, a lighting device, and a manufacturing method thereof. In particular, one embodiment of the present invention relates to a light-emitting device using an organic electroluminescence (hereinafter also referred to as EL) phenomenon, and a method for fabricating the light-emitting device. For example, one embodiment of the present invention relates to an electronic device that includes, as a component, an LSI, a CPU, a power device mounted in a power circuit, or a semiconductor integrated circuit including a memory, a thyristor, a converter, an image sensor, or the like.

Note that one embodiment of the present invention is not limited to the above technical field.

In this specification, a semiconductor device generally means a device that can function by utilizing semiconductor characteristics. An electro-optical device, a semiconductor circuit, and an electronic device include a semiconductor device in some cases.

BACKGROUND ART

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely small leakage current in an off state. For example, a low-power-consumption CPU utilizing a characteristic of small leakage current of the transistor including an oxide semiconductor has been disclosed (see Patent Document 1).

In addition, a technique in which oxide semiconductor layers with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the productivity of the semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-124360
[Patent Document 3] Japanese Published Patent Application No. 2011-138934

DISCLOSURE OF INVENTION

An object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A first transistor and a second transistor having different electrical characteristics from those of the first transistor are provided over the same layer. For example, a first transistor having a first threshold voltage and a second transistor having a second threshold voltage are provided over the same layer. A semiconductor layer where a channel of the first transistor is formed and a semiconductor layer where a channel of the second transistor is formed are formed using semiconductor materials having different electron affinities.

Providing transistors having different electrical characteristics in one semiconductor device can increase circuit design flexibility. On the other hand, the transistors need to be separately manufactured; thus, the number of manufacturing steps of the semiconductor device is drastically increased. The drastic increase in manufacturing steps easily leads a decrease in yield, and the productivity of the semiconductor device is significantly decreased in some cases. According to one embodiment of the present invention, transistors having different electrical characteristics can be provided in one semiconductor device, without drastic increase in the manufacturing steps.

One embodiment of the present invention is a transistor including a first oxide, a gate electrode, a gate insulator between the first oxide and the gate electrode, a first conductor and a second conductor that are in contact with the first oxide, a second oxide in contact with the first conductor, and a third oxide in contact with the second conductor. The first oxide is in contact with a side surface of the first conductor and a top surface and a side surface of the second oxide. The first oxide is in contact with a side surface of the second conductor and a top surface and a side surface of the third oxide.

In the transistor of one embodiment of the present invention, at one end portion of the first conductor and one end portion of the second conductor, the side surface of the first conductor and the side surface of the second conductor recede from the side surface of the second oxide and the side surface of the third oxide, so that a step-like shape is formed. At the other end portion of the first conductor and the other end portion of the second conductor, a side surface of the first conductor and a side surface of the second conductor are aligned with a side surface of the second oxide and a side surface of the third oxide.

In the transistor, the first conductor is provided over the second oxide, and the second conductor is provided over the third oxide.

In the transistor, the first oxide serves as a channel, and the first conductor and the second conductor serve as a source electrode and a drain electrode.

The first oxide, the second oxide, and the third oxide can each include an oxide semiconductor.

One embodiment of the present invention is a semiconductor device including a first transistor and a second transistor. The first transistor includes a first oxide, a first gate electrode, a first gate insulator between the first oxide and the first gate electrode, a first conductor and a second conductor that are in contact with the first oxide, a second oxide in contact with the first conductor, and a third oxide in contact with the second conductor. The first oxide is in contact with a side surface of the first conductor and a top surface and a side surface of the second oxide. The first oxide is in contact with a side surface of the second conductor and a top surface and a side surface of the third oxide. The second transistor includes a fourth oxide, a second gate electrode, a second gate insulator between the fourth oxide and the second gate electrode, a third conductor and a fourth conductor that are in contact with the fourth oxide, and a fifth oxide that is in contact with the fourth oxide and between the second gate insulator and the fourth oxide. The first oxide and the fifth oxide have the same composition. The second oxide, the third oxide, and the fourth oxide have the same composition.

In the semiconductor device of one embodiment of the present invention, the fifth oxide includes a region in contact with the third conductor and a region in contact with the fourth conductor.

In the semiconductor device, the first conductor is provided over the second oxide, the second conductor is provided over the third oxide, and the third conductor and the fourth conductor are provided over the fourth oxide.

In the semiconductor device, the first oxide serves as a channel of the first transistor, the first conductor and the second conductor serve as a source electrode and a drain electrode of the first transistor, the fourth oxide serves as a channel of the second transistor, and the third conductor and the fourth conductor serve as a source electrode and a drain electrode of the second transistor.

The semiconductor device further includes a barrier film covering the first transistor and the second transistor. The barrier film contains aluminum and oxygen.

The semiconductor device further includes an insulator covering the first gate electrode and the second gate electrode. The insulator contains aluminum and oxygen.

In the semiconductor device, the second transistor includes a third gate electrode that is positioned under the fourth oxide and includes a region overlapping with the fourth oxide, and a third gate insulator between the fourth oxide and the third gate electrode.

In the semiconductor device, the threshold voltage of the first transistor is higher than the threshold voltage of the second transistor.

One embodiment of the present invention is an electronic device including the semiconductor device and at least one of an antenna, a battery, an operation switch, a microphone, and a speaker.

A semiconductor device having favorable electric characteristics can be provided. A semiconductor device that can be miniaturized or highly integrated can be provided. A semiconductor device with high productivity can be provided.

A semiconductor device capable of retaining data for a long time can be provided. A semiconductor device capable of high-speed data writing can be provided. A semiconductor device with high design flexibility can be provided. A low-power semiconductor device can be provided. A novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

FIGS. 8A to 8C are a top view and cross-sectional views illustrating a structure of a transistor of one embodiment of the present invention.

FIGS. 10A to 10C are a top view and cross-sectional views illustrating a structure of a transistor of one embodiment of the present invention.

FIGS. 14A to 14C each illustrate an atomic ratio range of an oxide of the present invention.

FIGS. 16A to 16D illustrate a method for manufacturing a transistor of one embodiment of the present invention.

FIGS. 17A to 17D illustrate a method for manufacturing a transistor of one embodiment of the present invention.

FIGS. 20A to 20D illustrate a method for manufacturing a transistor of one embodiment of the present invention.

FIGS. 21A to 21D illustrate a method for manufacturing a transistor of one embodiment of the present invention.

FIGS. 22A to 22D illustrate a method for manufacturing a transistor of one embodiment of the present invention.

FIGS. 23A to 23D illustrate a method for manufacturing a transistor of one embodiment of the present invention.

FIGS. 27A and 27B are circuit diagrams each illustrating a memory device of one embodiment of the present invention.

BEST MODE FOR CARRYING OUT THE INVENTION

Figure 1A:
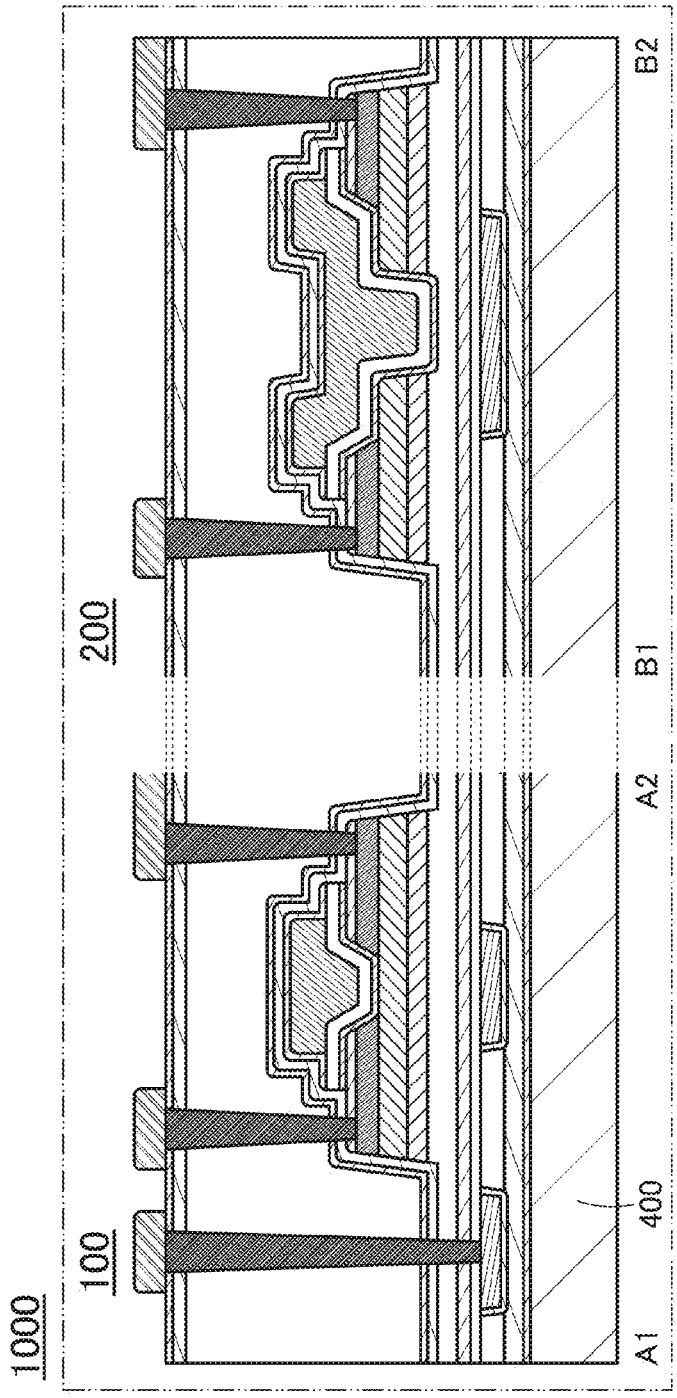
FIG. 1A is a cross-sectional view of transistors of embodiments of the present invention and FIGS. 1B and 1C show electrical characteristics of the transistors.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Furthermore, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel region between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Furthermore, unless otherwise specified, transistors described in this specification and the like are enhancement-type (normally-off-type) field effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting the passage of oxygen and impurities such as hydrogen. The barrier film that has conductivity may be referred to as a conductive barrier film.

Embodiment 1

Providing transistors having different electrical characteristics over the same layer can increase the design flexibility of a semiconductor device and the integration degree in the semiconductor device. In this embodiment, an example of an embodiment where transistors having different electrical characteristics are provided over the same layer is described.
<Structure Example of Semiconductor Device 1000>

FIG. 1A is a cross-sectional view of a semiconductor device 1000. The semiconductor device 1000 includes a transistor 100 and a transistor 200. The transistors 100 and 200 have different structures. FIG. 1A illustrates cross sections of the transistors 100 and 200 over a substrate 400. FIG. 1A corresponds to a cross-sectional view taken along dashed-dotted line A1-A2 in FIG. 2A and dashed-dotted line B1-B2 in FIG. 3A.

Figure 2A:
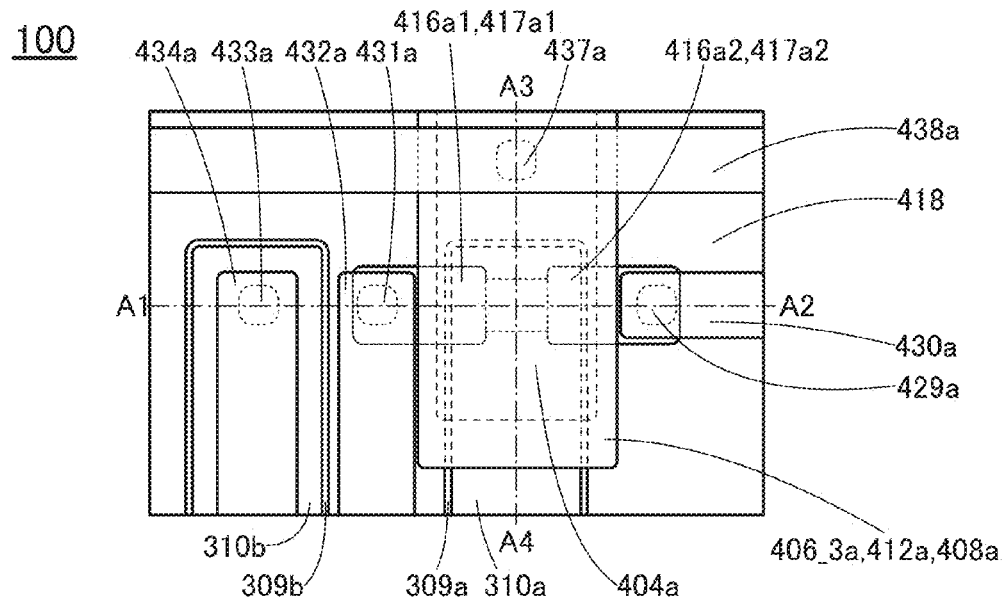
FIGS. 2A to 2C are a top view and cross-sectional views illustrating a structure of a transistor of one embodiment of the present invention.
Figures 2B, 2C:
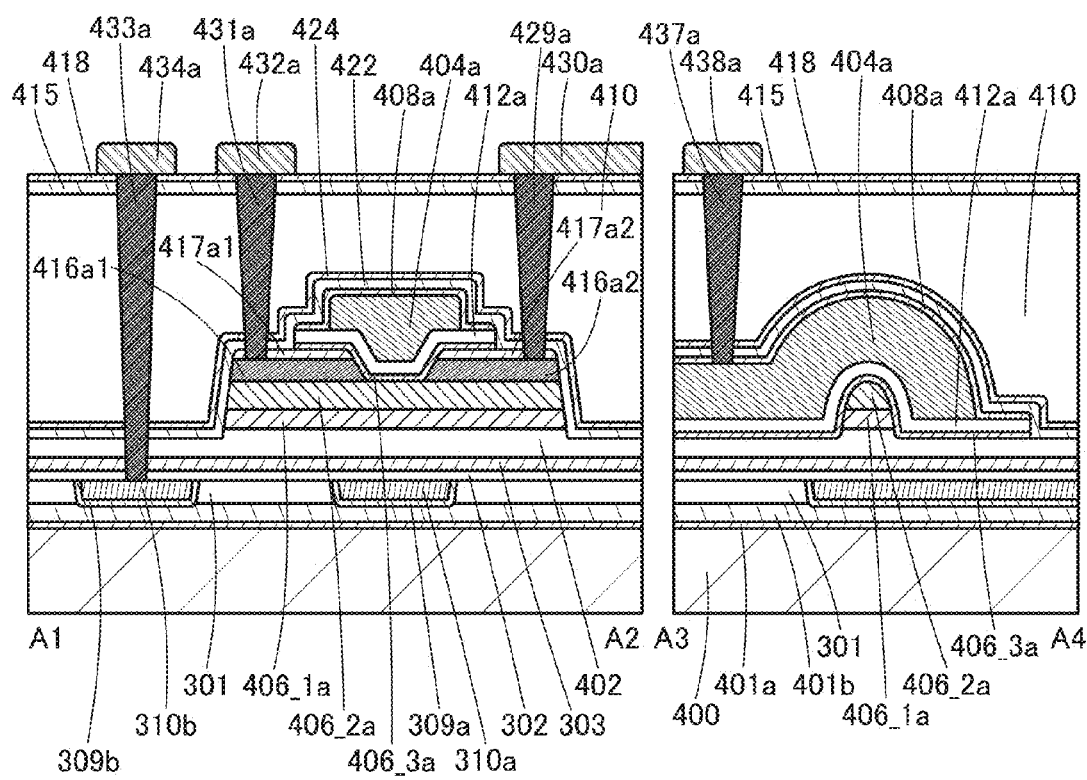

FIG. 2A is a top view of the transistor 100. FIG. 2B is a cross-sectional view taken along dashed-dotted line A1-A2 in FIG. 2A. FIG. 2C is a cross-sectional view taken along dashed-dotted line A3-A4 in FIG. 2A. In FIG. 2B, the cross-sectional view along A1-A2 is taken in the channel length direction of the transistor 100. In FIG. 2C, the cross-sectional view along A3-A4 is taken in the channel width direction of the transistor 100. For simplification of the drawing, some components are not illustrated in the top view in FIG. 2A.

Figure 3A:
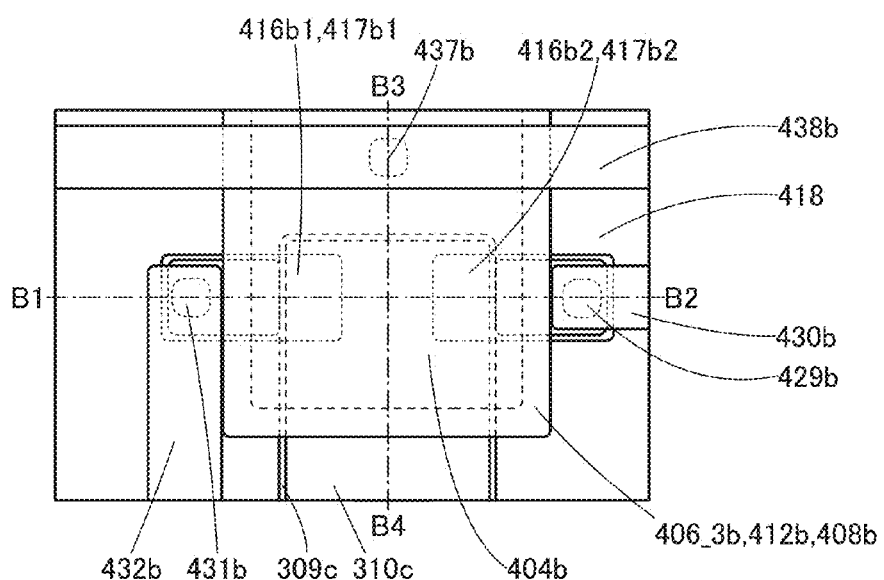
FIGS. 3A to 3C are a top view and cross-sectional views illustrating a structure of a transistor of one embodiment of the present invention.
Figures 3B, 3C:
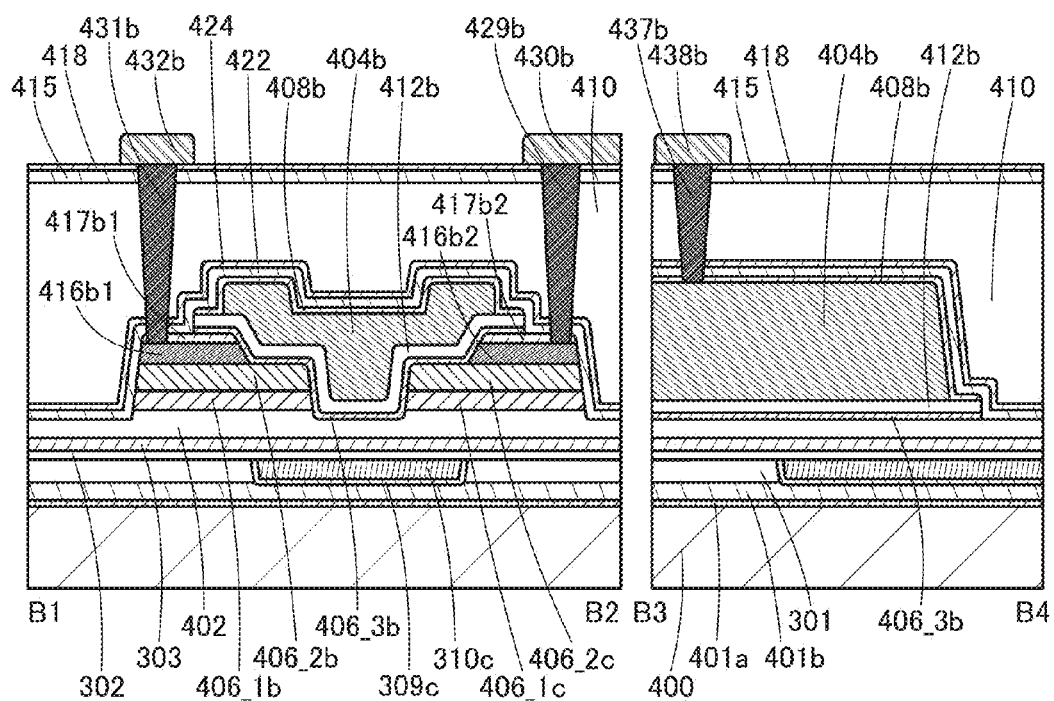

FIG. 3A is a top view of the transistor 200. FIG. 3B is a cross-sectional view taken along dashed-dotted line B1-B2 in FIG. 3A. FIG. 3C is a cross-sectional view taken along dashed-dotted line B3-B4 in FIG. 3A. In FIG. 3B, the cross-sectional view along B1-B2 is taken in the channel length direction of the transistor 200. In FIG. 3C, the cross-sectional view along B3-B4 is taken in the channel width direction of the transistor 200. For simplification of the drawing, some components are not illustrated in the top view in FIG. 3A.

Figure 1B:
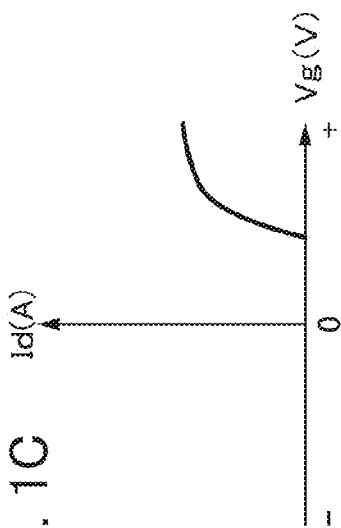
Figure 1C:
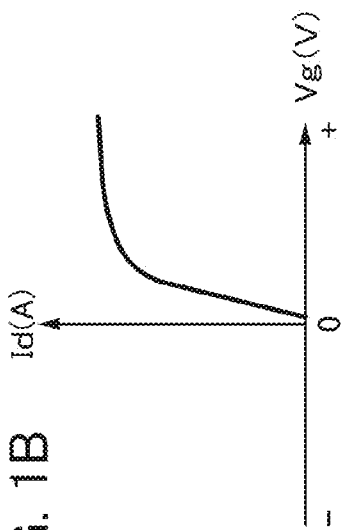

FIGS. 1B and 1C each show an example of an Id-Vg curve, which is one of the electrical characteristics of a transistor. In FIGS. 1B and 1C showing the Id-Vg curves, the horizontal axis represents a voltage (Vg) between a gate and a source of a transistor. Furthermore, the vertical axis represents current flowing to a drain (Id) of the transistor on a logarithmic scale.

The transistors 100 and 200 are each a transistor including a back gate. FIG. 1B shows the Id-Vg curve of the transistor 100 when the potential of the back gate is set to the same as that of the source or the gate. FIG. 1C shows the Id-Vg curve of the transistor 200 when the potential of the back gate is set to the same as that of the source or the gate. As shown in FIGS. 1B and 1C, the transistors 100 and 200 have different transistor characteristics. The Id-Vg curve of the transistor 200 is shifted in the positive direction compared with the Id-Vg curve of the transistor 100. In other words, the transistor 200 has higher Vth than the transistor 100.
<Transistor Structure 1>

Structures of the transistors 100 and 200 of embodiments of the present invention are described below.

In FIGS. 2B and 2C, the transistor 100 is provided over an insulator 401a over the substrate 400 and an insulator 401b over the insulator 401a. The transistor 100 includes an insulator 301, an insulator 302 over a conductor 309a, a conductor 310a, a conductor 309b, a conductor 310b, and the insulator 301, an insulator 303 over the insulator 302, an insulator 402 over the insulator 303, an oxide 406_1a over the insulator 402, an oxide 406_2a over the oxide 406_1a, a conductor 416a1 and a conductor 416a2 each including a region in contact with a top surface of the oxide 406_2a, an oxide 406_3a including a region in contact with a side surface of the conductor 416a1, a side surface of the conductor 416a2, and the top surface of the oxide 406_2a, an insulator 412a over the oxide 406_3a, and a conductor 404a including a region overlapping with the oxide 406_3a with the insulator 412a provided therebetween. Note that the insulator 301 includes a plurality of openings, in which the conductors 309a, 310a, 309b, and 310b are provided.

Furthermore, a barrier film 417a1, a barrier film 417a2, an insulator 408a, an insulator 422, an insulator 424, an insulator 410, an insulator 415, and an insulator 418 are provided over the transistor 100.

In addition, over and in the transistor 100, a first opening that passes through the insulators 418, 415, 410, 424, 422, 402, 303, and 302 and reaches the conductor 310b; a second opening that passes through the insulators 418, 415, 410, 424, and 422 and the barrier film 417a1 and reaches the conductor 416a1; a third opening that passes through the insulators 418, 415, 410, 424, and 422 and the barrier film 417a2 and reaches the conductor 416a2; and a fourth opening that passes through the insulators 418, 415, 410, 424, 422, and 408a and reaches the conductor 404a are provided. A conductor 433a, a conductor 431a, a conductor 429a, and a conductor 437a are embedded in the first opening, the second opening, the third opening, and the fourth opening, respectively. A conductor 434a that is located over the insulator 418 and includes a region in contact with the conductor 433a; a conductor 432a that is located over the insulator 418 and includes a region in contact with the conductor 431a; a conductor 430a that is located over the insulator 418 and includes a region in contact with the conductor 429a; and a conductor 438a that is located over the insulator 418 and includes a region in contact with the conductor 437a are provided.

The conductor 404a functions as a first gate electrode in the transistor 100. Furthermore, the conductor 404a can have a stacked structure including a conductor that has a function of inhibiting penetration of oxygen. For example, when the conductor that has a function of inhibiting penetration of oxygen is formed as a lower layer, an increase in the electric resistivity due to oxidation of the conductor 404a can be prevented. The insulator 412a functions as a first gate insulator.

The conductors 416a1 and 416a2 function as a source electrode and a drain electrode. The conductors 416a1 and 416a2 each can have a stacked structure including a conductor that has a function of inhibiting penetration of oxygen. For example, when the conductor that has a function of inhibiting penetration of oxygen is formed as an upper layer, an increase in the electric resistivity due to oxidation of the conductors 416a1 and 416a2 can be prevented. Note that the electric resistivities of the conductors can be measured by a two-terminal method or the like.

The barrier films 417a1 and 417a2 each have a function of inhibiting penetration of oxygen and impurities such as hydrogen and water. The barrier film 417a1 is located over the conductor 416a1 and prevents the diffusion of oxygen into the conductor 416a1. The barrier film 417a2 is located over the conductor 416a2 and prevents the diffusion of oxygen into the conductor 416a2.

In the transistor 100, the resistance of the oxide 406_2a can be controlled by a potential applied to the conductor 404a. That is, conduction or non-conduction between the conductors 416a1 and 416a2 can be controlled by the potential applied to the conductor 404a.

As illustrated in FIGS. 2B and 2C, the top surface of the oxide 406_2a is in contact with the conductors 416a1 and 416a2. The oxides 406_1a and 406_2a can be electrically surrounded by an electric field of the conductor 404a functioning as the first gate electrode. A transistor structure in which a semiconductor is electrically surrounded by an electric field of a first gate electrode is referred to as a surrounded channel (s-channel) structure. Therefore, a channel is formed in the entire oxide 406_2a in some cases. In the s-channel structure, a large amount of current can flow between a source and a drain of the transistor, so that an on-state current can be increased. In addition, since the oxides 406_1a and 406_2a are electrically surrounded by the electric field of the conductor 404a, an off-state current can be reduced.

In the transistor 100, the conductor 404a functioning as the first gate electrode partly overlaps with each of the conductors 416a1 and 416a2 functioning as a source electrode and a drain electrode, whereby parasitic capacitance between the conductor 404a and the conductor 416a1 and parasitic capacitance between the conductor 404a and the conductor 416a2 are formed.

Since the transistor 100 includes the barrier film 417a1 as well as the insulator 412a and the oxide 406_3a between the conductor 404a and the conductor 416a1, the parasitic capacitance can be reduced. Similarly, the transistor 100 includes the barrier film 417a2 as well as the insulator 412a and the oxide 406_3a between the conductor 404a and the conductor 416a2, allowing a reduction in the parasitic capacitance. Thus, the transistor 100 has excellent frequency characteristics.

Furthermore, the above structure of the transistor 100 allows a reduction or prevention of generation of a leakage current between the conductor 404a and each of the conductors 416a1 and 416a2 when the transistor 100 operates, for example, when a potential difference is generated between the conductor 404a and each of the conductors 416a1 and 416a2.

The conductors 309a and 310a function as a second gate electrode. The conductor 309a functions as a conductive barrier film. Since the conductor 309a is provided so as to cover a bottom surface and side surfaces of the conductor 310a, oxidation of the conductor 310a can be prevented.

The insulators 302, 303, and 402 function as a second gate insulating film. The threshold voltage of the transistor 100 can be controlled by a potential applied to the conductors 309a and 310a. The first gate electrode and the second gate electrode are electrically connected to each other, whereby a large on-state current can be obtained. Note that the function of the first gate electrode and that of the second gate electrode may be interchanged.

The conductors 309b and 310b function as a wiring. The conductor 309b functions as a conductive barrier film. Since the conductor 309b is provided so as to cover a bottom surface and side surfaces of the conductor 310b, oxidation of the conductor 310b can be prevented.

Figure 11A:
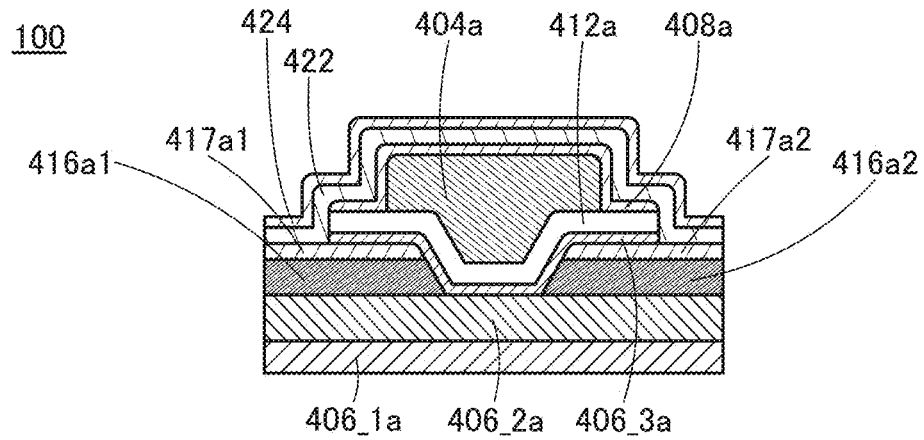
FIGS. 11A to 11C are cross-sectional views each illustrating a structure of part of a transistor of one embodiment of the present invention.
Figure 11B:
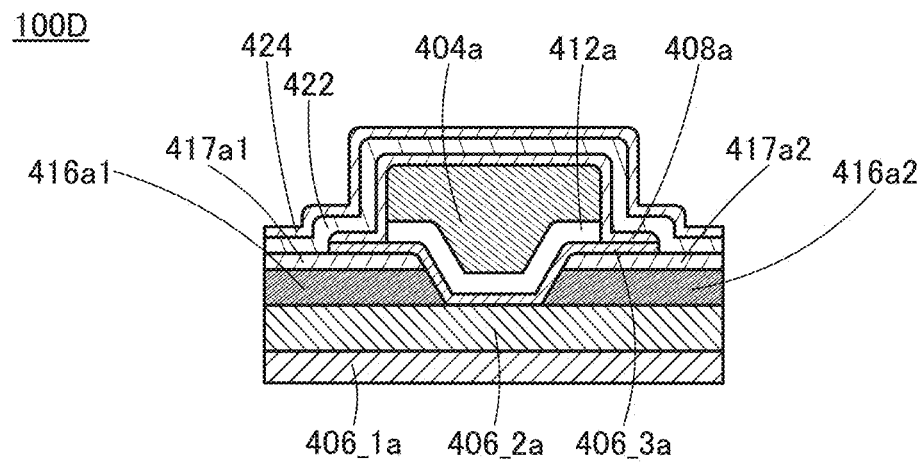
Figure 11C:
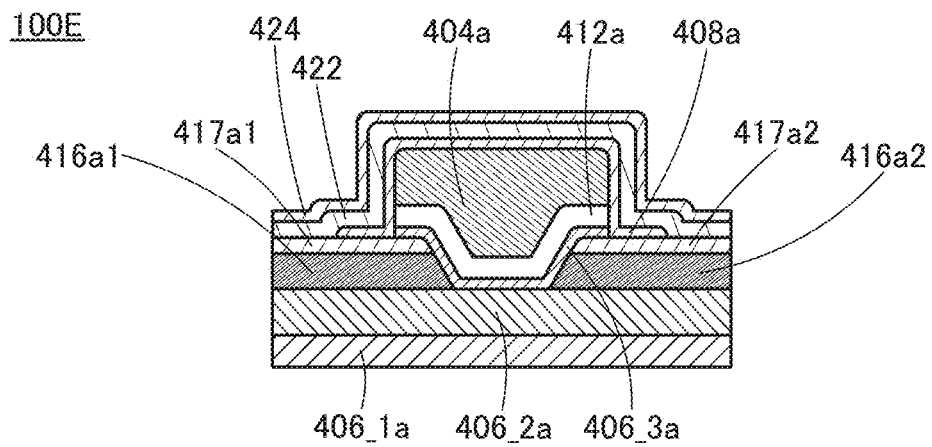

A structure of a region including the conductor 404a functioning as the first gate electrode is described with reference to FIGS. 11A to 11C. Specifically, a positional relation among an end portion of the conductor 404a, an end portion of the insulator 408a, an end portion of the insulator 412a, and an end portion of the oxide 406_3a can be varied. FIGS. 11A to 11C are enlarged cross-sectional views of a region including the first gate electrode.

FIG. 11A is a cross-sectional view of the transistor 100, in which the end portion of the insulator 408a provided so as to cover the conductor 404a, the end portion of the insulator 412a, and the end portion of the oxide 406_3a are aligned with one another. FIG. 11B is a cross-sectional view of a transistor 100D, in which the end portion of the conductor 404a and the end portion of the insulator 412a are aligned with each other and the end portion of the insulator 408a provided so as to cover the conductor 404a and the end portion of the oxide 406_3a are aligned with each other. FIG. 11C is a cross-sectional view of a transistor 100E, in which the end portion of the conductor 404a, the end portion of the insulator 412a, and the end portion of the oxide 406_3a are aligned with one another and the end portion of the insulator 408a provided so as to cover the conductor 404a, the insulator 412a, and the oxide 406_3a is positioned outside the end portions of the conductor 404a, the insulator 412a, and the oxide 406_3a.

The structure of the transistor 200 which has different electrical characteristics from the transistor 100 is described below.

In FIGS. 3B and 3C, the transistor 200 is provided over the insulator 401a over the substrate 400 and the insulator 401b over the insulator 401a. The transistor 200 includes the insulator 301, the insulator 302 over a conductor 309c, a conductor 310c, and the insulator 301, the insulator 303 over the insulator 302, the insulator 402 over the insulator 303, an oxide 406_1b and an oxide 406_1c over the insulator 402, an oxide 406_2b and an oxide 406_2c over the oxide 406_1b and the oxide 406_1c, a conductor 416b1 including a region in contact with a top surface of the oxide 406_2b, a conductor 416b2 including a region in contact with a top surface of the oxide 406_2c, an oxide 406_3b including a region in contact with a side surface of the conductor 416b1, a side surface of the conductor 416b2, a top surface and a side surface of the oxide 406_2b, a top surface and a side surface of the oxide 406_2c, a side surface of the oxide 406_1b, and a side surface of the oxide 406_1c, an insulator 412b over the oxide 406_3b, and a conductor 404b over the insulator 412b. Note that the insulator 301 includes an opening, in which the conductors 309c and 310c are provided.

Furthermore, a barrier film 417b1, a barrier film 417b2, an insulator 408b, the insulator 422, the insulator 424, the insulator 410, the insulator 415, and the insulator 418 are provided over the transistor 200.

In addition, over and in the transistor 200, a fifth opening that passes through the insulators 418, 415, 410, 424, and 422 and the barrier film 417b1 and reaches the conductor 416b1; a sixth opening that passes through the insulators 418, 415, 410, 424, and 422 and the barrier film 417b2 and reaches the conductor 416b2; and a seventh opening that passes through the insulators 418, 415, 410, 424, 422, and 408b and reaches the conductor 404b are provided. A conductor 431b, a conductor 429b, and a conductor 437b are embedded in the fifth opening, the sixth opening, and the seventh opening, respectively. A conductor 432b that is located over the insulator 418 and includes a region in contact with the conductor 431b; a conductor 430b that is located over the insulator 418 and includes a region in contact with the conductor 429b; and a conductor 438b that is located over the insulator 418 and includes a region in contact with the conductor 437b are provided.

The conductor 404b functions as a first gate electrode in the transistor 200. Furthermore, the conductor 404b can have a stacked structure including a conductor that has a function of inhibiting penetration of oxygen. For example, when the conductor that has a function of inhibiting penetration of oxygen is formed as a lower layer, an increase in the electric resistivity due to oxidation of the conductor 404b can be prevented. The insulator 412b functions as a first gate insulator.

The conductors 416b1 and 416b2 function as a source electrode and a drain electrode. The conductors 416b1 and 416b2 each can have a stacked structure including a conductor that has a function of inhibiting penetration of oxygen. For example, when the conductor that has a function of inhibiting penetration of oxygen is formed as an upper layer, an increase in the electric resistivity due to oxidation of the conductors 416b1 and 416b2 can be prevented. Note that the electric resistivities of the conductors can be measured by a two-terminal method or the like.

The barrier films 417b1 and 417b2 each have a function of inhibiting penetration of oxygen and impurities such as hydrogen. The barrier film 417b1 is located over the conductor 416b1 and prevents the diffusion of oxygen into the conductor 416b1. The barrier film 417b2 is located over the conductor 416b2 and prevents the diffusion of oxygen into the conductor 416b2.

As illustrated in FIG. 3B, in the transistor 200, a layer including the oxide 406_1b, the oxide 406_2b, and the conductor 416b1 and a layer including the oxide 406_1c, the oxide 406_2c, and the conductor 416b2 are positioned with a region where part of a top surface of the insulator 402 and the oxide 406_3b are in contact with each other provided therebetween. Here, a side surface of the layer including the oxide 406_1b, the oxide 406_2b, and the conductor 416b1 and a side surface of the layer including the oxide 406_1c, the oxide 406_2c, and the conductor 416b2, which face each other, are each called one side surface, and each of side surfaces of the layers, which do not face each other, is called the other side surface.

The oxide 406_3b includes a region in contact with the one side surface of the conductor 416b1 and a region in contact with the one side surface of the conductor 416b2. Furthermore, the oxide 406_3b also includes a region in contact with part of a top surface and the one side surface of the oxide 406_2b, a region in contact with part of a top surface and the one side surface of the oxide 406_2c, a region in contact with the one side surface of the oxide 406_1b, and a region in contact with the one side surface of the oxide 406_1c. That is, the one side surfaces have step-like shapes in which the conductors 416b1 and 416b2 recede from the oxides 406_2b and 406_2c. On each of the other side surfaces, the oxide 406_1b, the oxide 406_2b, and the conductor 416b1 are substantially aligned with one another, and the oxide 406_1c, the oxide 406_2c, and the conductor 416b2 are substantially aligned with one another. In other words, the other side surfaces are flat.

In the transistor 200, the resistance of the oxide 406_3b can be controlled by a potential applied to the conductor 404b. That is, conduction or non-conduction between the conductors 416b1 and 416b2 can be controlled by the potential applied to the conductor 404b.

Since the channel is formed in the oxide 406_3b in the transistor 200, the transistor 200 has different characteristics from the transistor 100.

In the transistor 200, the conductor 404b functioning as the first gate electrode partly overlaps with each of the conductors 416b1 and 416b2 functioning as a source electrode and a drain electrode, whereby parasitic capacitance between the conductor 404b and the conductor 416b1 and parasitic capacitance between the conductor 404b and the conductor 416b2 are formed.

Since the transistor 200 includes the barrier film 417b1 as well as the insulator 412b and the oxide 406_3b between the conductor 404b and the conductor 416b1, the parasitic capacitance can be reduced. Similarly, the transistor 200 includes the barrier film 417b2 as well as the insulator 412b and the oxide 406_3b between the conductor 404b and the conductor 416b2, allowing a reduction in the parasitic capacitance. Thus, the transistor 200 has excellent frequency characteristics.

Furthermore, the above structure of the transistor 200 allows a reduction or prevention of generation of a leakage current between the conductor 404b and each of the conductors 416b1 and 416b2 when the transistor 200 operates, for example, when a potential difference is generated between the conductor 404b and each of the conductors 416b1 and 416b2.

The conductors 309c and 310c function as a second gate electrode. The conductor 309c functions as a conductive barrier film. Since the conductor 309c is provided so as to cover a bottom surface and side surfaces of the conductor 310c, oxidation of the conductor 310c can be prevented.

A region including the conductor 404b in the transistor 200 can have a structure similar to the region including the conductor 404a in any of the transistors in FIGS. 11A to 11C. Specifically, a positional relation among an end portion of the conductor 404b, an end portion of the insulator 408b, an end portion of the insulator 412b, and an end portion of the oxide 406_3b can be similar to the positional relation of the corresponding region in any of the transistors in FIGS. 11A to 11C.

Figure 12A:
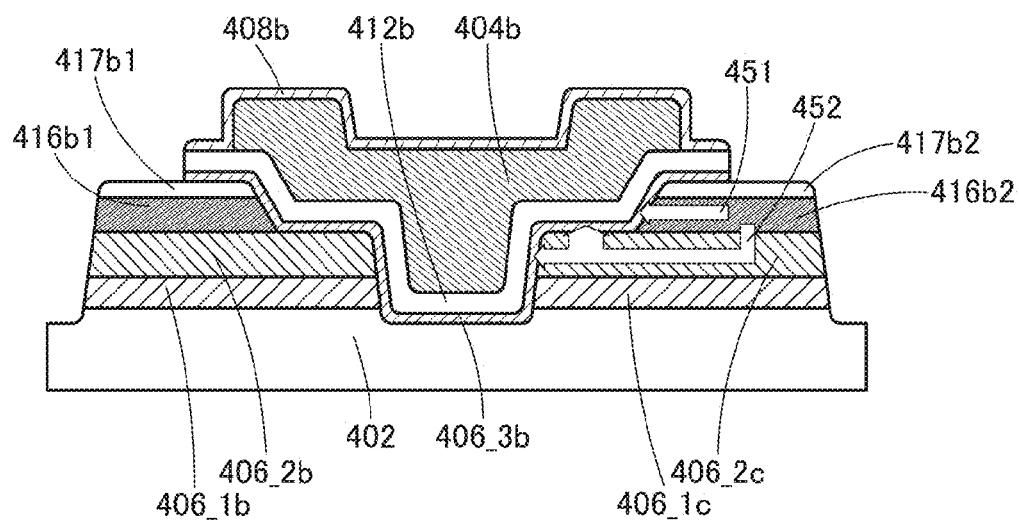
FIGS. 12A and 12B are cross-sectional views each illustrating a structure of part of a transistor of one embodiment of the present invention.
Figure 12B:
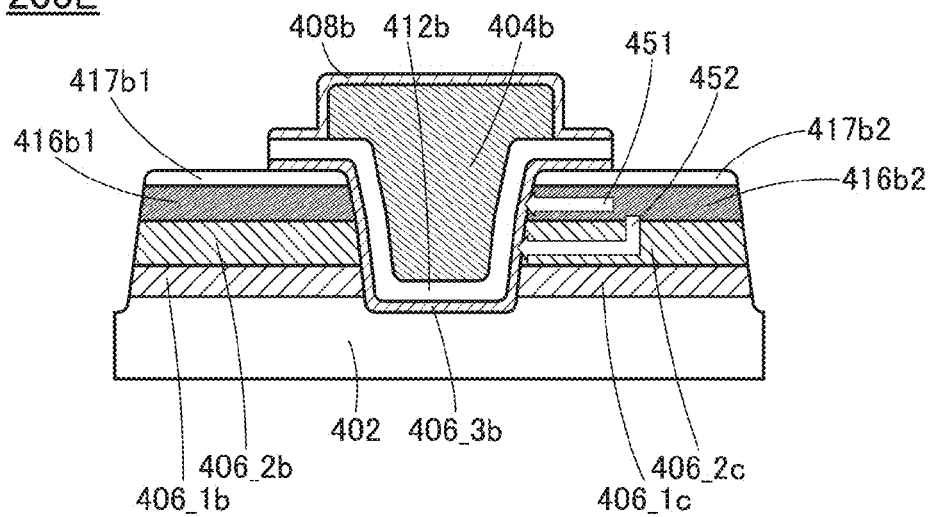

Here, the structure of a transistor 200E and the structure of the transistor 200 of one embodiment of the present invention are compared. FIG. 12A is an enlarged view of a cross section of the transistor 200. FIG. 12B is an enlarged view of a cross section of the transistor 200E.

In the transistor 200, the oxide 406_3b is in contact with the side surface of the conductor 416b1, the side surface of the conductor 416b2, the side surface and part of the top surface of the oxide 406_2b, the side surface and part of the top surface of the oxide 406_2c, the side surface of the oxide 406_1b, and the side surface of the oxide 406_1c.

In contrast, in the transistor 200E, the oxide 406_3b is in contact with the side surface of the conductor 416b1, the side surface of the conductor 416b2, the side surface of the oxide 406_2b, the side surface of the oxide 406_2c, the side surface of the oxide 406_1b, and the side surface of the oxide 406_1c.

Figure 13:
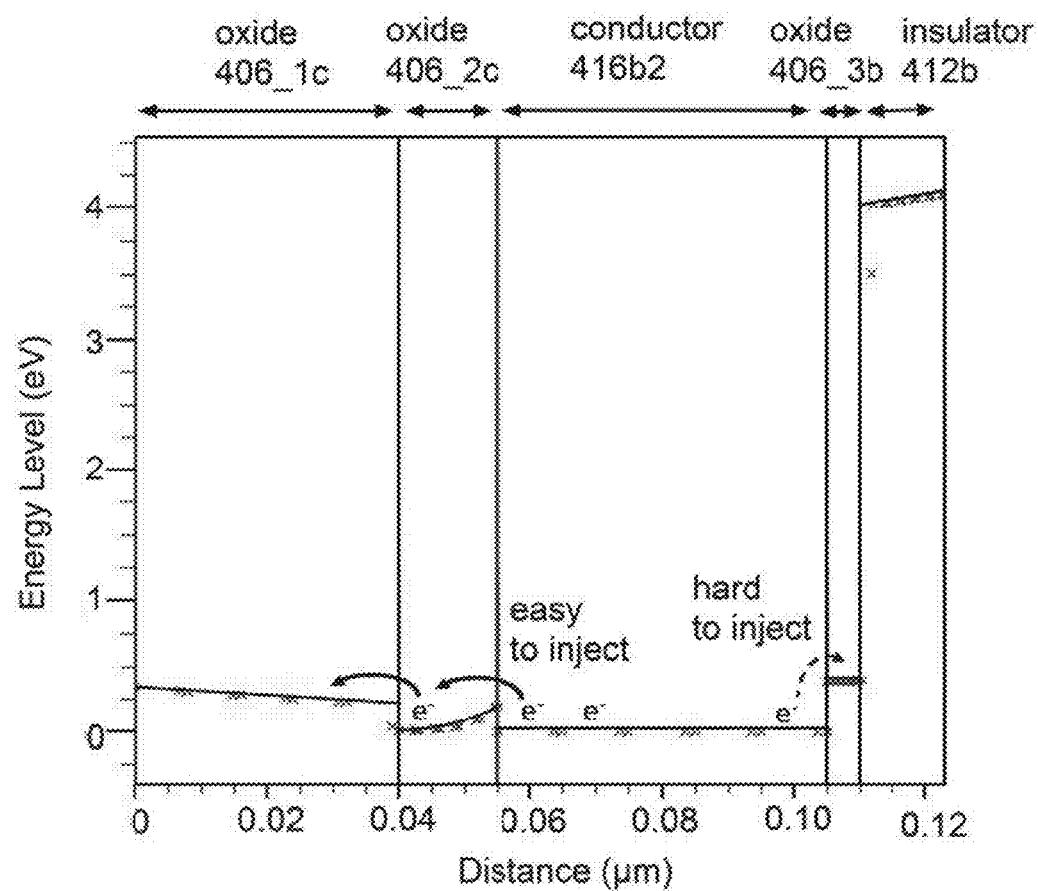
FIG. 13 is a band diagram showing one embodiment of the present invention.

FIG. 13 is a band diagram showing the conduction band minimums (Ec) of a region including the conductor 416b2 functioning as the source electrode of each of the transistors 200 and 200E. In FIG. 13, the vertical axis represents the energy level (eV) and the flat-band energy level is set to 0 eV. The horizontal axis represents the distance (μm). A calculation is made under the following conditions: the conductor 416b2 is a tungsten film; the insulator 412b is a silicon oxynitride film; the oxide 406_1c is an In—Ga—Zn oxide formed using a target having an atomic ratio of In:Ga:Zn=1:3:4; the oxide 406_2c is an In—Ga—Zn oxide formed using a target having an atomic ratio of In:Ga:Zn=1:3:1; and the oxide 406_3b is an In—Ga—Zn oxide formed using a target having an atomic ratio of In:Ga:Zn=1:3:2.

The band diagram of FIG. 13 shows that, because of the small energy barrier, electrons are more easily injected along a second path 452 along which electrons are injected from the conductor 416b2 functioning as the source electrode to the oxide 406_1c or the oxide 406_3b through the oxide 406_2c than along a first path 451 along which electrons are injected from the conductor 416b2 functioning as the source electrode directly to the oxide 406_3b. In other words, it is found that the contact resistance of the second path 452 is lower than that of the first path 451. Arrows in FIGS. 12A and 12B indicate the first path 451 and the second path 452.

In comparison between the electron injection paths in the transistor 200E and the transistor 200, since having a small contact area between the oxide 406_2c and the oxide 406_3b, the transistor 200E has the two paths, i.e., the second path 452 having a low contact resistance, along which electrons are injected to the oxide 406_3b through the oxide 406_2c, and the first path 451 having a high contact resistance, along which electrons are injected directly to the oxide 406_3b from the conductor 416b2 functioning as the source electrode. This means that slight variation in manufacturing transistors might change significantly the contact resistance when electrons are injected from the conductor 416b2 functioning as the source electrode to the oxide 406_3b. In contrast, since the transistor 200 has a large contact area between the oxide 406_2c in the second path 452 and the oxide 406_3b, electrons are injected to the oxide 406_3b dominantly along a path through the oxide 406_2c. As a result, even when the processing variation of the conductors 416b2 each functioning as the source electrode of a transistor is generated, the contact resistance between the conductor 416b2 functioning as the source electrode and a channel region of the oxide 406_3b is not changed significantly in the transistor 200, which results in favorable transistor characteristics with little variation.

Thus, the transistor 200 can have little variation in electrical characteristics, low contact resistance, and large on-state current.

<Substrate>

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a robust semiconductor device can be provided.

For the substrate 400 that is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Insulator>

The transistor is surrounded by an insulator that has a function of inhibiting penetration of oxygen and impurities such as hydrogen, whereby the transistor can have stable electrical characteristics. For example, an insulator with a function of inhibiting penetration of oxygen and impurities such as hydrogen may be used as each of the insulators 401*a*, 401*b*, 408*a*, 408*b*, and 415.

An insulator with a function of inhibiting penetration of oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 303, 401*a*, 401*b*, 408*a*, 408*b*, 415, 418, 422, and 424 may be each formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 303, 401*a*, 401*b*, 408*a*, 408*b*, 415, 418, 422, and 424 each preferably include aluminum oxide.

For example, when the insulator 422 is formed using plasma including oxygen, oxygen can be added to the insulator 402 serving as a base layer. The added oxygen serves as excess oxygen in the insulator 402, and is added to the oxides 406_1*a*, 406_2*a*, 406_3*a*, and 406_3*b* through the insulator 402 by heat treatment or the like, so that oxygen defects in the oxides 406_1*a*, 406_2*a*, 406_3*a*, and 406_3*b* can be repaired.

For example, when the insulator 415 is formed using plasma including oxygen, oxygen can be added to the insulator 410. The added oxygen serves as excess oxygen in the insulator 410, and is added to the oxides 406_1*a*, 406_2*a*, 406_3*a*, and 406_3*b* through the insulator 410 by heat treatment or the like, so that oxygen defects in the oxides 406_1*a*, 406_2*a*, 406_3*a*, and 406_3*b* can be repaired.

Furthermore, when the insulators 303, 401*a*, 408*a*, 408*b*, 424, and 418 include aluminum oxide, outward diffusion of the excess oxygen added to the oxides 406_1*a*, 406_2*a*, 406_3*a*, and 406_3*b* can be reduced.

The insulators 301, 302, 402, 412*a*, and 412*b* can each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 302, 402, 412*a*, and 412*b* preferably contain silicon oxide or silicon oxynitride.

In particular, the insulators 402, 412*a*, and 412*b* preferably include an insulator with a high relative permittivity. For example, the insulators 402, 412*a*, and 412*b* each preferably contain gallium oxide, hafnium oxide, oxide containing aluminum and hafnium, oxynitride containing aluminum and hafnium, oxide containing silicon and hafnium, oxynitride containing silicon and hafnium, or the like. Alternatively, the insulators 402, 412*a*, and 412*b* each preferably have a stacked-layer structure of silicon oxide or silicon oxynitride and an insulator with a high relative permittivity. Because silicon oxide and silicon oxynitride have thermal stability, combination of silicon oxide or silicon oxynitride with an insulator with a high relative permittivity allows the stacked-layer structure to be thermally stable and have a high relative permittivity. For example, when aluminum oxide, gallium oxide, or hafnium oxide is positioned on the oxide 406_3*a* side, entry of silicon included in silicon oxide or silicon oxynitride into the oxide 406_2*a* can be inhibited. When silicon oxide or silicon oxynitride is positioned on the oxide 406_3*a* side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 410 preferably includes an insulator with low relative permittivity. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

An insulator with a function of inhibiting penetration of oxygen and impurities such as hydrogen may be used as each of the barrier films 417*a*1, 417*a*2, 417*b*1, and 417*b*2. The barrier films 417*a*1, 417*a*2, 417*b*1, and 417*b*2 can prevent excess oxygen included in the insulator 410 from diffusing to the conductors 416*a*1, 416*a*2, 416*b*1, and 416*b*2.

The barrier films 417*a*1, 417*a*2, 417*b*1, and 417*b*2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example. Note that the barrier films 417*a*1, 417*a*2, 417*b*1, and 417*b*2 preferably include silicon nitride.

<Conductor>

The conductors 404*a*, 404*b*, 309*a*, 309*b*, 309*c*, 310*a*, 310*b*, 310*c*, 416*a*1, 416*a*2, 416*b*1, 416*b*2, 429*a*, 429*b*, 431*a*, 431*b*, 433*a*, 437*a*, 437*b*, 430*a*, 430*b*, 432*a*, 432*b*, 434*a*, 438a, and 438b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like. Alternatively, a semiconductor having a high electric conductivity typified by polycrystalline silicon including an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With any of such materials, hydrogen contained in the oxides 406_1a, 406_2a, 406_3a, and 406_3b can be captured in some cases. Alternatively, hydrogen entering from an external insulator can be captured in some cases.

A stack of a plurality of conductive layers formed with the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When an oxide semiconductor is used for the channel formation region of the transistor, a stacked-layer structure formed using a material containing the above-described metal element and a conductive material containing oxygen is preferably used for the gate electrode. In that case, the conductive material containing oxygen is preferably formed on the channel formation region side. When the conductive material containing oxygen is formed on the channel formation region side, oxygen released from the conductive material is likely to be supplied to the channel formation region.

The conductors 429a, 429b, 431a, 431b, 433a, 437a, and 437b may be formed using, for example, a conductive material with high embeddability, such as tungsten or polysilicon. A conductive material with high embeddability and a conductive barrier film such as a titanium layer, a titanium nitride layer, or a tantalum nitride layer may be used in combination.

<Oxide>

As the oxides 406_1a, 406_2a, 406_3a, and 406_3b, an oxide semiconductor is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

An oxide that can be used as the oxides 406_1a, 406_2a, 406_3a, 406_3b, and the like is described.

The oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide is InMZnO containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

<Structure>

An oxide is classified into a single crystal oxide semiconductor and a non-single-crystal oxide semiconductor. Examples of a non-single-crystal oxide include a c-axis-aligned crystalline oxide semiconductor (CAAC-OS), a polycrystalline oxide, a nanocrystalline oxide semiconductor (nc-OS), an amorphous-like oxide semiconductor (a-like OS), and an amorphous oxide.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, or the like is included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide, depending on an analysis method.

The a-like OS has a structure between those of the nc-OS and the amorphous oxide. The a-like OS has a void or a low-density region. That is, the a-like OS has low crystallinity as compared with the nc-OS and the CAAC-OS.

An oxide can have various structures which show various different properties. Two or more of the amorphous oxide, the polycrystalline oxide, the a-like OS, the nc-OS, and the CAAC-OS may be included in an oxide of one embodiment of the present invention.

<Atomic Ratio>

Next, preferred ranges of the atomic ratio of indium, the element M, and zinc contained in an oxide according to the present invention are described with reference to FIGS. 14A to 14C. Note that the proportion of oxygen atoms is not shown in FIGS. 14A to 14C. The terms of the atomic ratio of indium, the element M, and zinc contained in the oxide are denoted by [In], [M], and [Zn], respectively.

In FIGS. 14A to 14C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-a):2$, a line where the atomic ratio [In]:[M]:[Zn] is $(1+\alpha):(1-a):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

A dashed double-dotted line indicates a line where the atomic ratio [In]:[M]:[Zn] is $(1+\gamma):2:(1-\gamma)$, where $-1 \leq \gamma \leq 1$. An oxide with the atomic ratio [In]:[M]:[Zn] of 0:2:1 or around 0:2:1 in FIGS. 14A to 14C tends to have a spinel crystal structure.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

A region A in FIG. 14A shows an example of the preferred ranges of the atomic ratio of indium, the element M, and zinc contained in an oxide.

In addition, the oxide having a high content of indium can have high carrier mobility (electron mobility). This is because in an oxide containing indium, the element M, and zinc, the s orbital of heavy metal mainly contributes to carrier transfer, and a higher indium content in the oxide enlarges a region where the s orbitals of indium atoms overlap. Thus, an oxide having a high content of indium has higher carrier mobility than an oxide having a low content of indium.

In contrast, carrier mobility decreases as the indium content and the zinc content in an oxide become lower. Thus, with an atomic ratio of [In]:[M]:[Zn]=0:1:0 and the vicinity thereof (e.g., a region C in FIG. 14C), insulation performance becomes better.

Accordingly, an oxide of one embodiment of the present invention preferably has an atomic ratio represented by the region A in FIG. 14A. With the atomic ratio, a layered structure with high carrier mobility and a few grain boundaries is easily obtained.

In the region A, in particular a region B in FIG. 14B, an excellent oxide which easily becomes a CAAC-OS and has high carrier mobility can be obtained.

The CAAC-OS is an oxide with high crystallinity. In contrast, in the CAAC-OS, a reduction in the electron mobility due to the grain boundary is less likely to occur because a clear grain boundary cannot be observed. Entry of impurities, formation of defects, or the like might decrease the crystallinity of an oxide. This means that the CAAC-OS has small amounts of impurities and defects (e.g., oxygen vacancies). Thus, an oxide including a CAAC-OS is physically stable. Therefore, the oxide including a CAAC-OS is resistant to heat and has high reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide is not uniquely determined by an atomic ratio. Even with the same atomic ratio, the property of an oxide might be different depending on a formation condition. For example, in the case where the oxide is deposited with a sputtering apparatus, a film having an atomic ratio deviated from the atomic ratio of a target is formed. In addition, [Zn] in the film might be smaller than [Zn] in the target depending on the substrate temperature in deposition. Thus, the illustrated regions each represent an atomic ratio with which an oxide tends to have specific characteristics, and boundaries of the regions A to C are not clear.

[Transistor Including Oxide]

Next, the case where the oxide is used for a transistor is described.

When the oxide is used for a transistor, carrier scattering or the like at a grain boundary can be reduced; thus, the transistor can have high field-effect mobility. Moreover, the transistor can have high reliability.

An oxide with a low carrier density is preferably used for a transistor. For example, an oxide whose carrier density is lower than $8 \times 10^{11}/cm^3$, preferably lower than $1 \times 10^{11}/cm^3$, further preferably lower than $1 \times 10^{10}/cm^3$, and greater than or equal to $1 \times 10^{-9}/cm^3$ is used.

A highly purified intrinsic or substantially highly purified intrinsic oxide has few carrier generation sources and thus can have a low carrier density. A highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide with a high density of trap states has unstable electrical characteristics in some cases.

In view of the above, to obtain stable electrical characteristics of a transistor, it is effective to reduce the concentration of impurities in the oxide. To reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

<Impurity>

Here, the influence of impurities in the oxide is described.

When silicon or carbon, which is a Group 14 element, is contained in the oxide, defect states are formed in the oxide. Thus, the concentration of silicon or carbon in the oxide and around an interface with the oxide (the concentration obtained by secondary ion mass spectrometry (SIMS)) is set lower than or equal to $2 \times 10^{18}$ atoms/$cm^3$, preferably lower than or equal to $2 \times 10^{17}$ atoms/$cm^3$.

When the oxide contains alkali metal or alkaline earth metal, defect states are formed and carriers are generated in some cases. Thus, a transistor using an oxide that contains alkali metal or alkaline earth metal is likely to have normally-on characteristics. Accordingly, it is preferable to reduce the concentration of alkali metal or alkaline earth metal in the oxide. Specifically, the concentration of alkali metal or alkaline earth metal in the oxide measured by SIMS is set lower than or equal to $1 \times 10^{18}$ atoms/cm$^3$, preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor in which an oxide containing nitrogen is used as a semiconductor is likely to have normally-on characteristics. For this reason, nitrogen in the oxide is preferably reduced as much as possible. For example, the nitrogen concentration in the oxide measured by SIMS is set lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

Hydrogen contained in an oxide reacts with oxygen bonded to a metal atom to be water, and thus causes an oxygen vacancy in some cases. Due to entry of hydrogen into the oxygen vacancy, an electron serving as a carrier is sometimes generated. Furthermore, in some cases, bonding of part of hydrogen to oxygen bonded to a metal atom causes generation of an electron serving as a carrier. Thus, a transistor using an oxide that contains hydrogen is likely to have normally-on characteristics. Accordingly, it is preferred that hydrogen in the oxide be reduced as much as possible. Specifically, the hydrogen concentration in the oxide measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

When an oxide with sufficiently reduced impurity concentration is used for a channel region in a transistor, the transistor can have stable electrical characteristics.

<Band Diagram>

Figure 15A:
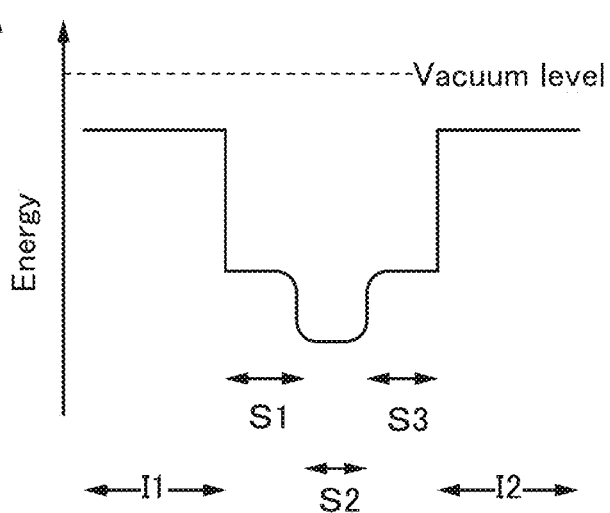
FIGS. 15A to 15C are band diagrams of stacked-layer structures of oxides.
Figure 15B:
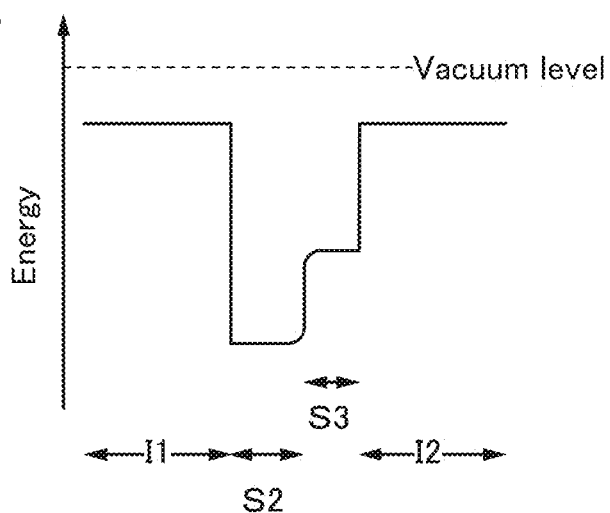
Figure 15C:
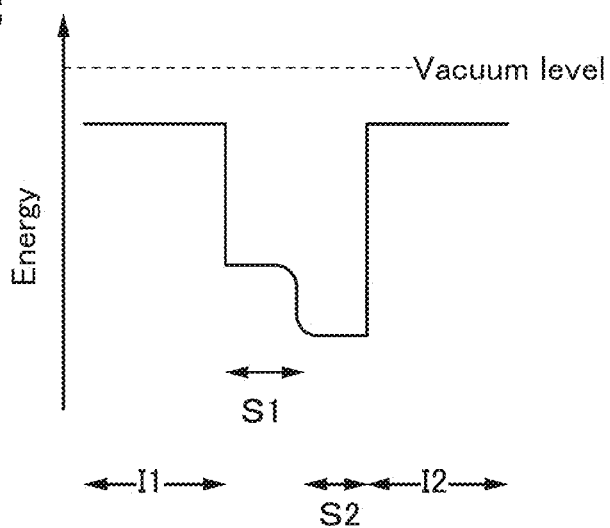
Figure 18A:
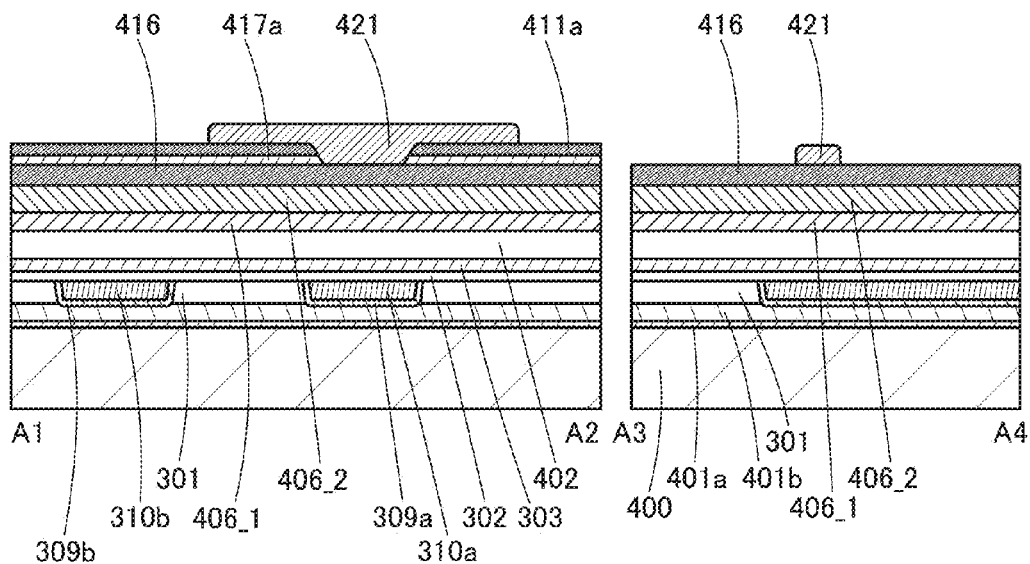
FIGS. 18A to 18D illustrate a method for manufacturing a transistor of one embodiment of the present invention.
Figure 18B:
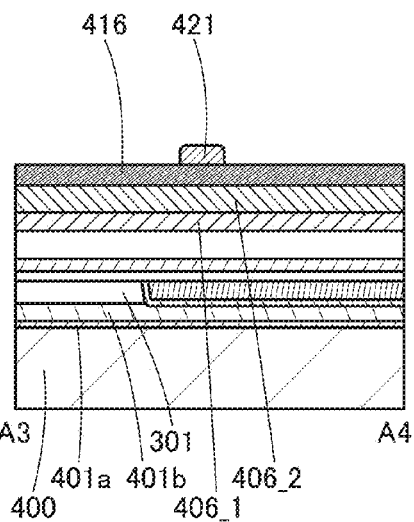
Figure 18C:
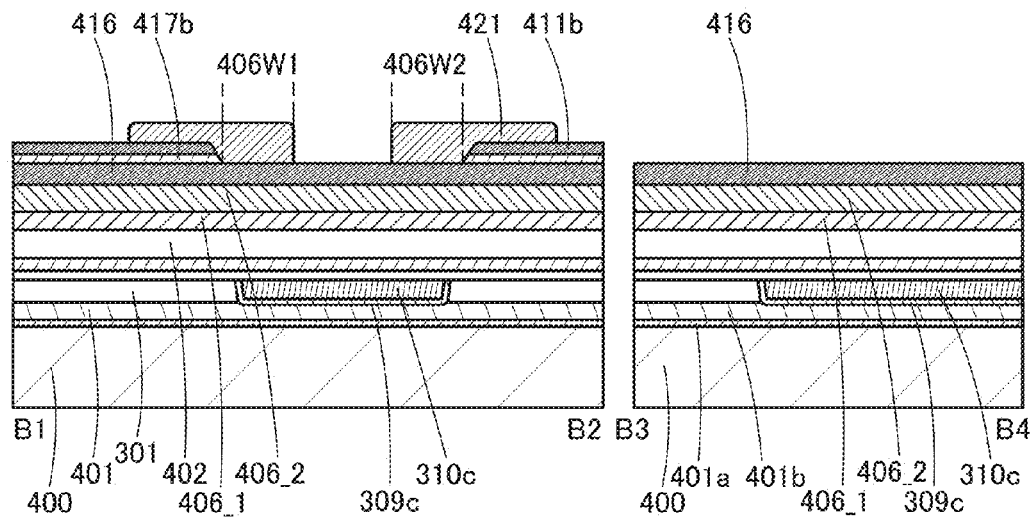
Figure 18D:
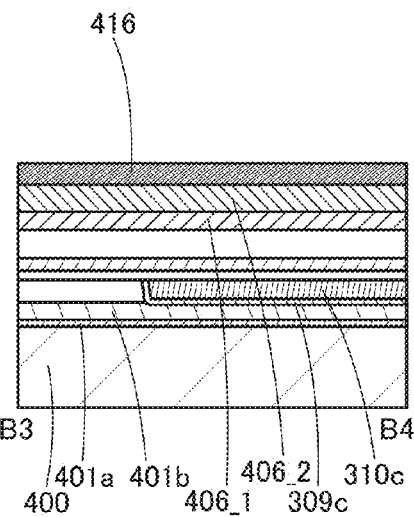

Next, the case where the oxide has a two-layer structure or a three-layer structure will be described. With reference to FIGS. 15A to 15C, the description is made on a band diagram of a layered structure of an oxide S1, an oxide S2, and an oxide S3 and insulators that are in contact with the layered structure; a band diagram of a layered structure of the oxide S2 and the oxide S3 and insulators that are in contact with the layered structure; and a band diagram of a layered structure of the oxide S1 and the oxide S2 and insulators that are in contact with the layered structure.

FIG. 15A is an example of a band diagram of a layered structure including an insulator I1, the oxide S1, the oxide S2, the oxide S3, and an insulator I2 in the thickness direction. FIG. 15B is an example of a band diagram of a layered structure including the insulator I1, the oxide S2, the oxide S3, and the insulator I2 in the thickness direction. FIG. 15C is an example of a band diagram of a layered structure including the insulator I1, the oxide S1, the oxide S2, and the insulator I2 in the thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in the energy level of the conduction band minimum between the oxide S2 and each of the oxides S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As illustrated in FIGS. 15A to 15C, the energy level of the conduction band minimum of each of the oxides S1 to S3 is gradually varied. In other words, the energy level of the conduction band minimum is continuously varied or continuous junction is formed. To obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, when the oxide S2 is an In—Ga—Zn oxide, it is preferable to use an In—Ga—Zn oxide, a Ga—Zn oxide, gallium oxide, or the like as the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and a large on-state current can be obtained.

When an electron is trapped by a trap state, the trapped electron behaves like fixed charge; thus, the threshold voltage of a transistor is shifted in the positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. Accordingly, the oxide S2, the interface between the oxides S1 and S2, and the interface between the oxides S2 and S3 mainly function as a channel region. For example, an oxide with high insulation performance and the atomic ratio represented by the region C in FIG. 14C can be used as the oxides S1 and S3. Note that the region C in FIG. 14C represents the atomic ratio [In]:[M]:[Zn] of 0:1:0, 1:3:2, and 1:3:4 and the vicinities thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

<Transistor Structure 2>

Here, a transistor 100A and a transistor 200A whose structures are different from those of FIGS. 2A to 2C and FIGS. 3A to 3C are described.

Figure 4A:
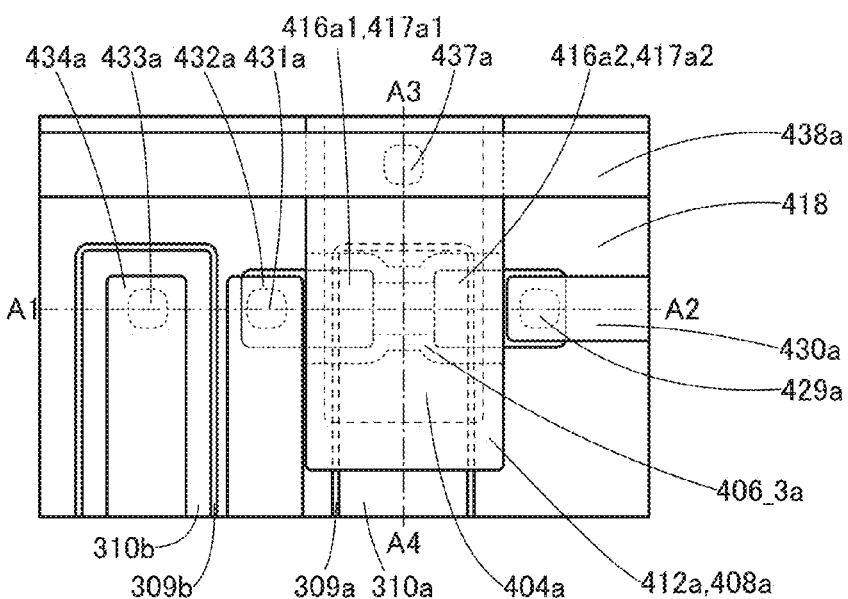
FIGS. 4A to 4C are a top view and cross-sectional views illustrating a structure of a transistor of one embodiment of the present invention.
Figures 4B, 4C:
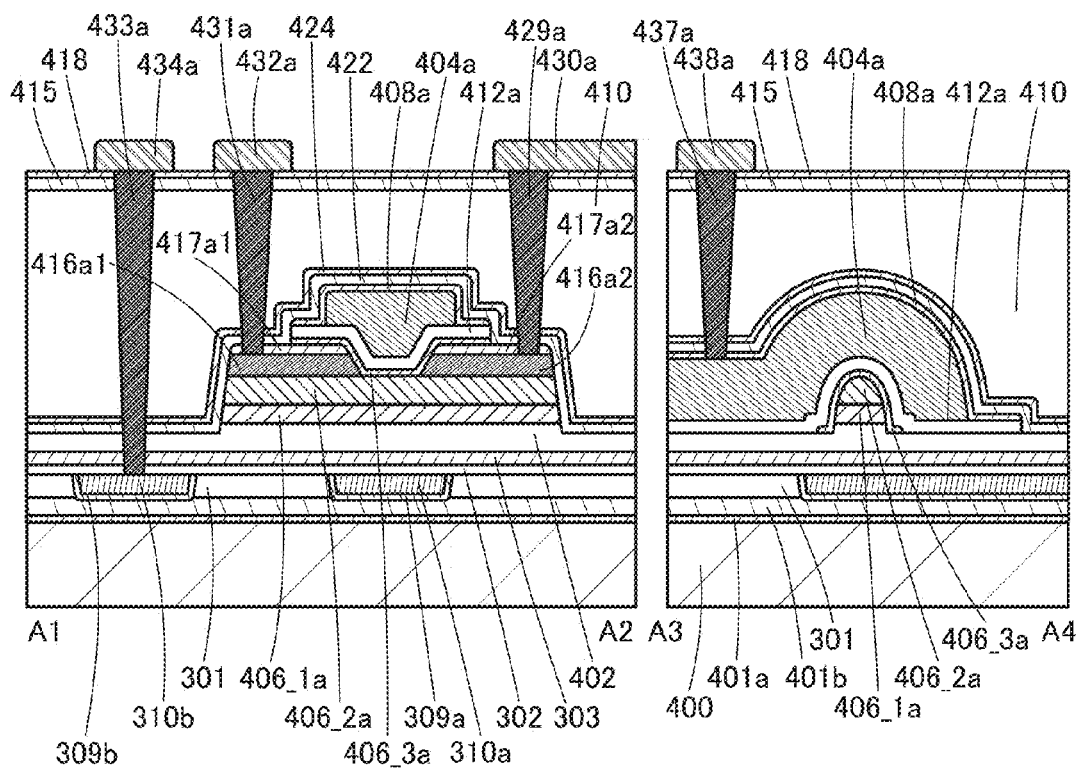

FIGS. 4A to 4C are a top view and cross-sectional views illustrating the transistor 100A of one embodiment of the present invention. FIG. 4A is the top view. FIG. 4B is a cross-sectional view taken along dashed-dotted line A1-A2 in FIG. 4A. FIG. 4C is a cross-sectional view taken along dashed-dotted line A3-A4 in FIG. 4A. Note that for simplification of the drawing, some components are not illustrated in the top view in FIG. 4A.

The transistor 100A illustrated in FIGS. 4A to 4C is different from the transistor 100 illustrated in FIGS. 2A to 2C in the shape of the oxide 406_3a. In the transistor 100, the end portions of the insulators 408a and 412a are aligned with the end portion of the oxide 406_3a, whereas in the transistor 100A, the end portion of the oxide 406_3a is provided on an inner side than the end portions of insulators 408a and 412a in FIG. 4C, although the end portions of the insulators 408a and 412a are aligned with the end portion of the oxide 406_3a in FIG. 4B. The above difference is caused by a difference in formation steps of the oxide 406_3a and the insulator 408a in the manufacturing process of the transistor, and the manufacture process of the transistor 100A is advantageous in that the oxide 406_3a can be shaped freely. The formation process of the transistor will be described later. For the other components, refer to the structure of the transistor 100.

Figure 5A:
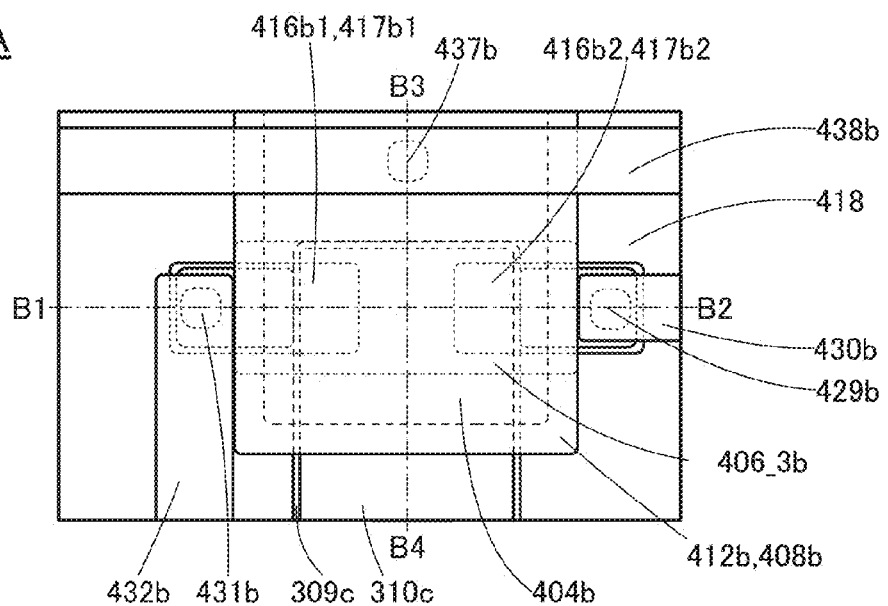
FIGS. 5A to 5C are a top view and cross-sectional views illustrating a structure of a transistor of one embodiment of the present invention.
Figures 5B, 5C:
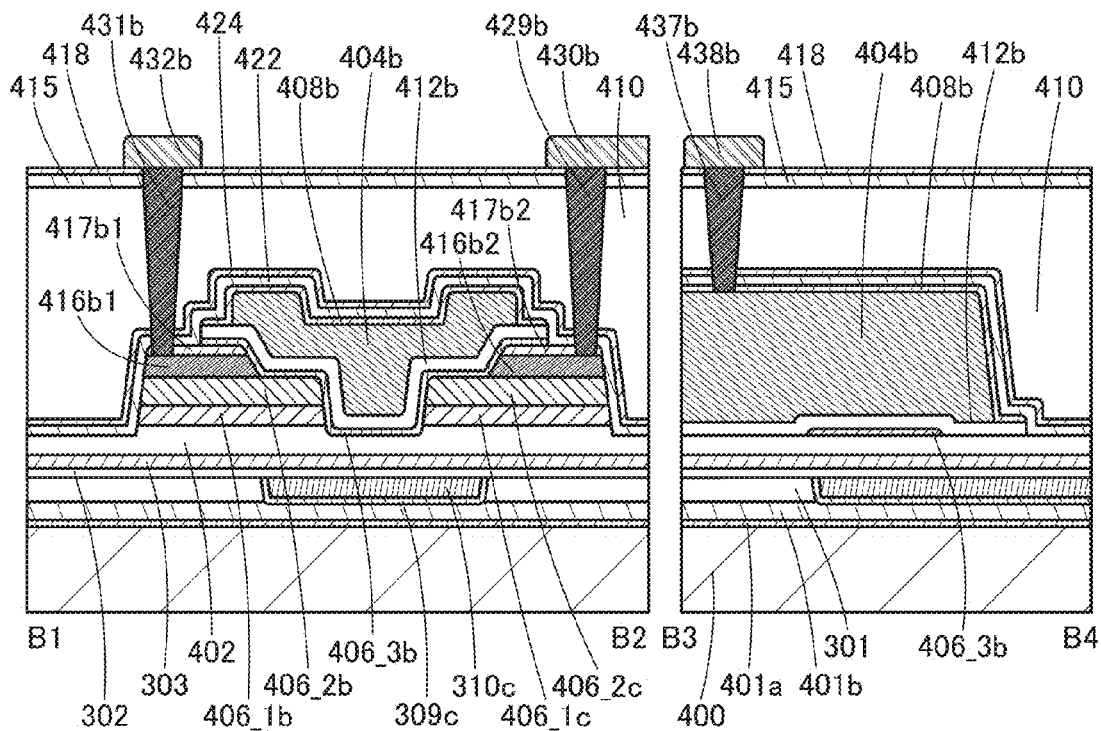

FIGS. 5A to 5C are a top view and cross-sectional views illustrating the transistor 200A of one embodiment of the present invention. FIG. 5A is the top view. FIG. 5B is a cross-sectional view taken along dashed-dotted line B1-B2 in FIG. 5A. FIG. 5C is a cross-sectional view taken along dashed-dotted line B3-B4 in FIG. 5A. Note that for simplification of the drawing, some components are not illustrated in the top view in FIG. 5A.

The transistor 200A illustrated in FIGS. 5A to 5C is different from the transistor 200 illustrated in FIGS. 3A to 3C in the shape of the oxide 406_3b. In the transistor 200, the end portions of the insulators 408b and 412b are aligned with the end portion of the oxide 406_3b, whereas in the transistor 200A, the end portion of the oxide 406_3b is provided on an inner side than the end portions of insulators 408b and 412b in FIG. 5C, although the end portions of the insulators 408b and 412b are aligned with the end portion of the oxide 406_3b in FIG. 5B. The above difference is caused by a difference in formation steps of the oxide 406_3b and the insulator 408b in the manufacturing process of the transistor, and the manufacture process of the transistor 200A is advantageous in that the oxide 406_3b can be shaped freely. The formation process of the transistor will be described later. For the other components, refer to the structure of the transistor 200.

<Transistor Structure 3>

Here, a transistor 100B and a transistor 200B whose structures are different from those of FIGS. 2A to 2C and FIGS. 3A to 3C are described.

Figure 6A:
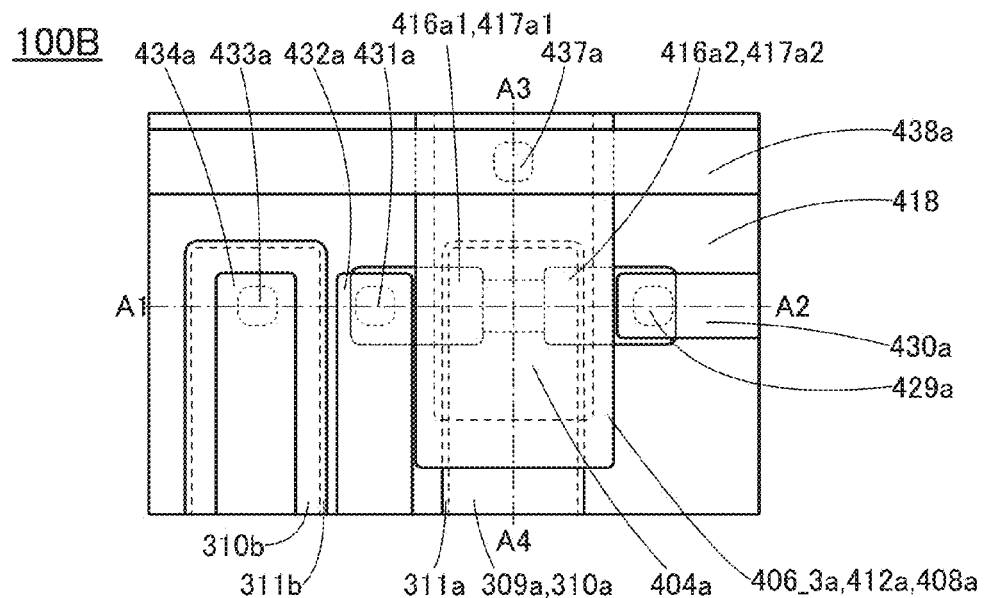
FIGS. 6A to 6C are a top view and cross-sectional views illustrating a structure of a transistor of one embodiment of the present invention.
Figures 6B, 6C:
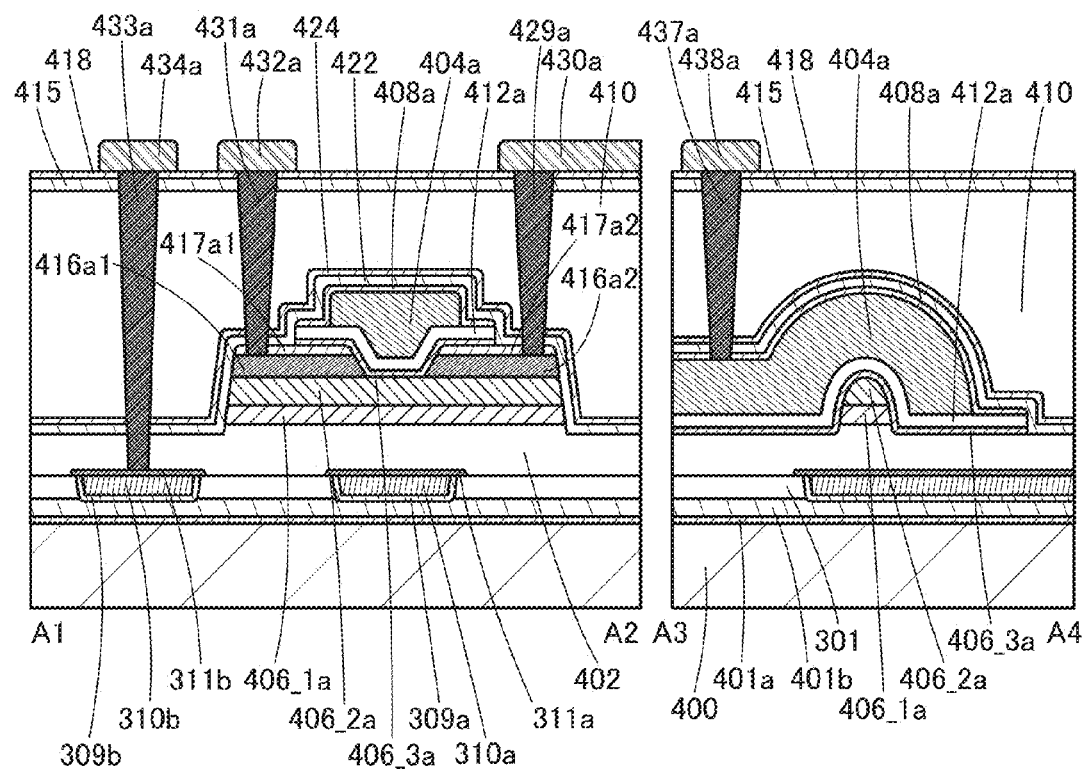

FIGS. 6A to 6C are a top view and cross-sectional views illustrating the transistor 100B of one embodiment of the present invention. FIG. 6A is the top view. FIG. 6B is a cross-sectional view taken along dashed-dotted line A1-A2 in FIG. 6A. FIG. 6C is a cross-sectional view taken along dashed-dotted line A3-A4 in FIG. 6A. Note that for simplification of the drawing, some components are not illustrated in the top view in FIG. 6A.

The transistor 100B illustrated in FIGS. 6A to 6C is different from the transistor 100 illustrated in FIGS. 2A to 2C in that a conductor 311a and a conductor 311b are provided and the insulators 302 and 303 are not provided.

Since each functioning as a conductive barrier film, the conductors 311a and 311b each have a function of inhibiting penetration of oxygen and impurities such as hydrogen. A conductor similar to that used for the conductors 309a and 309b can be used for the conductors 311a and 311b.

The bottom surface and side surfaces of the conductor 310a are covered with the conductor 309a and a top surface of the conductor 310a is covered with the conductor 311a; thus, impurities such as hydrogen can be prevented from being released externally from the conductor 310a. In addition, oxygen can be prevented from entering the conductor 310a from the outside, preventing oxidation of the conductor 310a. Since the conductor 310b has the same structure described above, the conductor 310b has the same effects. For the other components, refer to the structure of the transistor 100.

Figure 7A:
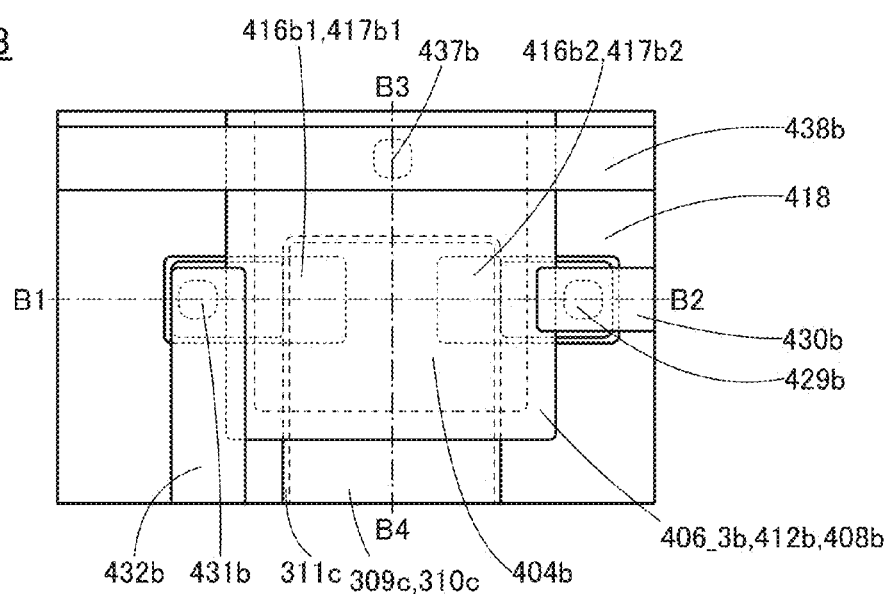
FIGS. 7A to 7C are a top view and cross-sectional views illustrating a structure of a transistor of one embodiment of the present invention.
Figures 7B, 7C:
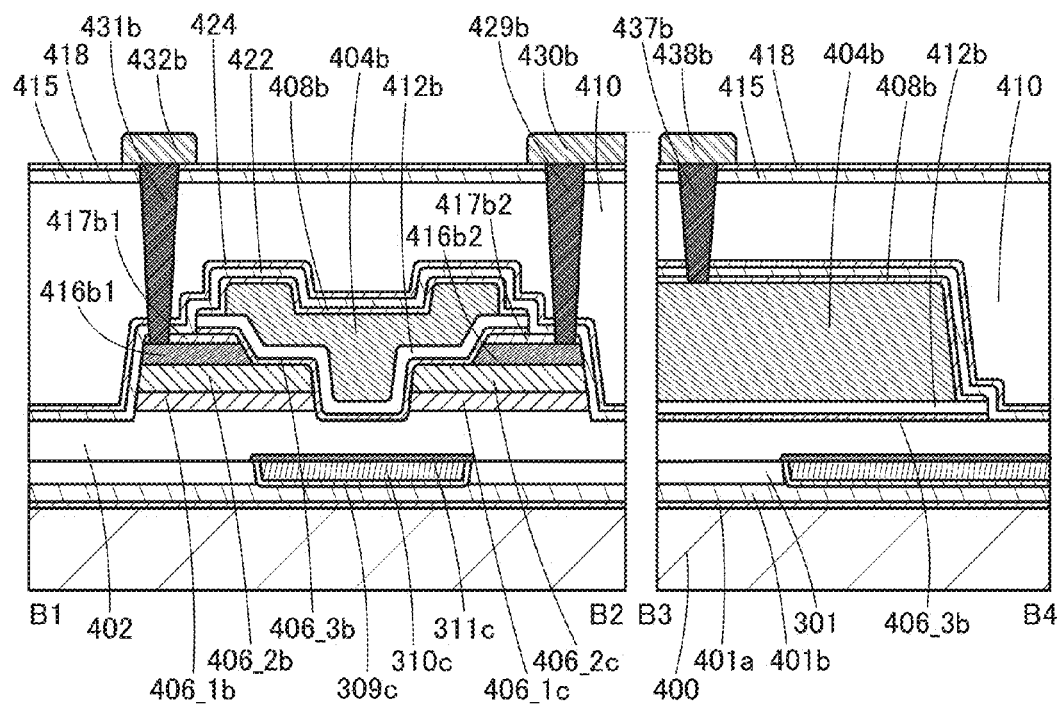

FIGS. 7A to 7C are a top view and cross-sectional views illustrating the transistor 200B of one embodiment of the present invention. FIG. 7A is the top view. FIG. 7B is a cross-sectional view taken along dashed-dotted line B1-B2 in FIG. 7A. FIG. 7C is a cross-sectional view taken along dashed-dotted line B3-B4 in FIG. 7A. Note that for simplification of the drawing, some components are not illustrated in the top view in FIG. 7A.

The transistor 200B illustrated in FIGS. 7A to 7C is different from the transistor 200 illustrated in FIGS. 3A to 3C in that a conductor 311c is provided and the insulators 302 and 303 are not provided.

Since functioning as a conductive barrier film, the conductor 311c has a function of inhibiting penetration of oxygen and impurities such as hydrogen. A conductor similar to that used for the conductor 309c can be used for the conductor 311c.

The bottom surface and side surfaces of the conductor 310c are covered with the conductor 309c and a top surface of the conductor 310c is covered with the conductor 311c; thus, impurities such as hydrogen can be prevented from being released externally from the conductor 310c. In addition, oxygen can be prevented from entering the conductor 310c from the outside, preventing oxidation of the conductor 310c. For the other components, refer to the structure of the transistor 200.

<Transistor Structure 4>

Here, a transistor 100C and a transistor 200C whose structures are different from those of FIGS. 2A to 2C and FIGS. 3A to 3C are described.

FIGS. 8A to 8C are a top view and cross-sectional views illustrating the transistor 100C of one embodiment of the present invention. FIG. 8A is the top view. FIG. 8B is a cross-sectional view taken along dashed-dotted line A1-A2 in FIG. 8A. FIG. 8C is a cross-sectional view taken along dashed-dotted line A3-A4 in FIG. 8A. Note that for simplification of the drawing, some components are not illustrated in the top view in FIG. 8A.

The transistor 100C illustrated in FIGS. 8A to 8C is different from the transistor 100 illustrated in FIGS. 2A to 2C in that the insulators 422 and 424 are not provided. With such a structure, oxygen contained in the insulator 410 (also referred to as excess oxygen) can be injected to the oxides 406_1a and 406_2a through the insulator 402. In addition, the excess oxygen contained in the insulator 410 can be injected to the oxides 406_3a and 406_2a through a side surface of the insulator 412a. For the other components, refer to the structure of the transistor 100.

Figure 9A:
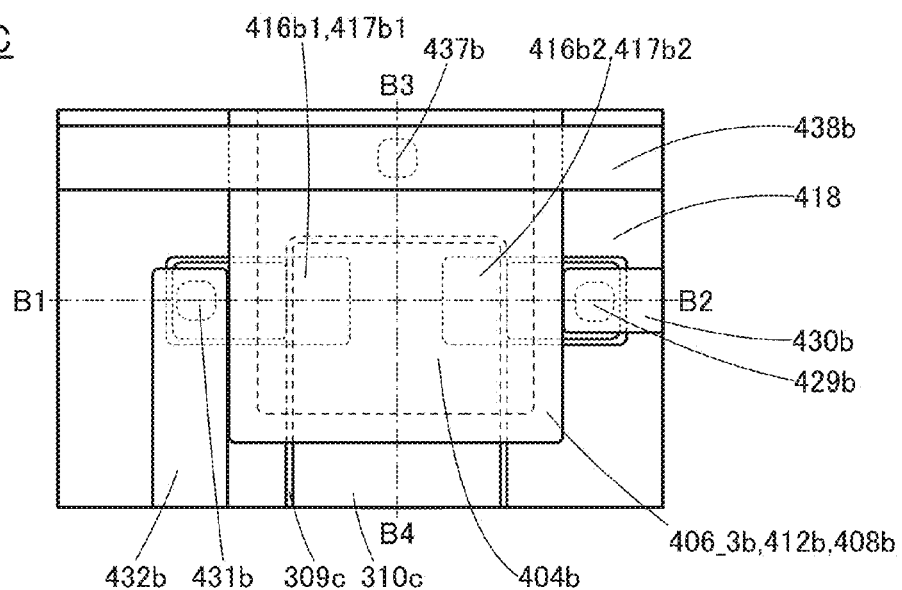
FIGS. 9A to 9C are a top view and cross-sectional views illustrating a structure of a transistor of one embodiment of the present invention.
Figures 9B, 9C:
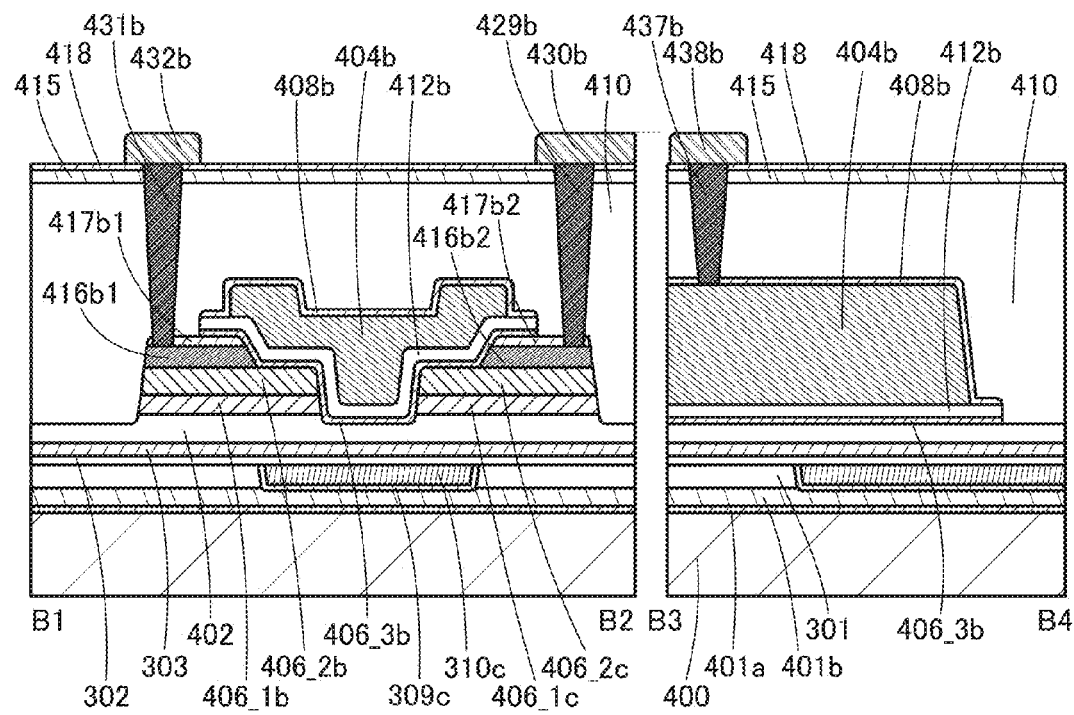

FIGS. 9A to 9C are a top view and cross-sectional views illustrating the transistor 200C of one embodiment of the present invention. FIG. 9A is the top view. FIG. 9B is a cross-sectional view taken along dashed-dotted line B1-B2 in FIG. 9A. FIG. 9C is a cross-sectional view taken along dashed-dotted line B3-B4 in FIG. 9A. Note that for simplification of the drawing, some components are not illustrated in the top view in FIG. 9A.

The transistor 200C illustrated in FIGS. 9A to 9C is different from the transistor 200 illustrated in FIGS. 3A to 3C in that the insulators 422 and 424 are not provided. With such a structure, oxygen contained in the insulator 410 (also referred to as excess oxygen) can be injected to the oxides 406_1b, 406_2b, 406_1c, 406_2c, and 406_3b through the insulator 402. In addition, the excess oxygen contained in the insulator 410 can be injected to the oxides 406_3b and 406_2b through a side surface of the insulator 412b. For the other components, refer to the structure of the transistor 200.

<Transistor Structure 5>

Here, a transistor 200D whose structure is different from that of FIGS. 3A to 3C is described.

FIGS. 10A to 10C are a top view and cross-sectional views illustrating the transistor 200D of one embodiment of the present invention. FIG. 10A is the top view. FIG. 10B is a cross-sectional view taken along dashed-dotted line B1-B2 in FIG. 10A. FIG. 10C is a cross-sectional view taken along dashed-dotted line B3-B4 in FIG. 10A. Note that for simplification of the drawing, some components are not illustrated in the top view in FIG. 10A.

The transistor 200D illustrated in FIGS. 10A to 10C is different from the transistor 200 illustrated in FIGS. 3A to 3C in that conductors functioning as a second gate electrode are not provided. For the other components, refer to the structure of the transistor 200.

Embodiment 2

<Method 1 for Manufacturing Transistor>

A method for manufacturing a semiconductor device including the transistor 100 in FIGS. 2A to 2C and the transistor 200 in FIGS. 3A to 3C according to the present invention is described below with reference to FIGS. 16A to 16D, FIGS. 17A to 17D, FIGS. 18A to 18D, FIGS. 19A and 19B, FIGS. 20A to 20D, FIGS. 21A to 21D, FIGS. 22A to 22D, and FIGS. 23A to 23D. FIG. 16A, FIG. 17A, FIG. 18A, FIG. 19A, FIG. 20A, FIG. 21A, FIG. 22A, and FIG. 23A are each a cross-sectional view taken along dashed-dotted line A1-A2 in FIG. 2A. FIG. 16B, FIG. 17B, FIG. 18B, FIG. 19B, FIG. 20B, FIG. 21B, FIG. 22B, and FIG. 23B are each a cross-sectional view taken along dashed-dotted line A3-A4 in FIG. 2A. FIG. 16C, FIG. 17C, FIG. 18C, FIG. 20C, FIG. 21C, FIG. 22C, and FIG. 23C are each a cross-sectional view taken along dashed-dotted line B1-B2 in FIG. 3A. FIG. 16D, FIG. 17D, FIG. 18D, FIG. 20D, FIG. 21D, FIG. 22D, and FIG. 23D are each a cross-sectional view taken along dashed-dotted line B3-B4 in FIG. 3A.

First, the substrate 400 is prepared.

Next, the insulator 401a is formed. The insulator 401a can be formed by a sputtering method, a chemical vapor deposition (CVD) method, a molecular beam epitaxy (MBE) method, a pulsed laser deposition (PLD) method, an atomic layer deposition (ALD) method, or the like.

The CVD method can include a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using a PECVD method, a high-quality film can be formed at a relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a TCVD method not using plasma is employed, such plasma damage is not caused and the yield of semiconductor devices can be increased. A TCVD method does not cause plasma damage during deposition, so that a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, the composition of a film to be formed can be controlled with a flow rate ratio of a source gas. For example, by a CVD method or an ALD method, a film with a certain composition can be formed depending on a flow rate ratio of a source gas. Moreover, by changing the flow rate ratio of a source gas during deposition by a CVD method or an ALD method, a film whose composition is continuously changed can be formed. In the case where a film is deposited while the flow rate ratio of a source gas is changed, the time for deposition can be shorter than in the case where a film is deposited using a plurality of deposition chambers because time for transfer and pressure adjustment can be saved. Thus, semiconductor devices can be manufactured with improved productivity in some cases.

Next, the insulator 401b is formed over the insulator 401a. The insulator 401b can be formed by a sputtering method, a CVD method, an MBE method, a PLD method, an ALD method, or the like. Then, the insulator 301 is formed over the insulator 401b. The insulator 301 can be formed by a sputtering method, a CVD method, an MBE method, a PLD method, an ALD method, or the like.

Then, grooves are formed in the insulator 301 so as to reach the insulator 401b. Examples of the grooves include holes and openings. In forming the grooves, wet etching may be employed; however, dry etching is preferably employed in terms of microfabrication. The insulator 401b is preferably an insulator that serves as an etching stopper film used in forming the grooves by etching the insulator 301. For example, in the case where a silicon oxide film is used as the insulator 301 in which the grooves are to be formed, the insulator 401b is preferably formed using a silicon nitride film, an aluminum oxide film, or a hafnium oxide film.

In this embodiment, aluminum oxide is deposited as the insulator 401a by an ALD method, and aluminum oxide is deposited as the insulator 401b by a sputtering method.

After the formation of the grooves, a conductor to be the conductors 309a, 309b, and 309c is formed. The conductor to be the conductors 309a, 309b, and 309c desirably includes a conductor that allows less oxygen to pass therethrough. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductors 309a, 309b, and 309c can be formed by a sputtering method, a CVD method, an MBE method, a PLD method, an ALD method, or the like.

In this embodiment, tantalum nitride is deposited by a sputtering method as the conductor to be the conductors 309a, 309b, and 309c.

Next, a conductor to be the conductors 310a, 310b, and 310c is deposited over the conductor to be the conductors 309a, 309b, and 309c. The conductor to be the conductors 310a, 310b, and 310c can be deposited by a sputtering method, a CVD method, an MBE method, a PLD method, an ALD method, or the like.

In this embodiment, as the conductor to be the conductors 310a, 310b, and 310c, titanium nitride is deposited by a CVD method and tungsten is deposited by a CVD method over the titanium nitride.

Next, chemical mechanical polishing (CMP) is performed to remove the conductor to be the conductors 309a, 309b, and 309c and the conductor to be the conductors 310a, 310b, and 310c that are located over the insulator 301. Consequently, the conductor to be the conductors 309a, 309b, and 309c and the conductor to be the conductors 310a, 310b, and 310c remain only in each of the grooves, whereby the conductors 309a, 310a, 309b, 310b, 309c, and 310c that have flat top surfaces can be formed.

Next, the insulator 302 is formed over the insulator 301 and the conductors 309a, 310a, 309b, 310b, 309c, and 310c. The insulator 302 can be formed by a sputtering method, a CVD method, an MBE method, a PLD method, an ALD method, or the like.

Next, the insulator 303 is formed over the insulator 302. The insulator 303 can be formed by a sputtering method, a CVD method, an MBE method, a PLD method, an ALD method, or the like.

Next, the insulator 402 is formed over the insulator 303. The insulator 402 can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, impurities such as hydrogen and water included in the insulator 402 can be removed, for example. Alternatively, in the first heat treatment, plasma treatment using oxygen may be performed under a reduced pressure. The plasma treatment using oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 402. Alternatively, after plasma treatment using an inert gas with the apparatus, plasma treatment using oxygen in order to compensate released oxygen may be performed. Note that the first heat treatment is not necessarily performed in some cases.

Next, an oxide 406_1 is formed over the insulator 402. The oxide 406_1 can be formed by a sputtering method, a CVD method, an MBE method, a PLD method, an ALD method, or the like.

Next, treatment for adding oxygen to the oxide 406_1 may be performed. An ion implantation method, a plasma treatment method, or the like can be used for the treatment for adding oxygen. Note that oxygen added to the oxide 406_1 serves as excess oxygen. Oxygen is preferably added to a layer corresponding to the oxide 406_1. Next, an oxide 406_2 is formed over the oxide 406_1.

After that, second heat treatment may be performed. For the second heat treatment, the conditions for the first heat treatment can be used. By the second heat treatment, the crystallinity of the oxide 406_2 can be increased and impurities such as hydrogen and water can be removed, for example. Preferably, treatment at 400° C. in a nitrogen atmosphere for one hour and treatment at 400° C. in an oxygen atmosphere for one hour are successively performed in this order.

Next, a conductor 416 is formed over the oxide 406_2. The conductor 416 can be formed by a sputtering method, a CVD method, an MBE method, a PLD method, an ALD method, or the like. As the conductor 416, a conductive oxide such as indium tin oxide (ITO), indium oxide including tungsten oxide, indium zinc oxide including tungsten oxide, indium oxide including titanium oxide, indium tin oxide including titanium oxide, indium zinc oxide, indium tin oxide to which silicon is added, or indium gallium zinc oxide including nitrogen is deposited, and a material including one or more of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity, typified by polycrystalline silicon including an impurity element such as phosphorus, or a silicide such as nickel silicide may be deposited over the oxide.

The oxide may have a function of absorbing hydrogen in the oxides 406_1 and 406_2 and capturing hydrogen diffused from the outside; thus, the electrical characteristics and reliability of the transistor 100 are improved in some cases. Titanium instead of the oxide may have a similar function.

Then, a barrier film 417 is formed over the conductor 416. The barrier film 417 can be formed by a sputtering method, a CVD method, an MBE method, a PLD method, an ALD method, or the like. In this embodiment, aluminum oxide is deposited as the barrier film 417.

Subsequently, a conductor 411 is formed over the barrier film 417. The conductor 411 can be formed by a sputtering method, a CVD method, an MBE method, a PLD method, an ALD method, or the like. In this embodiment, tantalum nitride is deposited as the conductor 411 (see FIGS. 16A to 16D).

Next, the conductor 411 and the barrier film 417 are processed by a lithography method to form a conductor 411a, a conductor 411b, a barrier film 417a, and a barrier film 417b. Through this processing, a tapered cross section is preferably formed. The taper angle between the cross section and a plane parallel to the bottom surface of the substrate is greater than or equal to 30° and less than 75°, preferably greater than or equal to 30° and less than 70°. With such a taper angle, coverage with films formed later in the manufacturing process can be improved. The processing is preferably performed by a dry etching method. The dry etching method is suitable for microfabrication and the above described formation of a tapered shape (see FIGS. 17A to 17D).

In the lithography method, first, a resist is exposed to light through a mask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask is not necessary in the case of using an electron beam or an ion beam. Note that dry etching treatment such as ashing or wet etching treatment can be used for removal of the resist mask. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, a resist 421 is formed by a lithography method. The resist 421 is positioned to cover a region 406W1 and a region 406W2 (see FIGS. 18A to 18D).

Figure 19A:
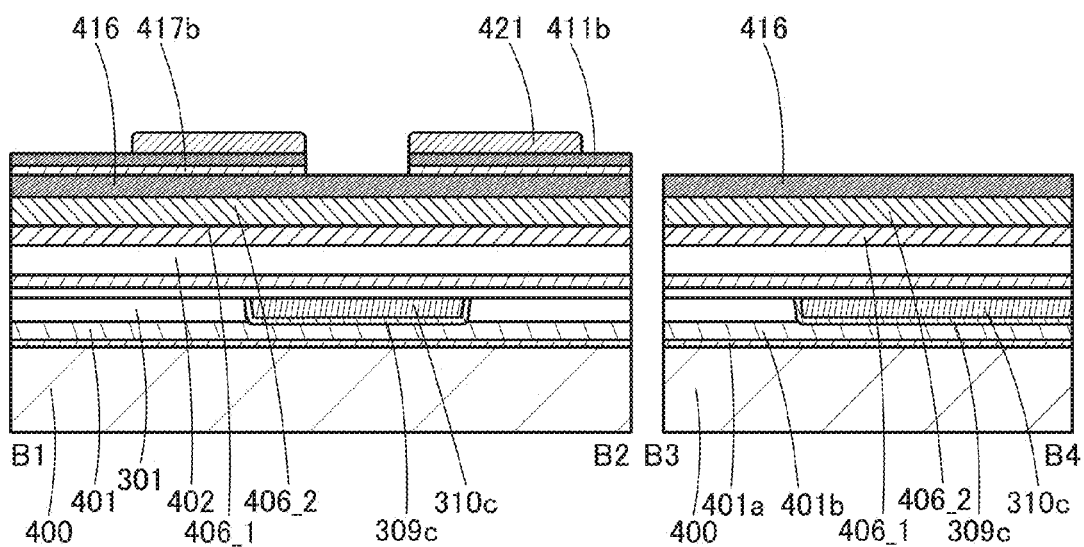
FIGS. 19A and 19B illustrate a method for manufacturing a transistor of one embodiment of the present invention.
Figure 19B:
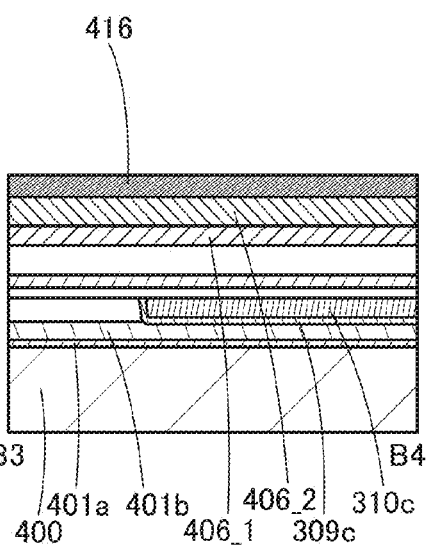
Figure 24A:
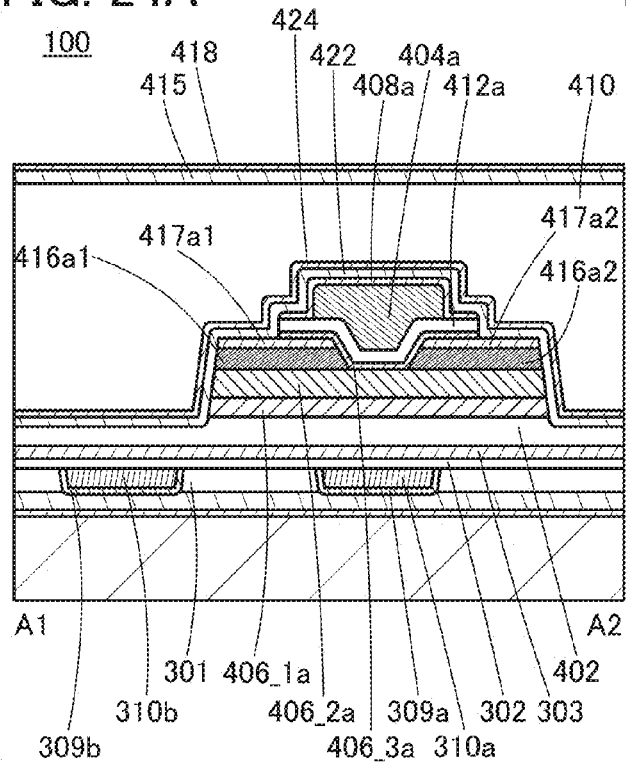
FIGS. 24A to 24D illustrate a method for manufacturing a transistor of one embodiment of the present invention.
Figure 24B:
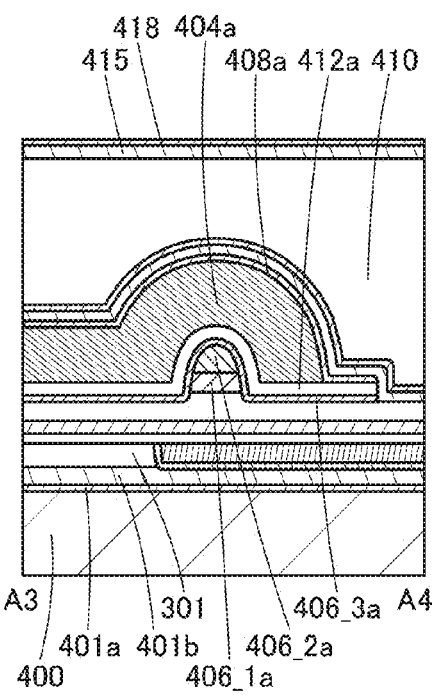
Figure 24C:
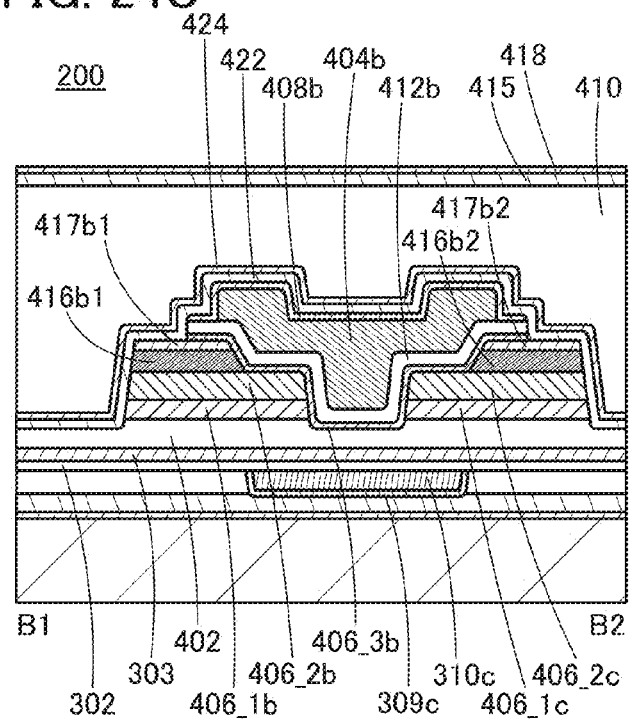
Figure 24D:
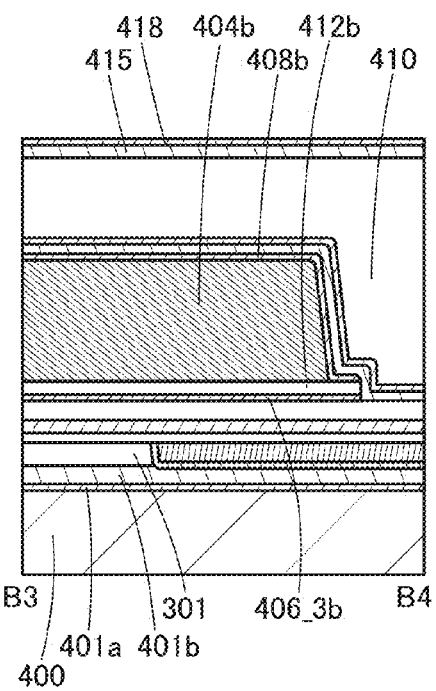

In the case where the resist 421 is positioned so that the regions 406W1 and 406W2 are not formed in the conductor 416, the transistor 200E can be manufactured (see FIGS. 19A and 19B). FIG. 12B is the cross-sectional view of the transistor 200E.

Next, the conductor 411a, the barrier film 417a, the conductor 411b, the barrier film 417b, and the conductor 416 are etched with the use of the resist 421 as an etching mask to form a conductor 411a1, a conductor 411a2, a conductor 411b1, a conductor 411b2, the barrier film 417a1, the barrier film 417a2, the barrier film 417b1, the barrier film 417b2, a conductor 416a, the conductor 416b1, and the conductor 416b2 (see FIGS. 20A to 20D).

Then, after the resist 421 is removed, with the use of the conductors 411a1, 411a2, 411b1, and 411b2, a portion of the conductor 416a in which the surface thereof is exposed, a portion of the conductor 416b1 in which the surface thereof is exposed, and a portion of the conductor 416b2 in which the surface thereof is exposed as etching masks, the oxides 406_1 and 406_2 are etched to form the oxides 406_1a, 406_2a, 406_1b, 406_2b, 406_1c, and 406_2c (see FIGS. 21A to 21D).

Next, the conductors 411a1, 411a2, 411b1, and 411b2, the portion of the conductor 416a in which the surface thereof is exposed, the portion of the conductor 416b1 in which the surface thereof is exposed (the region 406W1), and the portion of the conductor 416b2 in which the surface thereof is exposed (the region 406W2) are etched, so that the conductors 416a1 and 416a2 are formed. Part of the top surface of the oxide 406_2b is exposed by the etching of the portion of the conductor 416b1 in which the surface thereof is exposed (the region 406W1). Part of the top surface of the oxide 406_2c is exposed by the etching of the portion of the conductor 416b2 in which the surface thereof is exposed (the region 406W2) (see FIGS. 22A to 22D).

Then, washing treatment may be performed using an aqueous solution in which hydrofluoric acid is diluted with pure water (diluted hydrogen fluoride solution). A diluted hydrogen fluoride solution refers to a solution in which hydrofluoric acid is mixed into pure water at a concentration of approximately 70 ppm. Next, third heat treatment is performed. For the third heat treatment, the conditions for the first heat treatment can be used. Preferably, treatment at 400° C. in a nitrogen atmosphere for one hour and treatment at 400° C. in an oxygen atmosphere for one hour are successively performed in this order.

In some cases, dry etching performed in the above process causes the attachment or diffusion of an impurity due to an etching gas to a surface or an inside portion of the oxides 406_1a, 406_2a, 406_1b, 406_2b, 406_1c, and 406_2c, or the like. The impurity is fluorine or chlorine, for example.

The above treatment allows a reduction in impurity concentration. Furthermore, the moisture concentration and the hydrogen concentration in the oxides 406_1a, 406_2a, 406_1b, 406_2b, 406_1c, and 406_2c can be reduced.

Then, an oxide to be the oxides 406_3a and 406_3b is deposited. The oxide to be the oxides 406_3a and 406_3b can be formed by a sputtering method, a CVD method, an MBE method, a PLD method, an ALD method, or the like. A sputtering method is especially preferred for the deposition. Furthermore, sputtering conditions are as follows: a mixed gas of oxygen and argon is used; the oxygen partial pressure is preferably high, further preferably 100%; and the deposition temperature is room temperature or higher than or equal to 100° C. and lower than or equal to 200° C.

The oxide to be the oxides 406_3a and 406_3b is preferably deposited under the above conditions, in which case excess oxygen can be introduced into the oxides 406_2a, 406_2b, 406_2c, and the insulator 402.

Next, an insulator to be the insulators 412a and 412b is deposited over the oxide to be the oxides 406_3a and 406_3b. The insulator to be the insulators 412a and 412b can be formed by a sputtering method, a CVD method, an MBE method, a PLD method, an ALD method, or the like.

Here, fourth heat treatment can be performed. For the fourth heat treatment, the conditions for the first heat treatment can be used. Preferably, treatment at 400° C. in a nitrogen atmosphere for one hour and treatment at 400° C. in an oxygen atmosphere for one hour are successively performed in this order. The moisture concentration and the hydrogen concentration in the insulator to be the insulators 412a and 412b can be reduced by the fourth heat treatment.

Next, a conductor to be the conductors 404a and 404b is deposited. The conductor to be the conductors 404a and 404b can be formed by a sputtering method, a CVD method, an MBE method, a PLD method, an ALD method, or the like.

The conductor to be the conductors 404a and 404b may be a multilayer film. For example, an oxide is deposited using conditions similar to those for the deposition of the oxide to be the oxides 406_3a and 406_3b so that oxygen can be added to the insulator to be the insulators 412a and 412b. Oxygen added to the insulator to be the insulators 412a and 412b is excess oxygen.

Then, a conductor is formed over the oxide by a sputtering method, whereby the electric resistivity of the oxide can be decreased.

The conductor to be the conductors 404a and 404b is processed by a lithography method to form the conductors 404a and 404b.

After that, an insulator to be the insulators 408a and 408b is formed. The insulator to be the insulators 408a and 408b can be formed by a sputtering method, a CVD method, an MBE method, a PLD method, an ALD method, or the like. In the case where aluminum oxide is deposited as the insulator to be the insulators 408a and 408b by an ALD method, the insulator to be the insulators 408a and 408b can be formed on the top and side surfaces of the conductors 404a and 404b to have an even thickness and few pin holes, resulting in prevention of oxidation of the conductors 404a and 404b.

Next, the insulator to be the insulators 408a and 408b, the insulator to be the insulators 412a and 412b, and the oxide to be the oxides 406_3a and 406_3b are processed by a lithography method to form the insulators 408a, 408b, 412a, and 412b and the oxides 406_3a and 406_3b (see FIGS. 23A to 23D).

Alternatively, the conductors 404a and 404b and the insulators 412a and 412b are formed by a first lithography method, and the insulators 408a and 408b and the oxides 406_3a and 406_3b are formed by a second lithography method, whereby the structure illustrated in FIG. 11B can be formed.

Further alternatively, the conductors 404a and 404b, the insulators 412a and 412b, and the oxides 406_3a and 406_3b are formed by a first lithography method and the insulators 408a and 408b are formed by a second lithography method, whereby the structure illustrated in FIG. 11C can be formed.

When the oxide to be the oxides 406_3a and 406_3b is etched by dry etching, part of the oxide to be the oxides 406_3a and 406_3b might remain as a residue to be attached to the side surfaces of the oxides 406_1a, 406_2a, 406_1b, 406_2b, 406_1c, and 406_2c. In that case, the residue can be removed by using a chemical solution which can etch the oxide to be the oxides 406_3a and 406_3b. As the chemical solution that can etch the oxide to be the oxides 406_3a and 406_3b, for example, diluted hydrofluoric acid or a diluted phosphoric acid solution can be used.

The residue is preferably removed, in which case excess oxygen can be injected from the side surfaces of the oxides 406_1a, 406_2a, 406_1b, 406_2b, 406_1c, and 406_2c efficiently.

Next, the insulator 422 is formed. The insulator 422 can be formed by a sputtering method, a CVD method, an MBE method, a PLD method, an ALD method, or the like. In this embodiment, aluminum oxide is deposited by a sputtering method, in which case oxygen can be added to the insulator 402 and the oxides 406_1a, 406_2a, 406_1b, 406_2b, 406_1c, and 406_2c. Hydrogen contained in the oxides 406_1a, 406_2a, 406_1b, 406_2b, 406_1c, and 406_2c can be reduced by heat treatment performed later.

Next, the insulator 424 is formed. The insulator 424 can be formed by a sputtering method, a CVD method, an MBE method, a PLD method, an ALD method, or the like. In this embodiment, aluminum oxide is deposited by an ALD method, in which case entry of hydrogen from the outside can be prevented.

Then, the insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

For the formation of the insulator 410, a CVD method is preferably employed. Further preferably, a plasma CVD method is employed. In the case of formation by a plasma CVD method, a step 1 of depositing an insulator and a step 2 of performing treatment using plasma including oxygen may be repeatedly conducted. By conducting the step 1 and the step 2 more than once, the insulator 410 including excess oxygen can be formed.

The insulator 410 may be formed to have a flat top surface. For example, the top surface of the insulator 410 may have flatness immediately after the formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, for example, CMP treatment, dry etching treatment, or the like can be performed. However, the top surface of the insulator 410 is not necessarily flat.

Then, the insulator 415 is formed over the insulator 410. The insulator 415 can be formed by a sputtering method, a CVD method, an MBE method, a PLD method, an ALD method, or the like. A sputtering method is preferably used in formation of the insulator 415. The insulator 415 may be formed by a sputtering method successively after heat treatment in vacuum or reverse sputtering is performed.

When the insulator 415 is formed by a sputtering method with the use of plasma including oxygen, oxygen can be added to the insulator 410. The added oxygen serves as excess oxygen in the insulator 410 and is added to the oxides 406_1a, 406_2a, 406_3a, and 406_3b by heat treatment or the like, so that oxygen defects in the oxides 406_1a, 406_2a, 406_3a, and 406_3b can be repaired. In addition, the moisture concentration and the hydrogen concentration in the insulator 410 can be reduced.

Next, the insulator 418 is formed over the insulator 415. The insulator 418 can be formed by a sputtering method, a CVD method, an MBE method, a PLD method, an ALD method, or the like. For the formation of the insulator 418, an ALD method is preferably employed. For example, when the insulator 418 contains aluminum oxide, impurities such as hydrogen can be prevented from entering the oxides 406_1a, 406_2a, 406_3a, and 406_3b. Furthermore, for example, when the insulators 401a, 402b, 408a, 408b, 415, and 418 contain aluminum oxide, outward diffusion of the oxygen added to the oxides 406_1a, 406_2a, 406_3a, and 406_3b can be reduced. In other words, oxygen can be sealed (see FIGS. 24A to 24D).

Next, fifth heat treatment may be performed. For the fifth heat treatment, the conditions for the first heat treatment can be used. Preferably, treatment at 400° C. in a nitrogen atmosphere for one hour and treatment at 400° C. in an oxygen atmosphere for one hour are successively performed in this order. The moisture concentration and the hydrogen concentration in the insulator 410 can be reduced by the fifth heat treatment.

Next, an opening that passes through the insulators 418, 415, 410, 424, 422, 402, 303, and 302 and reaches the conductor 310b; an opening that passes through the insulators 418, 415, 410, 424, and 422 and the barrier film 417a1 and reaches the conductor 416a1; an opening that passes through the insulators 418, 415, 410, 424, and 422 and the barrier film 417a2 and reaches the conductor 416a2; an opening that passes through the insulators 418, 415, 410, 424, 422, and 408a and reaches the conductor 404a; an opening that passes through the insulators 418, 415, 410, 424, and 422 and the barrier film 417b1 and reaches the conductor 416b1; an opening that passes through the insulators 418, 415, 410, 424, and 422 and the barrier film 417b2 and reaches the conductor 416b2; and an opening that passes through the insulators 418, 415, 410, 424, 422, and 408b and reaches the conductor 404b are formed by a lithography method.

As another method for forming the openings, the following steps may be employed: a conductor is formed over the insulator 418, an insulator is formed over the conductor, the conductor and the insulator are processed by a lithography method to form a hard mask including the conductor and the insulator, and etching is performed with the use of the hard mask as an etching mask, whereby openings are formed. When the hard mask is used as the etching mask, the openings can be prevented from extending laterally or deformation. Note that the hard mask may be a single layer of the insulator or the conductor.

The openings can be formed at once by a lithograph step. Alternatively, the openings may be formed separately by performance of lithography steps a plurality of times.

Next, the conductors 429a, 431a, 433a, 437a, 429b, 431b, and 437b are embedded in the openings.

Next, a conductor is formed over the insulator 418 and the conductors 429a, 431a, 433a, 437a, 429b, 431b, and 437b and processed by a lithography method or the like, whereby the conductor 430a in contact with the top surface of the conductor 429a, the conductor 432a in contact with the top surface of the conductor 431a, the conductor 434a in contact with the top surface of the conductor 433a, the conductor 438a in contact with the top surface of the conductor 437a, the conductor 430b in contact with the top surface of the conductor 429b, the conductor 432b in contact with the top surface of the conductor 431b, and the conductor 438b in contact with the top surface of the conductor 437b are formed. Through the above steps, the semiconductor device including the transistor 100 illustrated in FIGS. 2A to 2C and the transistor 200 illustrated in FIGS. 3A to 3C can be manufactured (see FIGS. 2A to 2C and FIGS. 3A to 3C).

The structures, methods, and the like described in this embodiment can be combined with any of the structures, methods, and the like described in the other embodiments as appropriate.

Embodiment 3

<Structure of Semiconductor Device>

In this embodiment, an example of a semiconductor device including any of the transistors disclosed in this specification and the like is described.

Figure 25:
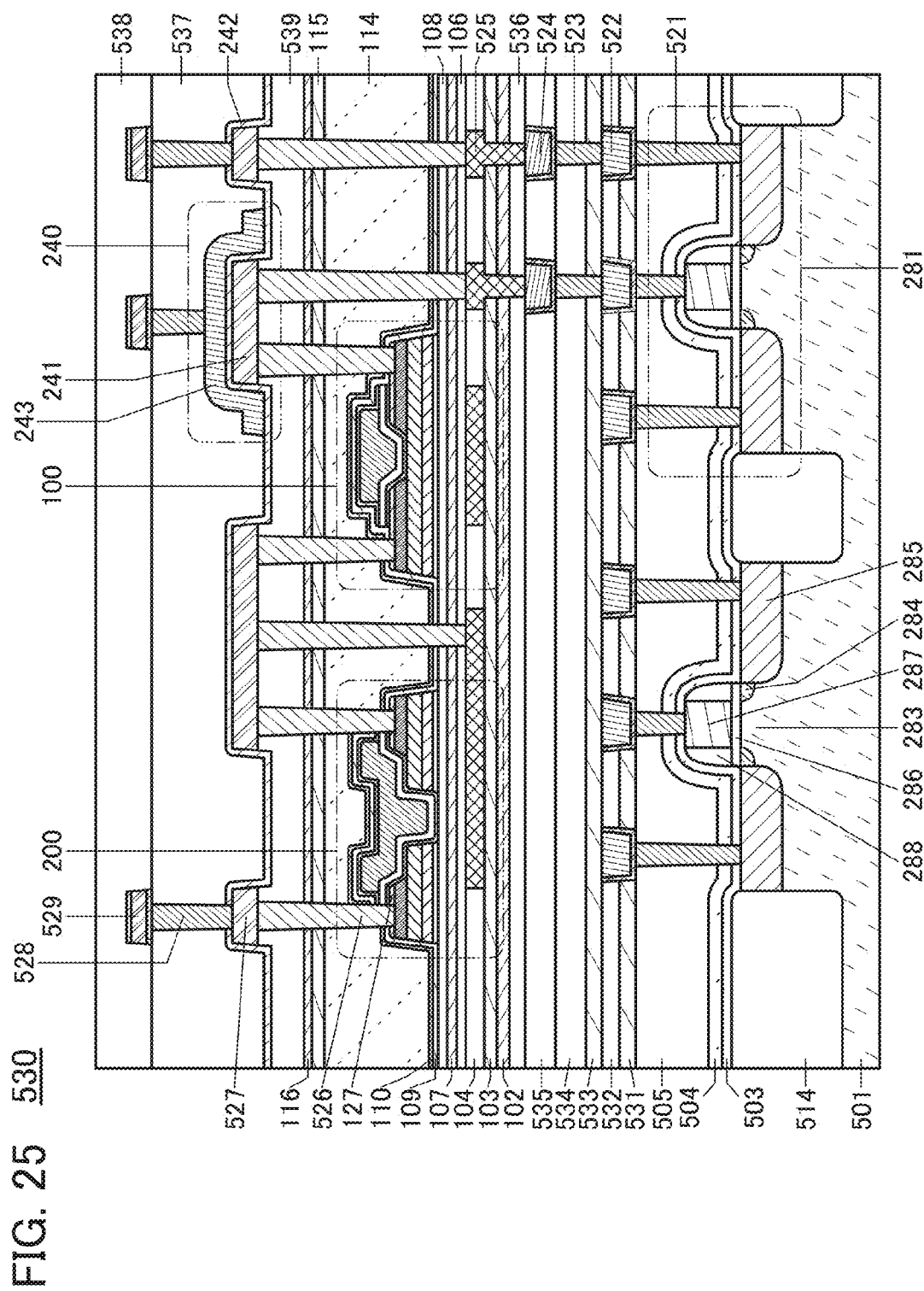
FIG. 25 illustrates a semiconductor device of one embodiment of the present invention.

FIG. 25 is a cross-sectional view of a semiconductor device 530. The semiconductor device 530 includes the transistor 100, the transistor 200, a transistor 281, and a capacitor 240.

In the semiconductor device 530, an n-type semiconductor is used for a substrate 501. The transistor 281 includes a channel formation region 283, high-concentration p-type impurity regions 285, an insulator 286, a conductor 287, and a sidewall 288. In regions overlapping with the sidewall 288 with the insulator 286 located therebetween, low-concentration p-type impurity regions 284 are provided. The insulator 286 can function as a gate insulator. The conductor 287 can function as a gate conductor. The channel formation region 283 of the transistor 281 is formed in part of the substrate 501.

The low-concentration p-type impurity regions 284 can be formed in such a manner that an impurity element is added with the use of the conductor 287 as a mask after formation of the conductor 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 281 is electrically isolated from other transistors by an element isolation layer 514. The element isolation layer can be formed by a local oxidation of silicon (LOCOS) method, a shallow trench isolation (STI) method, or the like.

In the semiconductor device 530, an insulator 531, an insulator 532, an insulator 533, an insulator 534, an insulator 535, and an insulator 536 are provided over an insulator 505 covering the transistor 281. In addition, the semiconductor device 530 includes a conductor 522 and a conductor 524 over the insulator 505.

The conductor 522 is provided to be embedded in the insulators 531 and 532. The conductor 522 is electrically connected to the transistor 281 through a conductor 521 provided in the insulators 503, 504, and 505.

The conductor 524 is provided to be embedded in the insulator 535. The conductor 524 is electrically connected to the conductor 522 through a conductor 523 provided in the insulators 533 and 534.

The semiconductor device 530 includes the transistors 100 and 200 over the insulator 536 with an insulator 102, an insulator 103, an insulator 104, an insulator 106, an insulator 107, and an insulator 108 provided therebetween. An insulator 115, an insulator 116, and an insulator 539 are provided over the transistors 100 and 200, and a conductor 527 and a conductor 241 are provided over the insulator 539. An insulator 242 covering the conductors 527 and 241 is provided. Furthermore, a conductor 243 covering the conductor 241 is provided over the insulator 242.

A region where the conductor 241, the insulator 242, and the conductor 243 overlap with each other functions as the capacitor 240. By providing the conductor 243 to cover the conductor 241, not only a top surface but also side surfaces of the conductor 241 can function as the capacitor.

The conductor 527 is electrically connected to a source or a drain of the transistor 200 through a conductor 526 provided in part of the insulators 539, 116, 115, 114, 110, and 109 and a barrier film 127.

An insulator 537 is provided over the conductor 243 and the insulator 242, a conductor 529 is provided over the insulator 537, and an insulator 538 is provided over the conductor 529. The conductor 529 is electrically connected to the conductor 527 through a conductor 528 provided in part of the insulator 537.

The insulators 102, 103, 104, 106, 107, 108, 109, 110, 115, 116, 531, 532, 533, 534, 535, 536, 539, 242, 537, and 538 can be formed using a material and a method which are similar to those of the insulators described in the above embodiments and the like. The conductors 521, 522, 523, 524, 525, 526, 527, 241, 243, 528, and 529 can be formed using a material and a method which are similar to those of the conductors described in the above embodiments and the like.

The conductors 521, 522, 523, 524, 525, 526, 527, 528, and 529 may be formed by a damascene method, a dual damascene method, or the like.

<Example of Memory Element>

Figure 26A:
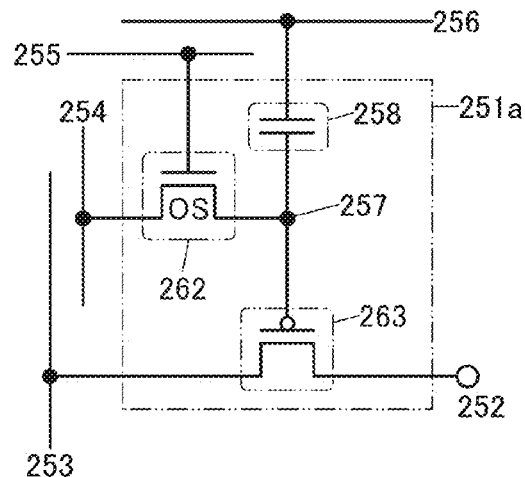
FIGS. 26A to 26D are circuit diagrams each illustrating a semiconductor device of one embodiment of the present invention.

A semiconductor circuit illustrated in FIG. 26A has a configuration of a memory element 251a in which one of a source and a drain of a transistor 262 is connected to a gate of a transistor 263 and one electrode of a capacitor 258. A circuit illustrated in FIG. 26B has a configuration of a memory element 261a in which one of the source and the drain of the transistor 262 is connected to one electrode of the capacitor 258.

In each of the memory elements 251a and 261a, charges injected through a wiring 254 and the transistor 262 can be stored at a node 257. The transistor 262 is an OS transistor, which enables charges to be stored at the node 257 for a long period.

The memory element 251a includes the transistor 263. Although the transistor 263 is a p-channel transistor in FIG. 26A, the transistor 263 may be an n-channel transistor. For example, the transistor 281 may be used as the transistor 263. An OS transistor may also be used as the transistor 263.

Figure 26B:
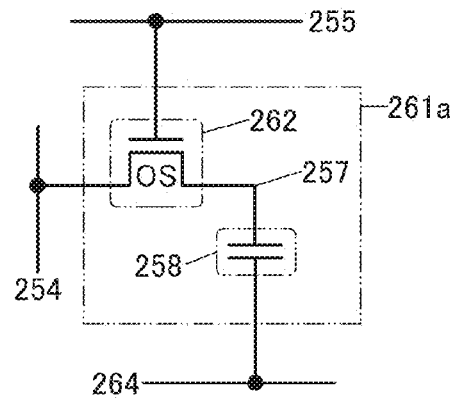

The memory element 251a illustrated in FIG. 26A and the memory element 261a illustrated in FIG. 26B are described in detail here.

The memory element 251a includes the transistor 263 using a first semiconductor, the transistor 262 using a second semiconductor, and the capacitor 258.

As the transistor 262, the OS transistor disclosed in the above embodiments can be used. When a transistor having a small off-state current is used as the transistor 262, data can be retained at the node 257 for a long period. In other words, power consumption of the memory element can be reduced because refresh operation becomes unnecessary or the frequency of refresh operation can be extremely low.

In FIG. 26A, a wiring 252 is electrically connected to one of a source and a drain of the transistor 263, and a wiring 253 is electrically connected to the other of the source and the drain of the transistor 263. The wiring 254 is electrically connected to the other of the source and the drain of the transistor 262, and a wiring 255 is electrically connected to a gate of the transistor 262. The gate of the transistor 263, the one of the source and the drain of the transistor 262, and the one electrode of the capacitor 258 are electrically connected to the node 257. A wiring 256 is electrically connected to the other electrode of the capacitor 258.

The memory element 251a in FIG. 26A has a feature that the charges supplied to the node 257 can be retained, and thus enables writing, retaining, and reading of data as follows.

[Writing and Retaining Operations]

Data writing and retaining operations of the memory element 251a will be described. First, the potential of the wiring 255 is set to a potential at which the transistor 262 is on. Accordingly, the potential of the wiring 254 is supplied to the node 257. That is, a predetermined charge is supplied to the node 257 (writing). Here, one of two kinds of charges providing different potential levels (hereinafter also referred to as a "low-level charge" and a "high-level charge") is supplied. After that, the potential of the wiring 255 is set to a potential at which the transistor 262 is off. Thus, the charge is retained at the node 257 (retaining operation).

Note that the high-level charge is a charge for supplying a higher potential to the node 257 than the low-level charge. In the case where the transistor 263 is a p-channel transistor, each of the high-level and low-level charges is a charge for supplying a potential higher than the threshold voltage of the transistor 263. In the case where the transistor 263 is an n-channel transistor, each of the high-level and low-level charges is a charge for supplying a potential lower than the threshold voltage of the transistor 263. In other words, each of the high-level and low-level charges is a charge for supplying a potential at which the transistor 263 is off.

[Reading Operation 1]

Next, operation of reading data will be described. A reading potential $V_R$ is supplied to the wiring 256 while a predetermined potential (a constant potential) different from the potential of the wiring 253 is supplied to the wiring 252, whereby data retained at the node 257 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 256 in a period during which data is not read is set to a potential higher than $V_H$ in the case where the transistor 263 is a p-channel transistor, and is set to a potential lower than $V_L$ in the case where the transistor 263 is an n-channel transistor.

For example, in the case where the transistor 263 is a p-channel transistor, $V_R$ is −2 V when $V_{th}$ of the transistor 263 is −2 V, $V_H$ is 1 V, and $V_L$ is −1 V. When the potential written to the node 257 is $V_H$ and $V_R$ is applied to the wiring 256, $V_R$ $V_H$, i.e., −1 V, is applied to the gate of the transistor 263. Since −1 V is higher than $V_{th}$, the transistor 263 is not turned on. Thus, the potential of the wiring 253 is not changed. When the potential written to the node 257 is $V_L$ and $V_R$ is applied to the wiring 256, $V_R$ $V_L$, i.e., −3 V, is applied to the gate of the transistor 263. Since −3 V is lower than $V_{th}$, the transistor 263 is turned on. Thus, the potential of the wiring 253 is changed.

In the case where the transistor 263 is an n-channel transistor, $V_R$ is 2 V when $V_{th}$ of the transistor 263 is 2 V, $V_H$ is 1 V, and $V_L$ is −1 V. When the potential written to the node 257 is $V_H$ and $V_R$ is applied to the wiring 256, $V_R+V_H$, i.e., 3 V, is applied to the gate of the transistor 263. Since 3 V is higher than $V_{th}$, the transistor 263 is turned on. Thus, the potential of the wiring 253 is changed. When the potential written to the node 257 is $V_L$ and $V_R$ is applied to the wiring 256, $V_R+V_L$, i.e., 1 V, is applied to the gate of the transistor 263. Since 1 V is lower than $V_{th}$, the transistor 263 is not turned on. Thus, the potential of the wiring 253 is not changed.

By determining the potential of the wiring 253, data retained at the node 257 can be read.

The memory element 261a illustrated in FIG. 26B is different from the memory element 251a in that the transistor 263 is not provided. The other electrode of the capacitor 258 is electrically connected to a wiring 264. The potential of the wiring 264 may be any potential as long as it is a fixed potential. For example, the wiring 264 may be supplied with GND. Data can be written to the memory element 261a in a manner similar to that of the memory element 251a.

[Reading Operation 2]

Operation of reading data of the memory element 261a will be described. When a potential at which the transistor 262 is turned on is supplied to the wiring 255, the wiring 254 which is in a floating state and the capacitor 258 are brought into conduction, and the charge is redistributed between the wiring 254 and the capacitor 258. As a result, the potential of the wiring 254 is changed. The amount of change in the potential of the wiring 254 varies depending on the potential of the node 257 (or the charge accumulated in the node 257).

For example, the potential of the wiring 254 after the charge redistribution is $(C_B \times V_{B0} + C \times V)/(C_B + C)$, where V is the potential of the node 257, C is the capacitance of the capacitor 258, $C_B$ is the capacitance component of the wiring 254, and $V_{B0}$ is the potential of the wiring 254 before the charge redistribution. Thus, it can be found that, assuming that the memory cell is in either of two states in which the potential of the node 257 is $V_1$ and $V_0$ ($V_1 > V_0$), the potential of the wiring 254 in the case of retaining the potential $V_1$ ($=(C_B \times V_{B0} + C \times V_1)/(C_B + C)$) is higher than the potential of the wiring 254 in the case of retaining the potential $V_0$ ($=(C_B \times V_{B0} + C \times V_0)/(C_B + C)$).

Then, by comparing the potential of the wiring 254 with a predetermined potential, data can be read.

When including a transistor using an oxide semiconductor and having an extremely small off-state current, the memory element described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the memory element, high voltage is not needed for data writing and deterioration of the element is less likely to occur. Unlike in a conventional nonvolatile memory, for example, it is not necessary to inject and extract electrons into and from a floating gate; thus, a problem such as deterioration of an insulator is not caused. That is, the memory element of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

Figure 26C:
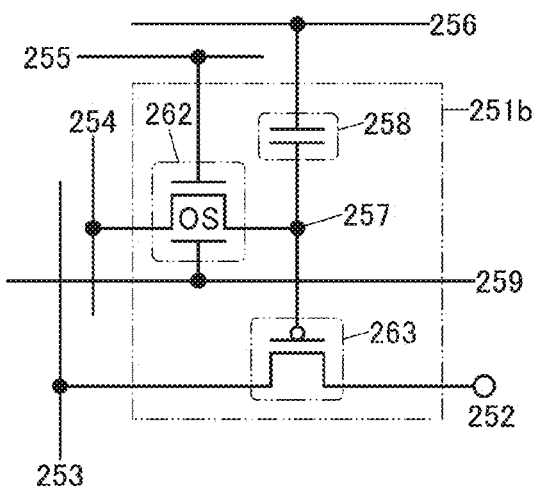
Figure 26D:
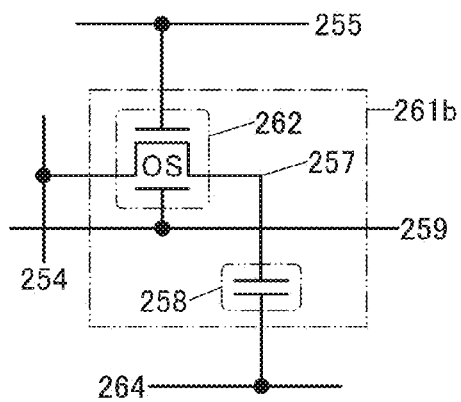

The transistor 262 may be a transistor including a back gate. By controlling the potential supplied to the back gate, the threshold voltage of the transistor 262 can be appropriately changed. A memory element 251b illustrated in FIG. 26C has substantially the same circuit configuration as the memory element 251a. The memory element 251b is different from the memory element 251a in that a transistor including a back gate is used as the transistor 262. A memory element 261b illustrated in FIG. 26D has substantially the same circuit configuration as the memory element 261a. The memory element 261b is different from the memory element 261a in that a transistor including a back gate is used as the transistor 262.

In each of the memory elements 251b and 261b, the back gate of the transistor 262 is electrically connected to a wiring 259. By controlling the potential supplied to the wiring 259, the threshold voltage of the transistor 262 can be appropriately changed.

<Example of Memory Device>

FIGS. 27A and 27B are circuit diagrams showing examples of a memory device including any of the above memory elements. A memory device 300 illustrated in FIG. 27A includes a memory circuit 350 and a voltage retention circuit 320. A memory device 300a illustrated in FIG. 27B includes a memory circuit 350a and the voltage retention circuit 320. The memory circuits 350 and 350a each include a plurality of memory elements. FIGS. 27A and 27B illustrate the case where three memory elements 261b (memory elements 261b_1 to 261b_3) are provided.

In the memory device 300 illustrated in FIG. 27A, the memory element 261b_1 included in the memory circuit 350 is electrically connected to a wiring 255_1 and a wiring 254_1. The memory element 261b_2 included in the memory circuit 350 is electrically connected to a wiring 255_2 and a wiring 254_2. The memory element 261b_3 included in the memory circuit 350 is electrically connected to a wiring 255_3 and a wiring 254_3. The memory elements 261b_1 to 261b_3 included in the memory circuit 350 are electrically connected to the wiring 264.

In the memory device 300a illustrated in FIG. 27B, the memory elements 261b_1 to 261b_3 included in the memory circuit 350a are electrically connected to the wiring 255. The memory element 261b_1 included in the memory circuit 350a is electrically connected to the wiring 254_1 and a wiring 264_1. The memory element 261b_2 included in the memory circuit 350a is electrically connected to the wiring 254_2 and a wiring 264_2. The memory element 261b_3 included in the memory circuit 350a is electrically connected to the wiring 254_3 and a wiring 264_3.

Note that the above description of the memory element 261b can be referred to for configurations, operations, and the like of the memory elements 261b_1 to 261b_3. Thus, detailed description is omitted here.

The voltage retention circuit 320 includes a transistor 323 and a capacitor 324. In FIGS. 27A and 27B, the transistor 323 is a transistor including a back gate; however, the transistor 323 may be a transistor without a back gate. In FIGS. 27A and 27B, one of a source and a drain of the transistor 323 is electrically connected to a terminal 321. The other of the source and the drain, a gate, and the back gate of the transistor 323 are electrically connected to the wiring 259. One electrode of the capacitor 324 is electrically connected to the wiring 259. The other electrode of the capacitor 324 is electrically connected to a wiring 322.

By controlling the potential of the wiring 322, the potential of the wiring 259 can be changed. In the reading operation and the writing operation of the memory devices 300 and 300a, a potential is supplied to the wiring 322 so that the potential of the wiring 259 is higher than a negative potential (a potential lower than GND) described later and lower than a potential corresponding to $V_{th}$ of the transistor 262 (a potential at which the transistor 262 is turned on).

In the case where gates of the transistors 262 in the memory elements 261b_1 to 261b_3 are electrically connected to the wiring 255 as in the memory device 300a, the potential of the wiring 259 may be higher than or equal to a potential corresponding to $V_{th}$ of the transistor 262.

By controlling the potential of the wiring 259, the operation speed of the transistor 262 can be increased. Furthermore, apparent $V_{th}$ of the transistor 262 can be decreased. Thus, the data writing speed and the data reading speed can be increased.

In the retention operation of the memory circuit 350, a fixed potential is supplied to the wiring 322. For example, GND is supplied. After that, a negative potential (a potential lower than GND) is supplied to the terminal 321. When a negative potential is supplied to the terminal 321, the gate potential of the transistor 323 becomes relatively high, so that the transistor 323 is turned on. Consequently, the negative potential is supplied to the wiring 259 through the transistor 323. More accurately, the wiring 259 is supplied with a potential higher than the negative potential by $V_{th}$. Note that the wiring 259 is supplied with the negative potential in this embodiment and the like for easy understanding.

When the wiring 259 is supplied with a negative potential, the potential of the back gate of the transistor 262 is decreased, and the transistor 262 is turned off; thus, data written to the memory circuit 350 can be retained. Furthermore, by supplying the negative potential to the back gate of the transistor 262, apparent $V_{th}$ of the transistor is increased. Thus, even when the potential of the gate of the transistor 262 is changed, data written to the memory circuit 350 can be retained.

Next, a potential higher than or equal to GND is supplied to the terminal 321. For example, GND is supplied. Since the potential of the wiring 259 is the negative potential, the potential of the gate of the transistor becomes the negative potential. Accordingly, the transistor 323 is turned off. Even when power supply to the memory device 300 (memory device 300a) is stopped after that, the transistors 323 and 262 can remain off.

The voltage retention circuit 320 has a function of suppressing a change in the potential of the wiring 259 in the retention operation of the memory device 300 (memory device 300a). The voltage retention circuit 320 has a function of suppressing a change in the potential of the wiring 259 even when power supply to the memory device 300 (memory device 300a) is stopped. In other words, the voltage retention circuit 320 has a function of retaining the voltage of the wiring 259. The transistor 323 is preferably a transistor having a small off-state current to retain the voltage of the wiring 259. For example, when the capacitance of the capacitor 324 is 10 pF and an acceptable increase in the potential of the wiring 259 is 0.5 V, a period during which the potential of the wiring 259 is increased by 0.5 V is an hour in the case where the off-state current of the transistor 323 is $1.39 \times 10^{-15}$ A, a day in the case where the off-state current of the transistor 323 is $5.79 \times 10^{-17}$ A, a year in the case where the off-state current of the transistor 323 is $1.59 \times 10^{-19}$ A, and ten years in the case where the off-state current of the transistor 323 is $1.59 \times 10^{-20}$ A. When the off-state current of the transistor 323 is smaller than or equal to $1.59 \times 10^{-20}$ A, data written to the memory circuit 350 can be retained for ten years or more.

For example, by using an OS transistor as the transistor 323, an extremely small off-state current of the transistor can be achieved. In order to reduce the off-state current, the transistor 323 preferably has a long channel length. Alternatively, the transistor 323 preferably has a short channel width. Alternatively, the transistor 323 preferably has a channel length longer than a channel width.

The transistor 323 is particularly preferably a transistor having a small off-state current at $V_g$ of 0 V. Thus, a transistor having high $V_{th}$ is preferably used as the transistor 323. As the transistor having high $V_{th}$, the transistor 200 or the like described above can be used. Since the transistor 262 writes or reads data, a transistor having low $V_{th}$ is preferably used as the transistor 262. Furthermore, a transistor having a large on-state current and high field-effect mobility is preferably used as the transistor 262. The transistor 100 or the like described above can be used as the transistor 262.

Figure 28:
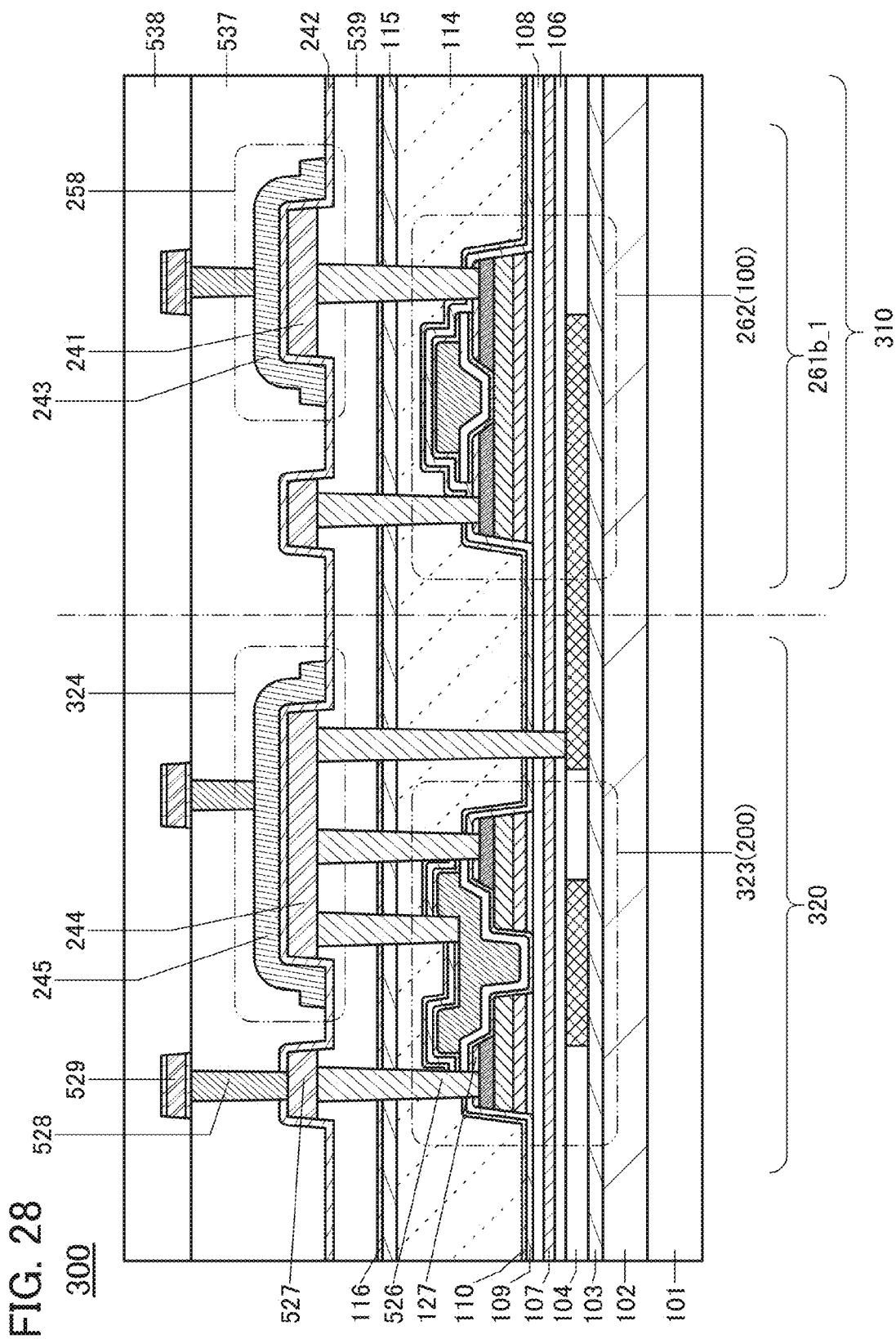
FIG. 28 illustrates a memory device of one embodiment of the present invention.

FIG. 28 is a cross-sectional view illustrating part of a cross-sectional structure of the memory device 300 in the case where the transistor 100 is used as the transistor 262 of the memory circuit 350 and the transistor 200 is used as the transistor 323 of the voltage retention circuit 320.

In FIG. 28, the memory device 300 includes the transistors 262 and 323 over a substrate 101 with the insulators 102 and 103 provided therebetween; the insulators 115, 116, and 539 over the transistors 262 and 323; the conductor 241, a conductor 244, and the conductor 527 over the insulator 539; the insulator 242 covering the conductors 241, 244, and 527; and the conductor 243 covering the conductor 241 and a conductor 245 covering the conductor 244, over the insulator 242.

A region where the conductor 241, the insulator 242, and the conductor 243 overlap with each other functions as the capacitor 258. By providing the conductor 243 to cover the conductor 241, not only a top surface but also side surfaces of the conductor 241 can function as the capacitor. A region where the conductor 244, the insulator 242, and the conductor 245 overlap with each other functions as the capacitor 324. By providing the conductor 245 to cover the conductor 244, not only a top surface but also side surfaces of the conductor 244 can function as the capacitor.

The conductor 527 is electrically connected to one of a source and a drain of the transistor 323 through the conductor 526 provided in part of the insulators 539, 116, 115, 114, 110, and 109 and the barrier film 127.

The insulator 537 is provided over the conductors 243 and 245 and the insulator 242, the conductor 529 is provided over the insulator 537, and the insulator 538 is provided over the conductor 529. The conductor 529 is electrically connected to the conductor 527 through the conductor 528 provided in part of the insulator 537.

The other of the source and the drain of the transistor 323 is electrically connected to a gate of the transistor 323 and a back gate of the transistor 262. Although not illustrated, the gate and back gate of the transistor 323 are electrically connected to each other.

The insulators 102, 103, 104, 106, 107, 108, 109, 110, 115, 116, 242, 539, 537, and 538 can be formed using a material and a method which are similar to those of the insulators described in the above embodiments and the like. The conductors 526, 527, 243, 244, 245, 528, and 529 can be formed using a material and a method which are similar to those of the conductors described in the above embodiments and the like. The conductors 241, 244, and 527 can be formed through the same steps at the same time. The conductors 243 and 245 can be formed through the same steps at the same time.

According to one embodiment of the present invention, transistors having different electrical characteristics can be manufactured through substantially the same process. That is, according to one embodiment of the present invention, a memory device with high productivity can be provided. According to one embodiment of the present invention, a memory device which can retain data for a long period even when power supply is stopped can be provided. For example, a memory device which can retain data for a year or more, ten years or more after power supply is stopped can be provided. Thus, a memory device of one embodiment of the present invention can be regarded as a nonvolatile memory.

Embodiment 4

<Electronic Device>

A semiconductor device of one embodiment of the present invention can be used for a variety of electronic devices. FIGS. 29A to 29G illustrate specific examples of the electronic devices including the semiconductor device of one embodiment of the present invention.

Figure 29A:
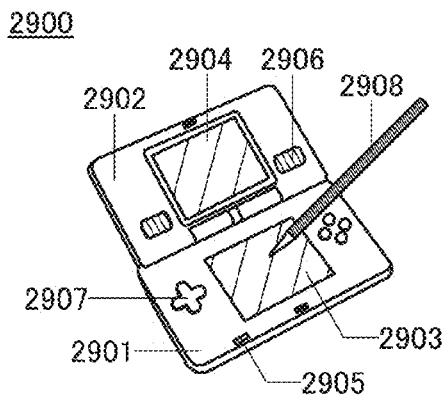
FIGS. 29A to 29G each illustrate an electronic device of one embodiment of the present invention.

A portable game machine 2900 illustrated in FIG. 29A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 29A has the two display portions 2903 and 2904, the number of display portions is not limited to this. The display portion 2903 is provided with a touch screen as an input device, which can be handled with a stylus 2908 or the like.

Figure 29B:
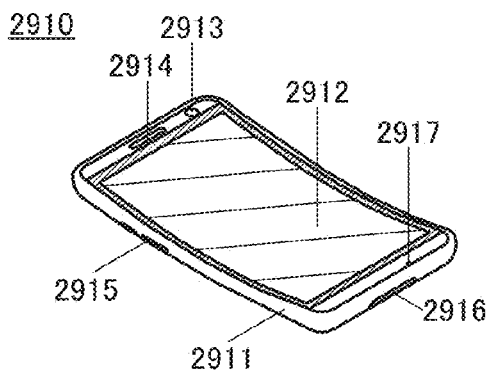

An information terminal 2910 illustrated in FIG. 29B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 29C:
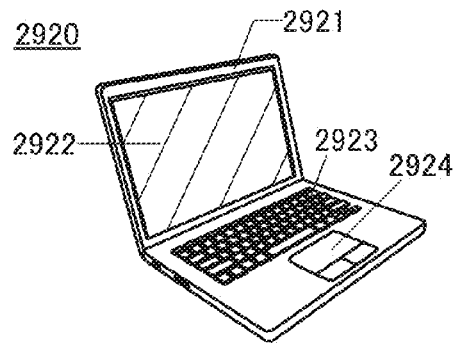

A notebook personal computer 2920 illustrated in FIG. 29C includes a housing 2921, a display portion 2922, a keyboard 2923, a pointing device 2924, and the like. In the housing 2921 of the notebook personal computer 2920, an antenna, a battery, and the like are provided.

Figure 29D:
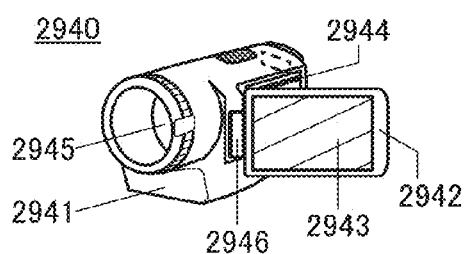

A video camera 2940 illustrated in FIG. 29D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 29E:
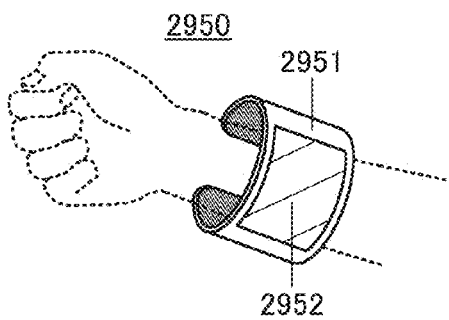

FIG. 29E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 29F:
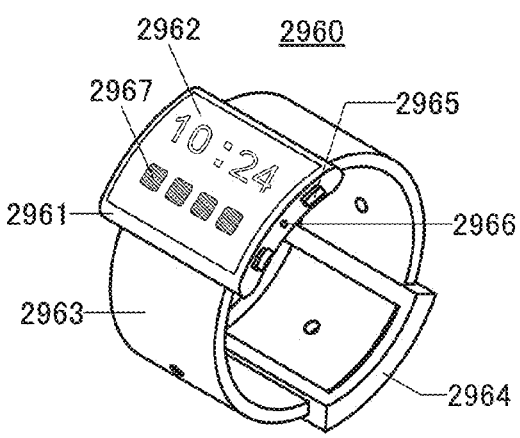

FIG. 29F illustrates an example of a watch-type information terminal. An information terminal 2960 includes a housing 2961, a display portion 2962, a band 2963, a buckle 2964, an operation switch 2965, an input/output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

Figure 29G:
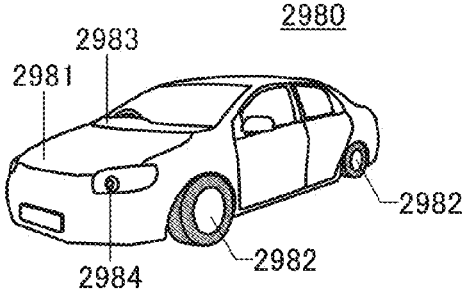

FIG. 29G is an external view illustrating an example of a car. A car 2980 includes a car body 2981, wheels 2982, a dashboard 2983, lights 2984, and the like. The car 2980 also includes an antenna, a battery, and the like.

For example, a memory device including the semiconductor device of one embodiment of the present invention can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments, examples, and the like.

Example 1

In this example, the transistor 200 of one embodiment of the present invention illustrated in FIGS. 3A to 3C and the transistor 200E illustrated in FIG. 12B were fabricated, and cross-sectional shapes thereof were observed with a scanning transmission electron microscope (STEM).

In each of the transistors 200 and 200E, a 400-nm-thick silicon oxide film was formed over a single crystal p-type silicon wafer by a thermal oxidation method. Next, a 40-nm-thick first aluminum oxide film was formed over the silicon oxide film by a sputtering method.

Next, a 150-nm-thick first silicon oxynitride film was formed over the first aluminum oxide film by a CVD method, and a 35-nm-thick first tungsten film was formed over the first silicon oxynitride film by a sputtering method.

Then, the first tungsten film was processed by a lithography method, so that a hard mask including the first tungsten film was formed.

Next, the first silicon oxynitride film was processed, so that a groove reaching the first aluminum oxide film was formed. Over the groove, a first tantalum nitride was formed by a sputtering method, and a first titanium nitride film and a second tungsten film were formed over the first tantalum nitride film by a CVD method. Then, the second tungsten film, the first titanium nitride film, and the first tantalum nitride film were polished by first CMP treatment until the top surface of the first silicon oxynitride film was exposed. Thus, the second tungsten film, the first titanium nitride film, and the first tantalum nitride film were embedded in the groove to form a wiring layer and a second gate electrode.

Next, a 10-nm-thick second tantalum nitride film was formed over the wiring layer and the second gate electrode by a sputtering method. Then, an unnecessary portion of the second tantalum nitride film was etched by a lithography method.

Next, a 20-nm-thick second silicon oxynitride film, which functioned as a second gate insulating film, was formed. Then, first heat treatment was performed. The first heat treatment was performed in an atmosphere containing nitrogen at 400° C. for one hour.

Next, as a first oxide (S1), a 5 nm-thick In—Ga—Zn oxide was formed by a sputtering method. The S1 was formed under the following conditions: a target having an atomic ratio of In:Ga:Zn=1:3:4 was used, the oxygen gas flow rate was 45 sccm, the pressure was 0.7 Pa, and the substrate temperature was 200° C.

Next, as a second oxide (S2), a 15-nm-thick In—Ga—Zn oxide was formed over the S1 by a sputtering method. The S2 was formed under the following conditions: a target having an atomic ratio of In:Ga:Zn=4:2:4.1 was used, the argon gas flow rate was 40 sccm, the oxygen gas flow rate was 5 sccm, the pressure was 0.7 Pa, and the substrate temperature was 130° C.

Then, second heat treatment was performed. As the second heat treatment, treatment was performed in an atmosphere containing nitrogen at 400° C. for one hour, and subsequently another treatment was performed in an atmosphere containing oxygen at 400° C. for one hour.

Next, a 20 nm-thick third tantalum nitride film was formed over the S2 by a sputtering method. Then, a 5-nm-thick second aluminum oxide film was formed over the third tantalum nitride film by an ALD method. Next, a 15-nm-thick fourth tantalum nitride film was formed over the second aluminum oxide film by a sputtering method.

Then, portions of the fourth tantalum nitride film and the second aluminum oxide film that overlapped with a portion where a channel was formed were etched by a lithography method. A dry etching method was used for the etching.

Next, unnecessary portions of the fourth tantalum nitride film, the second aluminum oxide film, the third tantalum nitride film, the S2, and the S1 were etched in this order by a lithography method. A dry etching method was used for the etching.

Next, a portion of the third tantalum nitride film that overlapped with a portion where a channel was formed was etched. The fourth tantalum nitride film over the second aluminum oxide film was also etched by the etching. A dry etching method was used for the etching.

Then, third heat treatment was performed. As the third heat treatment, treatment was performed in an atmosphere containing nitrogen at 400° C. for one hour, and subsequently another treatment was performed in an atmosphere containing oxygen at 400° C. for one hour.

Next, the second silicon oxynitride film and a second tantalum nitride film were processed by a lithography method, so that a contact hole reaching the second tungsten film was formed.

Next, as a third oxide (S3), a 5-nm-thick In—Ga—Zn oxide was formed by a sputtering method. The S3 was formed under the following conditions: a target having an atomic ratio of In:Ga:Zn=1:3:2 was used, the oxygen gas flow rate was 45 sccm, the pressure was 0.7 Pa, and the substrate temperature was room temperature.

Next, a 10-nm-thick third silicon oxynitride film, which functioned as a first gate oxide film, was formed by a CVD method.

Then, fourth heat treatment was performed. The fourth heat treatment was performed in an atmosphere containing nitrogen at 400° C. for one hour.

Next, as a fourth oxide (S4), a 5-nm-thick In—Ga—Zn oxide was formed by a sputtering method. The fourth oxide was formed under the following conditions: a target having an atomic ratio of In:Ga:Zn=4:2:4.1 was used, the oxygen gas flow rate was 45 sccm, the pressure was 0.7 Pa, and the substrate temperature was 200° C.

Next, a 10-nm-thick second titanium nitride film was formed over the fourth oxide by a sputtering method, and a 30-nm-thick third tungsten film was formed over the second titanium nitride film by a sputtering method. The second titanium nitride film and the third tungsten film were successively formed.

Next, the third tungsten film, the second titanium nitride film, and the fourth oxide were etched in this order by a lithography method. A dry etching method was used for the etching of the third tungsten film and the second titanium nitride film, and a wet etching method was used for the etching of the fourth oxide.

Next, a 7-nm-thick third aluminum oxide film was formed by an ALD method. The substrate temperature was 250° C.

Next, part of the third aluminum oxide film, part of the third silicon oxynitride film, and part of the S3 were etched in this order by a lithography method. A dry etching method was used for the etching of the third aluminum oxide film and the third silicon oxynitride film, and a wet etching method was used for the etching of the S3.

Then, a 20-nm-thick fourth aluminum oxide film was formed by a sputtering method under the following conditions: the argon gas flow rate was 25 sccm, the oxygen gas flow rate was 25 sccm, the pressure was 0.4 Pa, and the substrate temperature was 250° C.

Next, a 5-nm-thick fifth aluminum oxide film was formed over the fourth aluminum oxide film by an ALD method. The substrate temperature was 250° C.

Next, a 310-nm-thick fourth silicon oxynitride film was formed by a CVD method. Then, the fourth silicon oxynitride film was polished by second CMP treatment to have a flat surface.

Then, a 40-nm-thick sixth aluminum oxide film was formed over the fourth silicon oxide film by a sputtering method under the following conditions: the argon gas flow rate was 25 sccm, the oxygen gas flow rate was 25 sccm, the pressure was 0.4 Pa, and the substrate temperature was 250° C.

Then, fifth heat treatment was performed. As the fifth heat treatment, treatment was performed in an atmosphere containing nitrogen at 400° C. for one hour, and subsequently another treatment was performed in an atmosphere containing oxygen at 400° C. for one hour.

Next, a 100-nm-thick fifth silicon oxynitride film was formed by a CVD method.

Next, a contact hole reaching the second tantalum nitride film (a second gate electrode), a contact hole reaching the third tungsten film (a first gate electrode), and contact holes reaching the third tantalum nitride film (a source electrode and a drain electrode) were formed by a lithography method. A 40-nm-thick fourth tantalum nitride film was formed by a sputtering method. A 10-nm-thick third titanium nitride film was formed by a CVD method. A 150-nm-thick fourth tungsten film was formed by a CVD method.

Next, the fourth tungsten film, the third titanium nitride film, and the fourth tantalum nitride film were polished by third CMP treatment until the top surface of the fifth silicon oxynitride film was exposed, so that the fourth tungsten film, the third titanium nitride film, and the fourth tantalum nitride film were embedded in each contact hole to form plugs.

Next, a 50-nm-thick fifth tungsten film was formed by a sputtering method. Then, part of the fifth tungsten film was etched by a lithography method to form a wiring layer. Next, sixth heat treatment was performed at 250° C. for one hour.

Then, a 1-μm-thick resist film was formed by a coating method, and part of the resist film that is to be a measurement terminal (measurement pad) was removed by a lithography method.

Through the above process, the transistors 200 and 200E were fabricated. Next, the cross-sectional shapes of the fabricated transistors were observed with a STEM.

Figure 30A:
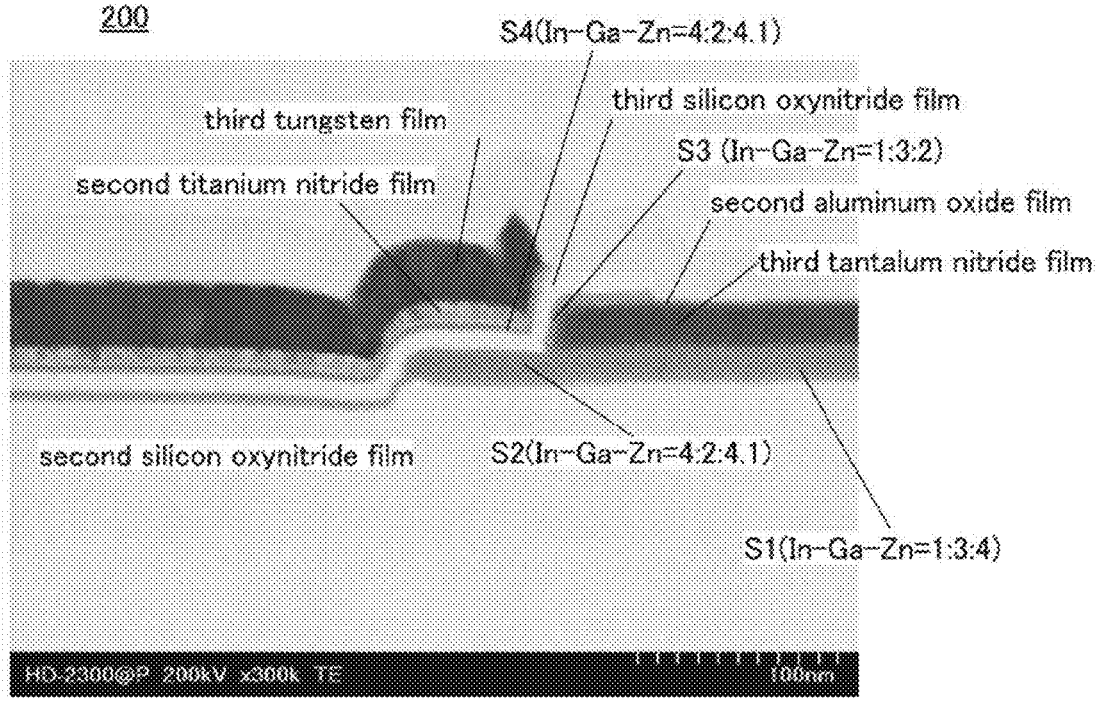
FIGS. 30A and 30B show cross-sectional STEM images of transistors in Example.
Figure 30B:
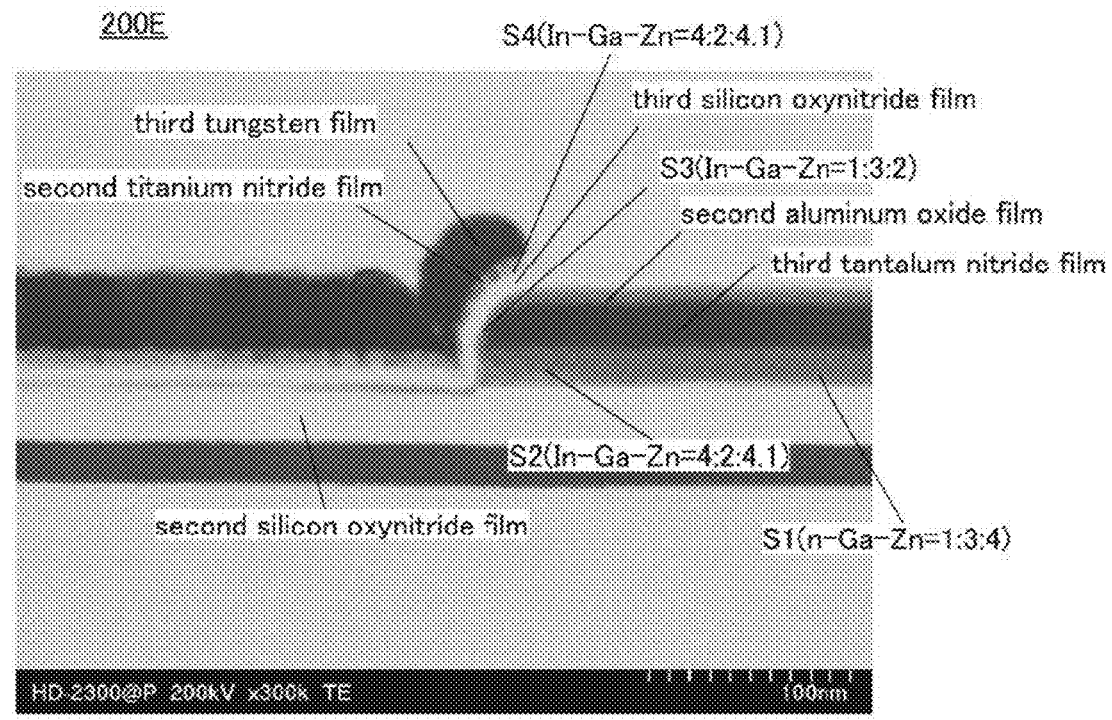

FIG. 30A is a cross-sectional STEM image of a region including the source electrode or the drain electrode of the transistor 200 of one embodiment of the present invention. FIG. 30B is a cross-sectional STEM image of a region including the source electrode or the drain electrode of the transistor 200E.

FIG. 30A shows that the third tantalum nitride film functioning as the source electrode or the drain electrode and the second oxide (S2) form a step-like shape, and that the third oxide (S3) where a channel is formed is provided to cover the step-like shape. The coverage with the S3 is favorable owing to the step-like shape. The S3 is in contact with a side surface of the third tantalum nitride film and further in contact with a side surface and part of a top surface of the S2.

In contrast, FIG. 30B shows that an end portion of the third tantalum nitride film and an end portion of the S2 are substantially aligned with each other, a rise of the third tantalum nitride film and the S2 is steep, the third tantalum nitride film and the S2 form a large step, and the coverage with the S3 is worse than that in the transistor 200. Furthermore, the S3 is in contact with the side surface of the third tantalum nitride film and further in contact with only the side surface of the S2.

Example 2

In this example, the electrical characteristics of the transistors 200 and 200E fabricated in Example 1 were measured. The transistors 200 were provided in a 5-inch-square substrate, and the transistors 200E were provided in another 5-inch-square substrate.

Figure 31A:
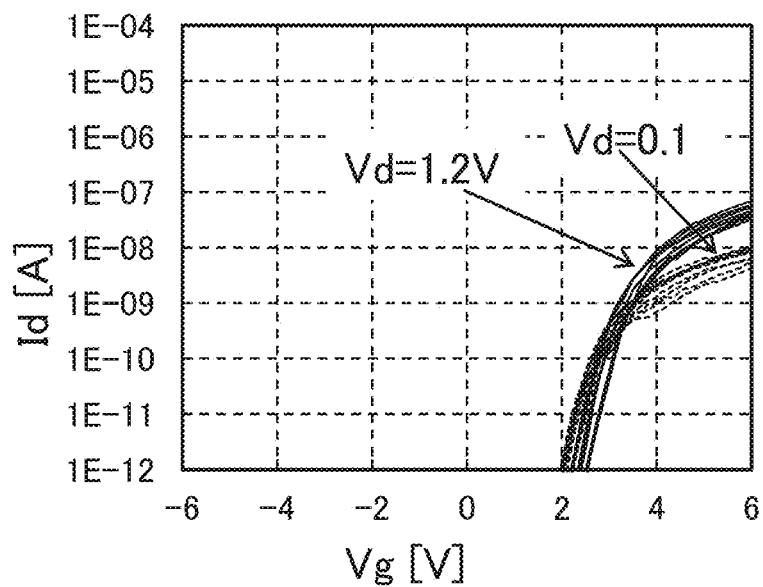
FIGS. 31A and 31B are graphs showing Id-Vg characteristics of transistors in Example.
Figure 31B:
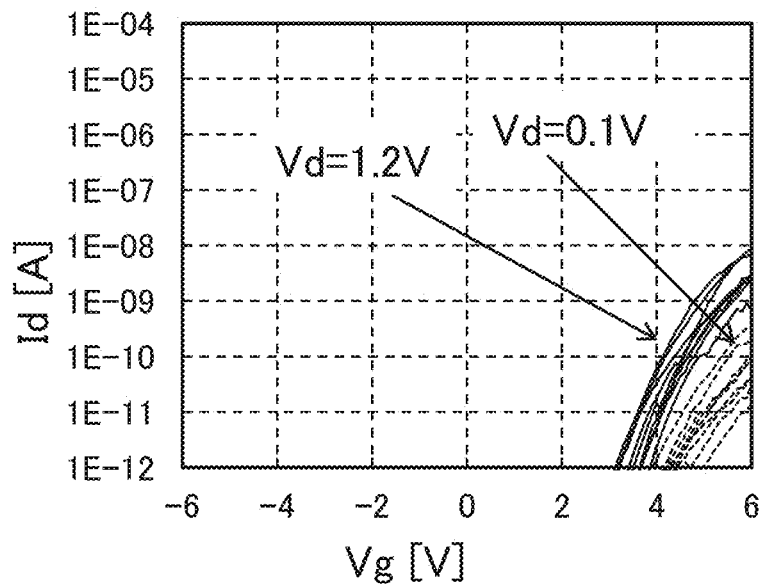

The measured transistors 200 and 200E each had a channel length (L) of 10000 nm and a channel width (W) of 150 nm. Change in source-drain current (hereinafter referred to as a drain current Id) when a source-gate voltage (hereinafter referred to as a gate voltage Vg) changed from −2 V to +6 V at a source-drain voltage (hereinafter referred to as a drain voltage Vd) of 0.1 V or 1.2 V was measured. That is, Id-Vg characteristics were measured. Hereinafter, the gate voltage Vg refers to the voltage of the first gate electrode (top gate electrode). Note that in this measurement, the voltage of the second gate electrode (back gate electrode) was set to 0 V. In this measurement, the Id-Vg characteristics of eight transistors on each substrate were measured. FIG. 31A shows the Id-Vg characteristics of the transistors 200, and FIG. 31B shows the Id-Vg characteristics of the transistors 200E. The solid lines are Id-Vg-curves at Vd=0.1 V, and the dashed lines are Id-Vg curves at Vd=1.2 V.

Here, the characteristics of the transistors 200 and 200E are compared with each other in terms of Id (on-state current) at Vg=6 V and Vg (Vsh) at Id=0 A.

The on-state currents of the transistors 200 at Vd=0.1 V ranged from $4.0 \times 10^{-9}$ A to $9.9 \times 10^{-9}$ A, and the on-state currents thereof at Vd=1.2 V ranged from $3.1 \times 10^{-8}$ A to $6.8 \times 10^{-8}$ A. Vsh at Vd=0.1 V ranged from 2.0 V to 2.3 V, and Vsh at Vd=1.2 V ranged from 2.2 V to 2.6 V.

Meanwhile, the on-state currents of the transistors 200E at Vd=0.1 V ranged from $1.1 \times 10^{-11}$ A to $3.8 \times 10^{-10}$ A, and the on-state currents thereof at Vd=1.2 V ranged from $6.2 \times 10^{-10}$ A to $9.1 \times 10^{-9}$ A. Vsh at Vd=0.1 V ranged from 3.9 V to 5.0 V, and Vsh at Vd=1.2 V ranged from 3.2 V to 3.9 V.

The transistors 200 had less variation in the on-state current and Vsh than the transistors 200E. The transistors 200 had a larger on-state current and lower Vsh than the transistors 200E. Accordingly, it was confirmed that the transistors 200 of one embodiment of the present invention have a larger on-state current and less variation in electrical characteristics within one substrate than the transistors 200E, which means favorable characteristics.

Example 3

Figure 32A:
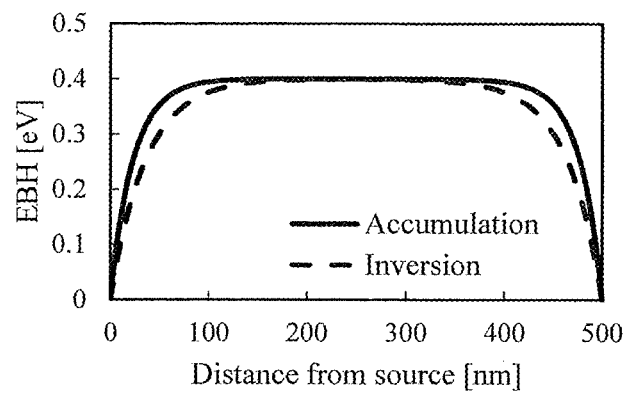
FIGS. 32A and 32B are band diagrams of transistors in Example in the channel length direction.

In this example, difference in band diagram between an inversion-mode FET and an accumulation-mode FET is discussed on the basis of the numerical calculation. The same FET structure was used for the accumulation-mode FET and the inversion-mode FET. Note that the acceptor impurity density in a channel portion of the inversion-mode FET was $1 \times 10^{15}$ [cm$^{-3}$] in any channel length. The relative permittivities of semiconductors were all set to 15. The band diagram (conduction band minimum) in the channel direction with respect to each channel length can be obtained by plotting $-e\phi(x)$. FIG. 32A shows band diagrams of an accumulation-mode CAAC-IGZO FET and an inversion-mode Si FET each having L of 500 nm.

Figure 32B:
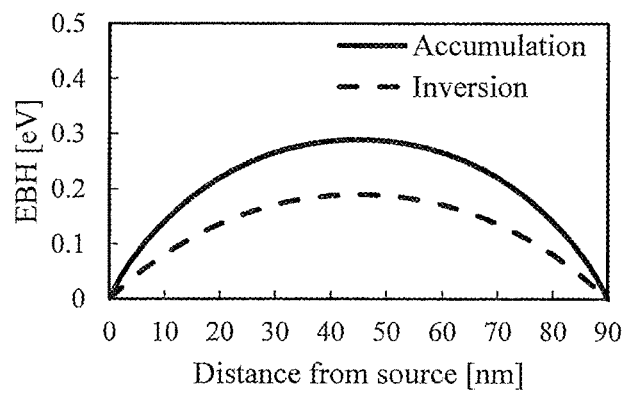

The band of the accumulation-mode FET curves more sharply than the band of the inversion-mode FET. In the case where the amount of channel dopant is small, the height of the band barrier between the S/D electrode and the channel is equivalent to the flat band voltage in both the accumulation-mode FET and the inversion-mode FET. Thus, the height of the potential barrier with respect to an electron can be a suitable indicator of resistance to the short-channel effect of an FET. As an example, FIG. 32B shows band diagrams of the FETs each having L of 90 nm in the channel length direction.

The inversion-mode FET has a lower potential barrier between the channel and the source electrode or the drain electrode, i.e., a lower maximum value of the band in the channel, than the accumulation-mode FET. This means that the short-channel effect is smaller in the accumulation-mode FET than in the inversion-mode FET. In the following discussion, the maximum value of a band in the middle of a channel is referred to as an energy barrier height (EBH), and the resistance to the short-channel effect is discussed on the basis of this indicator. The EBH is defined by Formula 1.

$$EBH = \max[-e\phi(x)] \quad \text{[Formula 1]}$$

Figure 33A:
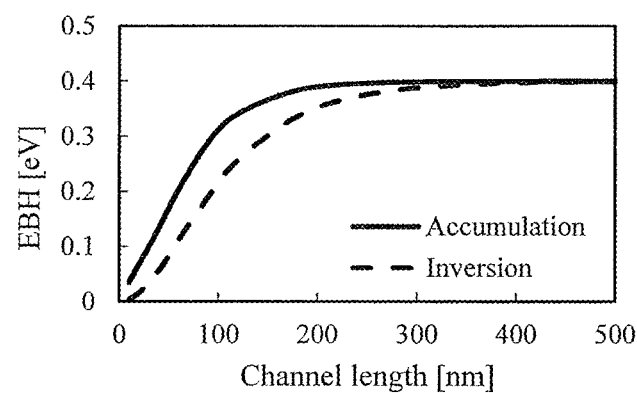
FIGS. 33A and 33B are graphs showing the channel length dependence of EBH of transistors in Example.

FIG. 33A shows the EBH of each of the inversion-mode Si FET and the accumulation-mode IGZO FET plotted for each channel length (L). The EBH of the inversion-mode FET decreases clearly when the channel length L is 180 nm or shorter, whereas the EBH of the accumulation-mode FET decreases when the channel length L is 120 nm or shorter. These results suggest that the intrinsic accumulation-mode FET has higher resistance to the short-channel effect than the inversion-mode FET.

Figure 33B:
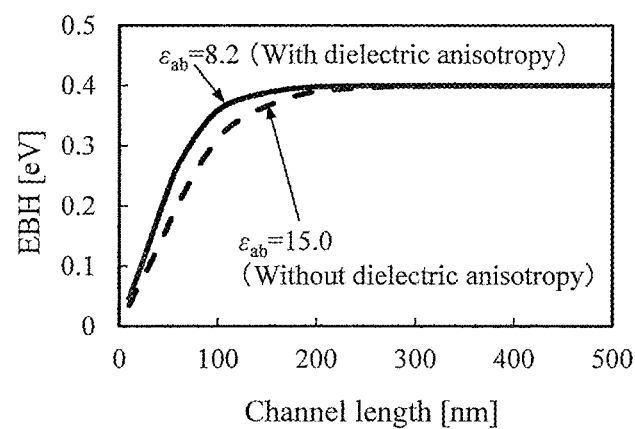

Next, the influence of dielectric anisotropy is discussed. The EBH at $\varepsilon_s$=8.2 and the EBH at $\varepsilon_s$=15.0 were compared (see FIG. 33B).

With consideration of the dielectric anisotropy, a reduction in the EBH due to the short channel is inhibited. In other words, the dielectric anisotropy of CAAC-IGZO has an effect of increasing resistance to the short-channel effect. According to this calculation, with consideration of the dielectric anisotropy, even when the thickness of a GI film is kept at 10 nm, the EBH with L of 180 nm reduces by only 1%, and it is probable that the short-channel effect hardly occurs. On the other hand, the EBH with L of less than 100 nm reduces significantly. In a planar CAAC-IGZO FET with a GI thickness of 10 nm and a short L of 100 nm or shorter, the short-channel effect cannot be suppressed. The structure needs to be changed to an S-channel structure or the like.

The planar CAAC-IGZO FET was able to be miniaturized to the extent of having L of approximately 180 nm without a reduction in the thickness of the gate insulating film. This is a surprising fact in light of the conventional common practice of Si FETs. The small thickness of CAAC-IGZO should be given as a reason why the CAAC-IGZO FET, unlike the conventional Si FET, was able to be miniaturized without a reduction in the thickness of the gate insulating film.

In order to suppress the short-channel effect, a wafer in which the thickness of an active layer is reduced using an embedded oxide film or the like is sometimes used in a Si LSI technology. This is known as a silicon-on-insulator (SOI) technology, which, as well as a three-dimensional gate structure such as a Fin FET, suppresses the short-channel effect. In the CAAC-IGZO FET, an active layer having a thickness of as small as approximately 15 nm can be formed easily by a sputtering method; thus, the CAAC-IGZO FET has high resistance to the short-channel effect. In order to investigate the influence of the thickness of an active layer on resistance to the short-channel effect, the channel length dependence of the EBH of a planar CAAC-IGZO FET including an active layer with a thickness of 100 nm and that of the EBH of a planar CAAC-IGZO FET including an active layer with a thickness of 15 nm were calculated for comparison.

Figure 34A:
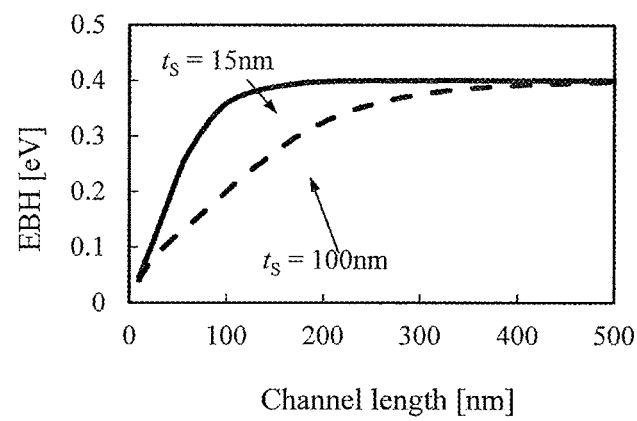
FIGS. 34A and 34B are graphs showing the channel length dependence of EBH of transistors in Example.

As shown in FIG. 34A, the EBH of the CAAC-IGZO FET with $t_s$ of 100 nm rapidly reduces due to miniaturization, indicating that the planar CAAC-IGZO FET with $t_s$ of 100 nm is not resistant to the short-channel effect. From the above discussion, a small thickness of the active layer of the CAAC-IGZO FET greatly contributes to the high resistance to the short-channel effect.

The three-dimensional gate structure is discussed from a point of the EBH. Poissons's equation for the accumulation-mode FET is written in consideration of the channel width and the gate electrode next to the channel.

$$-\varepsilon_S t_S W_{ch}\left[-\frac{d\phi(x)}{dx} + \frac{d\phi(x+dx)}{dx}\right] - \quad \text{[Formula 2]}$$
$$(W_{ch} + 2t_S)\varepsilon_{OX}\frac{V_g - V_{FB} - \phi(x)}{t_{OX}}dx =$$
$$-en_i\exp\left(\frac{e(\phi(x) - \phi_F)}{k_B T}\right)t_S W_{ch} dx.$$

Formula 2 is arranged to give Formula 3. Formula 4 is defined as a factor relating to the shape of the channel.

$$\frac{d^2\phi(x)}{dx^2} + \left(1 + \frac{2t_S}{W_{ch}}\right)\frac{\varepsilon_{OX}}{\varepsilon_S t_S t_{OX}}[V_g - V_{FB} - \phi(x)] - \quad \text{[Formula 3]}$$
$$\frac{en_i}{\varepsilon_S}\exp\left(\frac{e(\phi(x) - \phi_F)}{k_B T}\right) = 0$$

$$G = 1 + \frac{2t_S}{W_{ch}} \quad \text{[Formula 4]}$$

As the channel width (W) becomes smaller, the shape factor G becomes larger. It is considered that resistance to the short-channel effect becomes higher with larger G. The characteristic length of an accumulation-mode FET with an S-channel structure is expressed by Formula 5.

$$\frac{1}{l(acc)^2} = G\frac{\varepsilon_{OX}}{\varepsilon_S t_S t_{OX}} + \frac{e^2 n_1}{\varepsilon_S k_B T} \quad \text{[Formula 5]}$$

Figure 34B:
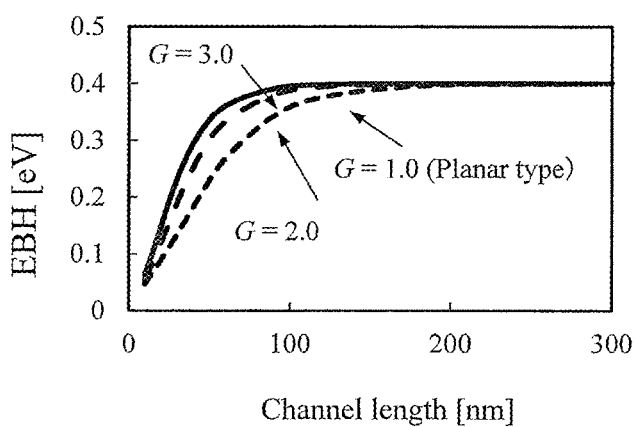

As G becomes larger, the characteristic length becomes shorter, and a higher resistance to the short-channel effect is expected. In the case where the OS film thickness ($t_s$) is 15 nm and the channel width (W_CH) is 30 nm, G is 2.0. Note that it is actually considered that 2.0<G<3.0 is satisfied. The channel length dependence of the EBH of the FET with G of 2.0, the channel length dependence of the EBH of the FET with G of 3.0, and the channel length dependence of the EBH of a planar FET (corresponding to an FET with G of 1.0) were compared with each other (see FIG. 34B).

As the shape factor G becomes larger, the EBH of the FET with a short channel becomes higher. This means that the short-channel effect is suppressed by the S-channel structure. The shape factor G is saturated to be 1.0 as the channel width becomes wider, and the shape factor G becomes larger as the channel width narrows. These results show that the short-channel effect (increase in S value) is suppressed by a reduction in the channel width.

Figure 35:
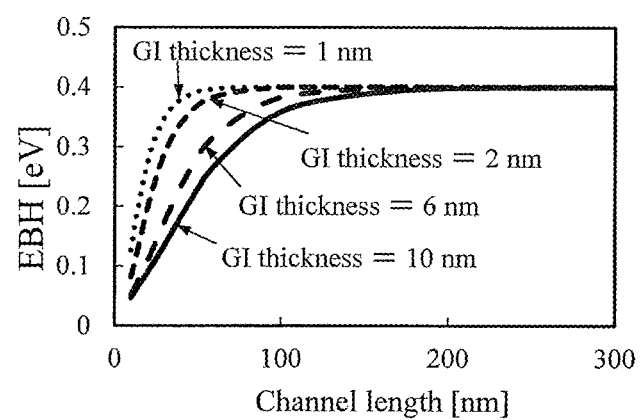
FIG. 35 is a graph showing the channel length dependence of EBH of transistors in Example.

Next, the effect of reducing the thickness of a gate insulating film is described. As described above, for extremely small Ioff, a reduction in the channel length of the CAAC-IGZO FET has been promoted with the thickness of the gate insulating film fixed to 1 nm. A reduction in the thickness of the gate insulating film might increase the tunneling current but is effective in suppressing the short channel effect. In the case where CAAC-IGZO is applied to an LSI, a sufficiently lower off-leakage current than that of a Si FET is enough, and the off-leakage current might not necessarily be on the order of yoctoampere per micrometer. For such an application, a reduction in the thickness of a gate insulating film can be a prominent alternative for suppressing the short-channel effect. The channel length dependence of the EBH of planar FETs including gate insulating films with thicknesses of 1 nm, 2 nm, 6 nm, and 10 nm is shown in FIG. 35.

The reduction in the EBH is suppressed by the reduction in the thickness of the GI film. In the case where the GI film has a thickness of 1 nm, even in the planar FET, the EBH when L is 32 nm reduces by only 10%, and favorable FET characteristics are expected.

EXPLANATION OF REFERENCE

I1: insulator, I2: insulator, S1: oxide, S2: oxide, S3: oxide, V0: potential, V1: potential, 100: transistor, 100A: transistor, 100B: transistor, 100C: transistor, 100D: transistor, 100E: transistor, 101: substrate, 102: insulator, 103: insulator, 104: insulator, 106: insulator, 107: insulator, 108: insulator, 109: insulator, 110: insulator, 114: insulator, 115: insulator, 116: insulator, 127: barrier film, 200: transistor, 200A: transistor, 200B: transistor, 200C: transistor, 200D: transistor, 200E: transistor, 240: capacitor, 241: conductor, 242: insulator, 243: conductor, 244: conductor, 245: conductor, 251a: memory element, 251b: memory element, 252: wiring, 253: wiring, 254: wiring, 254_1: wiring, 254_2: wiring, 254_3: wiring, 255: wiring, 255_1: wiring, 255_2: wiring, 255_3: wiring, 256: wiring, 257: node, 258: capacitor, 259: wiring, 261a: memory element, 261b: memory element, 261b_1: memory element, 261b_2: memory element, 261b_3: memory element, 262: transistor, 263: transistor, 264: wiring, 264_1: wiring, 264_2: wiring, 264_3: wiring, 281: transistor, 283: channel formation region, 284: low-concentration p-type impurity region, 285: high-concentration p-type impurity region, 286: insulator, 287: conductor, 288: sidewall, 300: memory device, 300a: memory device, 301: insulator, 302: insulator, 303: insulator, 309a: conductor, 309b: conductor, 309c: conductor, 310a: conductor, 310b: conductor, 310c: conductor, 311a: conductor, 311b: conductor, 311c: conductor, 320: voltage retention circuit, 321: terminal, 322: wiring, 323: transistor, 324: capacitor, 350: memory circuit, 350a: memory circuit, 400: substrate, 401: insulator, 401a: insulator, 401b: insulator, 402: insulator, 402b: insulator, 404a: conductor, 404b: conductor, 406_1: oxide, 406_1a: oxide, 406_1b: oxide, 406_1c: oxide, 406_2: oxide, 406_2a: oxide, 406_2b: oxide, 406_2c: oxide, 406_3a: oxide, 406_3b: oxide, 406W1: region, 406W2: region, 408a: insulator, 408b: insulator, 410: insulator, 411: conductor, 411a: conductor, 411b: conductor, 411a1: conductor, 411a2: conductor, 411b1: conductor, 411b2: conductor, 412a: insulator, 412b: insulator, 415: insulator, 416: conductor, 416a: conductor, 416a1: conductor, 416a2: conductor, 416b1: conductor, 416b2: conductor, 417: barrier film, 417a: barrier film, 417b: barrier film, 417a1: barrier film, 417a2: barrier film, 417b1: barrier film, 417b2: barrier film, 418: insulator, 421: resist, 422: insulator, 424: insulator, 429a: conductor, 429b: conductor, 430a: conductor, 430b: conductor, 431a: conductor, 431b: conductor, 432a: conductor, 432b: conductor, 433a: conductor, 434a: conductor, 437a: conductor, 437b: conductor, 438a: conductor, 438b: conductor, 451: path, 452: path, 501: substrate, 503: insulator, 504: insulator, 505: insulator, 514: element separation layer, 521: conductor, 522: conductor, 523: conductor, 524: conductor, 525: conductor, 526: conductor, 527: conductor, 528: conductor, 529: conductor, 530: semiconductor device, 531: insulator, 532: insulator, 533: insulator, 534: insulator, 535: insulator, 536: insulator, 537: insulator, 538: insulator, 539: insulator, 1000: semiconductor device, 2900: portable game machine, 2901: housing, 2902: housing, 2903: display portion, 2904: display portion, 2905: microphone, 2906: speaker, 2907: operation switch, 2908: stylus, 2910: information terminal, 2911: housing, 2912: display portion, 2913: camera, 2914: speaker portion, 2915: operation switch, 2916: external connection portion, 2917: microphone, 2920: notebook personal computer, 2921: housing, 2922: display portion, 2923: keyboard, 2924: pointing device, 2940: video camera, 2941: housing, 2942: housing, 2943: display portion, 2944: operation switch, 2945: lens, 2946: joint, 2950: information terminal, 2951: housing, 2952: display portion, 2960: information terminal, 2961: housing, 2962: display portion, 2963: band, 2964: buckle, 2965: operation switch, 2966: input/output terminal, 2967: icon, 2980: car, 2981: car body, 2982: wheel, 2983: dashboard, and 2984: light.

This application is based on Japanese Patent Application serial no. 2016-091109 filed with Japan Patent Office on Apr. 28, 2016, and Japanese Patent Application serial no. 2016-197828 filed with Japan Patent Office on Oct. 6, 2016, the entire contents of which are hereby incorporated by reference.

The invention claimed is:

1. A transistor comprising:
a first oxide;
a second oxide which is level with the first oxide;
a first conductor over the first oxide, wherein a first side surface of the first conductor recedes from a first side surface of the first oxide;
a second conductor over the second oxide, wherein a first side surface of the second conductor recedes from a first side surface of the second oxide;
a third oxide in contact with the first side surface of the first conductor, a top surface and the first side surface of the first oxide, the first side surface of the second conductor, and a top surface and the first side surface of the second oxide; and
a gate electrode overlapping with the third oxide,
wherein a bottom surface of the third oxide is below a bottom surface of the first oxide.

2. The transistor according to claim 1, wherein the third oxide has a step shape in a cross section of the transistor.

3. The transistor according to claim 1,
wherein the first conductor is over and in contact with the first oxide, and
wherein the second conductor is over and in contact with the second oxide.

4. The transistor according to claim 1,
wherein a second side surface of the first conductor is aligned with a second side surface of the first oxide, and
wherein a second side surface of the second conductor is aligned with a second side surface of the second oxide.

5. The transistor according to claim 1,
wherein the third oxide comprises a channel of the transistor, and
wherein the first conductor and the second conductor are a source electrode and a drain electrode of the transistor.

6. The transistor according to claim 1, further comprising:
a first barrier film over and in contact with the first conductor; and
a second barrier film over and in contact with the second conductor,
wherein the first barrier film and the second barrier film each comprise aluminum and oxygen.

7. The transistor according to claim 1, wherein the first oxide, the second oxide, and the third oxide each comprise an oxide semiconductor.

8. The transistor according to claim 1, wherein a part of a top surface of the third oxide is below the bottom surface of the first oxide.

9. A transistor comprising:
an insulating film;
a first oxide semiconductor layer over the insulating film;
a second oxide semiconductor layer which is level with the first oxide semiconductor layer;
a first conductor over the first oxide semiconductor layer, wherein a first side surface of the first conductor recedes from a first side surface of the first oxide semiconductor layer;
a second conductor over the second oxide semiconductor layer, wherein a first side surface of the second conductor recedes from a first side surface of the second oxide semiconductor layer;
a third oxide semiconductor layer in contact with the first side surface of the first conductor, a top surface and the first side surface of the first oxide semiconductor layer, a top surface of the insulating film, the first side surface of the second conductor, and a top surface and the first side surface of the second oxide semiconductor layer; and
a gate electrode overlapping with the third oxide semiconductor layer,
wherein a bottom surface of the third oxide semiconductor layer is below a bottom surface of the first oxide semiconductor layer.

10. The transistor according to claim 9, wherein the third oxide semiconductor layer has a step shape in a cross section of the transistor.

11. The transistor according to claim 9,
wherein the first conductor is over and in contact with the first oxide semiconductor layer, and
wherein the second conductor is over and in contact with the second oxide semiconductor layer.

12. The transistor according to claim 9,
wherein a second side surface of the first conductor is aligned with a second side surface of the first oxide semiconductor layer, and
wherein a second side surface of the second conductor is aligned with a second side surface of the second oxide semiconductor layer.

13. The transistor according to claim 9,
wherein the third oxide semiconductor layer comprises a channel of the transistor, and
wherein the first conductor and the second conductor are a source electrode and a drain electrode of the transistor.

14. The transistor according to claim 9, further comprising:
a first barrier film over and in contact with the first conductor; and
a second barrier film over and in contact with the second conductor,
wherein the first barrier film and the second barrier film each comprise aluminum and oxygen.

15. The transistor according to claim 9, wherein the first oxide semiconductor layer, the second oxide semiconductor layer, and the third oxide semiconductor layer each comprise indium, gallium, and zinc.

16. The transistor according to claim 9, further comprising a back gate electrode, wherein the insulating film is over the back gate electrode.

17. The transistor according to claim 9, wherein the insulating film comprises excess oxygen.

18. A semiconductor device comprising a first transistor and a second transistor,
the first transistor comprising:
a first oxide semiconductor layer on an insulating film;
a second oxide semiconductor layer which is level with the first oxide semiconductor layer;
a first conductor over the first oxide semiconductor layer, wherein a first side surface of the first conductor recedes from a first side surface of the first oxide semiconductor layer;
a second conductor over the second oxide semiconductor layer, wherein a first side surface of the second conductor recedes from a first side surface of the second oxide semiconductor layer;
a third oxide semiconductor layer in contact with the first side surface of the first conductor, a top surface and the first side surface of the first oxide semiconductor layer, a top surface of the insulating film, the first side surface of the second conductor, and a top surface and the first side surface of the second oxide semiconductor layer; and
a first gate electrode overlapping with the third oxide semiconductor layer; and
the second transistor comprising:
a fourth oxide semiconductor layer on the insulating film;
a third conductor over a first region of the fourth oxide semiconductor layer;
a fourth conductor over a second region of the fourth oxide semiconductor layer;
a fifth oxide semiconductor layer in contact with a first side surface of the third conductor, a top surface of the fourth oxide semiconductor layer, and a first side surface of the fourth conductor; and
a second gate electrode overlapping with the fifth oxide semiconductor layer,
wherein a bottom surface of the third oxide semiconductor layer is below a bottom surface of the first oxide semiconductor layer,
wherein the first oxide semiconductor layer, the second oxide semiconductor layer, and the fourth oxide semiconductor layer each comprise a material having a same composition, and
wherein the third oxide semiconductor layer and the fifth oxide semiconductor layer each comprise a material having a same composition.

19. The semiconductor device according to claim 18, wherein a threshold voltage of the first transistor is higher than a threshold voltage of the second transistor.

20. The semiconductor device according to claim 18, wherein the third oxide semiconductor layer has a step shape in a cross section of the first transistor.

21. The semiconductor device according to claim 18,
wherein the third oxide semiconductor layer comprises a channel of the first transistor,
wherein the fifth oxide semiconductor layer comprises a channel of the second transistor,
wherein the first conductor and the second conductor are a source electrode and a drain electrode of the first transistor, and
wherein the third conductor and the fourth conductor are a source electrode and a drain electrode of the second transistor.

22. The semiconductor device according to claim 18, wherein the first oxide semiconductor layer, the second oxide semiconductor layer, the third oxide semiconductor layer, the fourth oxide semiconductor layer, and the fifth oxide semiconductor layer each comprise indium, gallium, and zinc.

23. An electronic device comprising:
the semiconductor device according to claim 18; and
at least one of an antenna, a battery, an operation switch, a microphone, and a speaker.

* * * * *